(12) United States Patent
Lu

(10) Patent No.: US 12,439,588 B2
(45) Date of Patent: Oct. 7, 2025

(54) METHOD OF FORMING A MEMORY CELL WITH A TRANSISTOR AND A CAPACITOR

(71) Applicants: Etron Technology, Inc., Hsinchu (TW); Invention And Collaboration Laboratory Pte. Ltd., Singapore (SG)

(72) Inventor: Chao-Chun Lu, Taipei (TW)

(73) Assignees: Etron Technology, Inc., Hsinchu (TW); Invention And Collaboration Laboratory Pte. Ltd., Singapore (SG)

(*) Notice: Subject to any disclaimer, the term of this patent is extended or adjusted under 35 U.S.C. 154(b) by 21 days.

(21) Appl. No.: 18/369,213

(22) Filed: Sep. 18, 2023

(65) Prior Publication Data

US 2024/0008256 A1 Jan. 4, 2024

Related U.S. Application Data

(63) Continuation of application No. 17/337,391, filed on Jun. 2, 2021, now Pat. No. 11,825,645.

(60) Provisional application No. 63/034,411, filed on Jun. 4, 2020.

(51) Int. Cl.
*H10B 12/00* (2023.01)

(52) U.S. Cl.
CPC ....... *H10B 12/315* (2023.02); *H10B 12/0335* (2023.02); *H10B 12/053* (2023.02); *H10B 12/34* (2023.02); *H10B 12/482* (2023.02)

(58) Field of Classification Search
None
See application file for complete search history.

(56) References Cited

U.S. PATENT DOCUMENTS

| | | | |
|---|---|---|---|
| 5,985,715 A | * | 11/1999 | Chou ............... H10B 12/318 438/254 |
| 6,031,260 A | | 2/2000 | Sunouchi |
| 6,159,818 A | | 12/2000 | Durcan |
| 6,180,453 B1 | | 1/2001 | Sung |
| 2021/0201960 A1 | | 7/2021 | Lu |

FOREIGN PATENT DOCUMENTS

| | | |
|---|---|---|
| JP | 2012-79981 A | 4/2012 |
| JP | 2023-83141 A | 6/2023 |

* cited by examiner

*Primary Examiner* — Steven M Page
(74) *Attorney, Agent, or Firm* — Winston Hsu

(57) ABSTRACT

The present invention discloses a memory cell structure. The memory cell structure includes a silicon substrate, a transistor, and a capacitor. The silicon substrate has a silicon surface. The transistor is coupled to the silicon surface, wherein the transistor includes a gate structure, a first conductive region, and a second conductive region. The capacitor has a storage electrode, wherein the capacitor is over the transistor and the storage electrode is electrically coupled to the second conductive region of the transistor. The capacitor includes a capacitor periphery, and the transistor is located within the capacitor periphery.

8 Claims, 79 Drawing Sheets

(a)

(b)

(a)

(b)

(a)

(b)

(a)

(b)

(a)

(b)

METHOD OF FORMING A MEMORY CELL WITH A TRANSISTOR AND A CAPACITOR

CROSS REFERENCE TO RELATED APPLICATIONS

This application is a continuation application of U.S. application Ser. No. 17/337,391, filed on Jun. 2, 2021, which claims the benefit of U.S. Provisional Application No. 63/034,411, filed on Jun. 4, 2020. The contents of these applications are incorporated herein by reference.

BACKGROUND OF THE INVENTION

1. Field of the Invention

The present invention relates to a memory cell structure, and particularly to a memory cell structure that has denser structure, smaller area, lower leakage currents, higher capacitance, and so on.

2. Description of the Prior Art

One of the most important volatile-memory integrated circuits is the DRAM (Dynamic Random Access Memory) using the 1T1C memory cell, which not only provides the best cost-performance function as main memory and/or buffer memory for computing and communication applications but also has acted as the best driver for technology scaling-down to sustain the Moore's Law by scaling down minimum feature size on the silicon from several micrometers down to twenty nanometers or so. Recently the logic technology which continues using embedded SRAM (Static Random Access Memory) as its scaling-down driver reveals the claim of achieving the most advanced technology-node near 5 nanometers into manufacturing. In comparison, the best claim of the technology-node of DRAM is still above 10 to 12 nanometers. The major problem is that a structure of the 1T1C memory cell is very hard to be further scaled down by even using very aggressive design rules, scaled access transistor (i.e. 1T) design and three-dimensional storage capacitor (i.e. 1C) such as a stacked capacitor over part of the access transistor and isolation areas or a very deep trench capacitor.

The difficulties for the 1T1C memory Cell are elaborated here though they are well-known problems even under huge financial, and research and development investments on technology, design and equipments. To give a few examples of the difficulties: (1) the structure of the access transistor suffers unavoidable but more serious current leakage problem to degrade the 1T1C memory cell storage functions such as reducing the DRAM refresh time; (2) the complexities of arranging the word lines, bit lines and storage capacitors on their geometric and topographic structures and connections to the gates, sources and drains of the access transistors are getting much worse for scaling down; (3) the trench capacitor suffers too large aspect ratio of the depth versus opening size and is almost halted at the 14 nm node; (4) the stacked capacitor suffers the worsen topography and there is almost no space for the contact spaces between the storage electrode to the source of the access transistor after twisting the active region from 20 degree to over 50 degree, etc. In addition, the allowable space for the bit line contact to the drain of the access transistor is getting so small but a self-aligned feature must still be struggled to maintain; (5) the worsen leakage current problem demands enhancing the capacitance and keeping increasing the height of the capacitor to have a larger capacitance area unless a much high-K dielectric insulator material for the storage capacitance can be discovered; (6) without technology breakthroughs of solving the above difficulties all increasing demands on better reliability, quality and resilience of DRAM chips under increasingly demanding higher density/capacity and performance are getting harder to be met, and so on.

SUMMARY OF THE INVENTION

The present invention provides a new HCoT (an H-shape capacitor (i.e. 1C) positioned directly over to clamp an access transistor (i.e. 1T)) with a process to implement a 1T-1C memory cell structure.

An embodiment of the present invention provides a memory cell structure. The memory cell structure includes a silicon substrate, a transistor, and a capacitor. The silicon substrate has a silicon surface. The transistor is coupled to the silicon surface, wherein the transistor includes a gate structure, a first conductive region, and a second conductive region. The capacitor has a storage electrode, wherein the capacitor is over the transistor and the storage electrode is electrically coupled to the second conductive region of the transistor. The capacitor includes a capacitor periphery, and the transistor is located within the capacitor periphery.

According to another aspect of the invention, the storage electrode comprises a circumference and the transistor is located within the circumference.

According to another aspect of the invention, the capacitor further includes a counter electrode covering the transistor.

According to another aspect of the invention, the memory cell structure further includes a bit line electrically coupled to the first conductive region of the transistor, wherein the bit line is positioned under the silicon surface.

According to another aspect of the invention, the memory cell structure further includes a bit line being electrically coupled to the first conductive region of the transistor through a bridge contact, wherein the bridge contact is positioned under the silicon surface and a first sidewall of the bridge contact is aligned with an edge of the bit line, and the bridge contact comprises an upper portion and a lower portion, the upper portion of the bridge contact abuts against the silicon substrate and the lower portion of the bridge contact is separated from the silicon substrate by a first isolating layer.

According to another aspect of the invention, the capacitor includes a first protrusion region, a second protrusion region and a connection region, the connection region is over the gate structure of the transistor and connects the first protrusion region and the second protrusion region, and the first protrusion region and the second protrusion region confine the transistor.

According to another aspect of the invention, the transistor further includes a first spacer covering a first side of the gate structure and positioned above the silicon surface; and a second spacer covering a second side of the gate structure and positioned above the silicon surface; wherein the second protrusion region of the capacitor extends upward from the silicon surface and abuts against the second spacer, and the first protrusion region of the capacitor abuts against the first spacer and extends upward from an isolation region which is on the silicon surface.

Another embodiment of the present invention provides a memory cell structure. The memory cell structure includes a silicon substrate, a transistor, and a capacitor. The silicon substrate has a silicon surface. The transistor is coupled to the silicon surface, wherein the transistor includes a gate structure, a first conductive region, and a second conductive region. The capacitor is electrically coupled to the second conductive region of the transistor, and the capacitor completely covering the transistor.

According to another aspect of the invention, the capacitor includes a storage electrode, and the storage electrode includes a first protrusion region, a second protrusion region, and a connection region vertically stacked above a top side of the transistor and connecting the first protrusion region and the second protrusion region; wherein the second protrusion region connects to the second conductive region of the transistor.

According to another aspect of the invention, the first protrusion region and the second protrusion region clamp the transistor.

According to another aspect of the invention, the memory cell structure further includes a counter electrode, a plurality of first transistors, and a plurality of first storage electrodes corresponding to the plurality of first transistors respectively; wherein the counter electrode covers the plurality of first transistors and the plurality of first storage electrodes, and the counter electrode is coupled to a first voltage source.

According to another aspect of the invention, the memory cell structure further includes a bit line electrically coupled to the first conductive region of the transistor, wherein the bit line is positioned under the silicon surface and electrically coupled to the first conductive region of the transistor through a bridge contact.

According to another aspect of the invention, the bridge contact is positioned under the silicon surface and a first sidewall of the bridge contact is aligned with an edge of the bit line.

According to another aspect of the invention, the bridge contact includes an upper portion and a lower portion, the upper portion of the bridge contact abuts against the silicon substrate and the lower portion of the bridge contact is separated from the silicon substrate by a first isolating layer.

According to another aspect of the invention, the transistor further includes a first spacer and a second spacer, the first spacer covers a first side of the gate structure and is positioned above the silicon surface, and the second spacer covers a second side of the gate structure and is positioned above the silicon surface. The second protrusion region of the storage electrode extends upward from the silicon surface and abuts against the second spacer, and the first protrusion region of the storage electrode abuts against the second spacer and extends upward from an isolation region which is on the silicon surface.

According to another aspect of the invention, a top of the first protrusion region is a rectangular-like shape, and a top of the second protrusion region is another rectangular-like shape.

Another embodiment of the present invention provides a memory cell structure including a cell area and an inner area within the cell area. The memory cell structure includes a transistor and a capacitor. The transistor is within the inner area. The capacitor is within the cell area, the capacitor includes a plurality of protrusion regions and a connection region, the connection region is over the transistor and connecting the plurality of protrusion regions.

According to another aspect of the invention, the cell area is a rectangular-like shape, and a top of one protrusion region is another rectangular-like shape.

According to another aspect of the invention, the transistor includes a gate structure, a cap isolating layer above the gate structure, a first conductive region, and a second conductive region, wherein a first protrusion region of the plurality of protrusion regions extends upward and downward from a top of the cap isolating layer.

According to another aspect of the invention, a second protrusion region of the plurality of protrusion regions extends upward and downward from a top of the cap isolating layer, and the second protrusion region connects to the second conductive region of the transistor.

According to another aspect of the invention, the plurality of protrusion regions confine the transistor.

Another embodiment of the present invention provides a memory cell structure. The memory cell structure includes a silicon substrate, a transistor, and a capacitor. The silicon substrate has a silicon surface. The transistor is coupled to the silicon surface and includes a gate structure, a cap isolating layer above the gate structure, a first conductive region, and a second conductive region. The capacitor is electrically coupled to the second conductive region of the transistor, wherein the capacitor is over the transistor and comprises a capacitor periphery which is a rectangular-like shape.

According to another aspect of the invention, the transistor is located within the capacitor periphery.

According to another aspect of the invention, the capacitor further includes a storage electrode, and the storage electrode includes a first protrusion region, a second protrusion region, and a connection region being above the cap isolating layer and connecting the first protrusion region and the second protrusion region; wherein the first protrusion region and the second protrusion extend upward and downward from a top of the cap isolating layer.

According to another aspect of the invention, the first protrusion region extends upward from the top of the cap isolating layer to a position higher than the connection region, and extends downward from the top of the cap isolating layer to an isolation region which is on the silicon surface.

According to another aspect of the invention, the second protrusion region extends upward from the top of the cap isolating layer to another position higher than the connection region, and extends downward from the top of the cap isolating layer to the silicon surface.

Another embodiment of the present invention provides a memory cell structure. The memory cell structure includes a counter electrode, a plurality of first transistors, and a plurality of first storage electrodes. The plurality of first storage electrodes correspond to the plurality of first transistors respectively; wherein the counter electrode covers the plurality of first transistors and the plurality of first storage electrodes, and the counter electrode is coupled to a first voltage source.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 40-1 is a diagram illustrating the post RTA (rapid temperature annealing) step to form better electrical connection between the elevated source electrode EH-1S (or the elevated drain electrode EH-1D) and the channel region of the transistor.

DETAILED DESCRIPTION

Figure 1A:
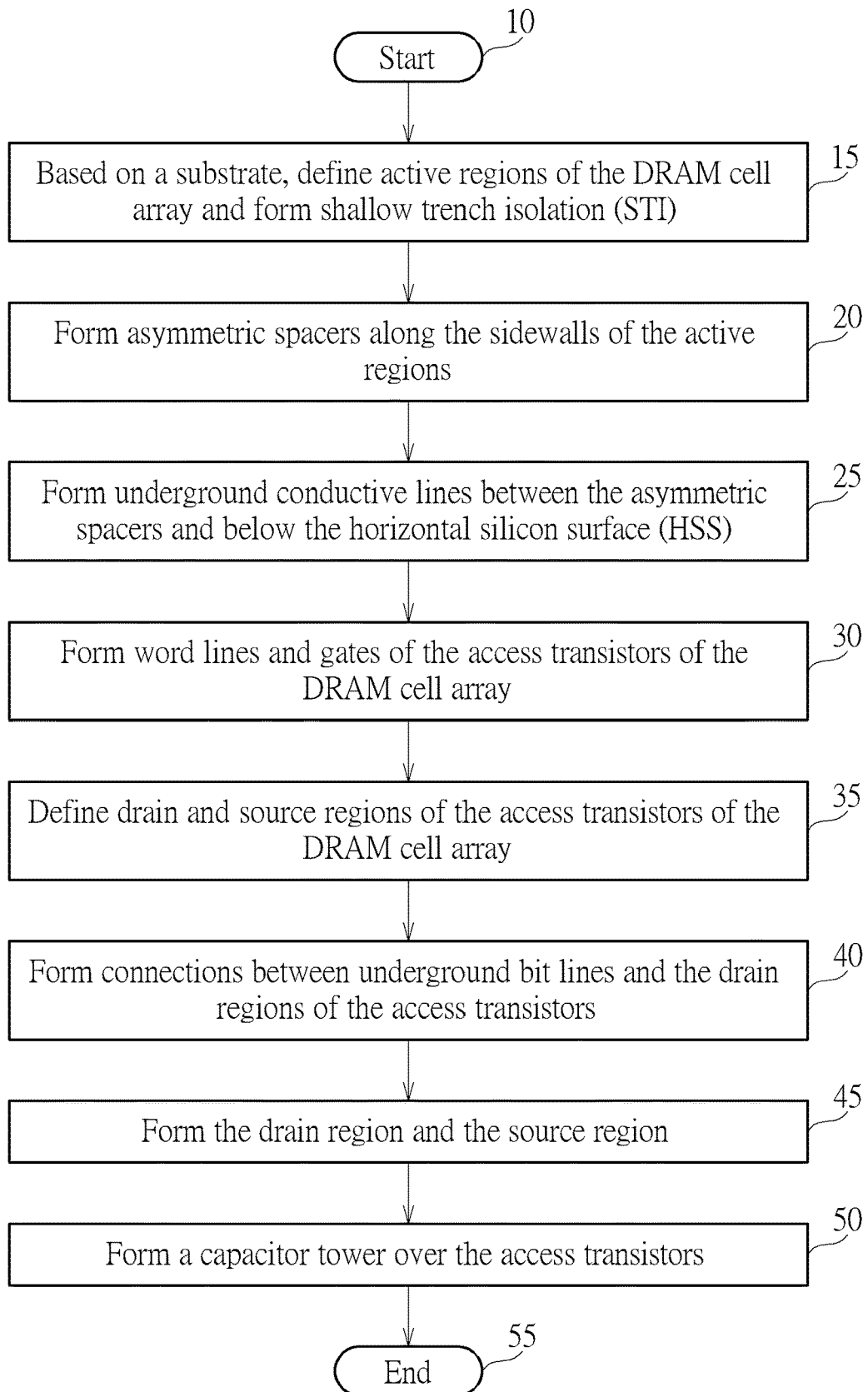
FIG. 1A is a flowchart illustrating a manufacturing method of a DRAM cell (1T1C cell) array according to an embodiment of the present invention.

Please refer to FIGS. 1A-1F, wherein FIG. 1A is a flowchart illustrating a manufacturing method of an HCoT cell array according to an embodiment of the present invention.

Step 10: Start.

Step 15: based on a substrate (such as, a p-type silicon substrate), define active regions of the DRAM cell array and form shallow trench isolation (STI).

Step 20: Form asymmetric spacers along the sidewalls of the active regions.

Step 25: Form underground conductive lines (such as bit lines) between the asymmetric spacers and below the horizontal silicon surface (HSS).

Step 30: Form word lines and gates of the access transistors of the DRAM cell array.

Step 35: Define drain (i.e. first conductive regions) and source regions (i.e. second conductive regions) of the access transistors of the DRAM cell array.

Step 40: Form connections between underground bit lines and the drain regions of the access transistors.

Step 45: Form the drain region and the source region.

Step 50: Form a capacitor tower over the access transistors.

Step 55: End.

Figure 1B:
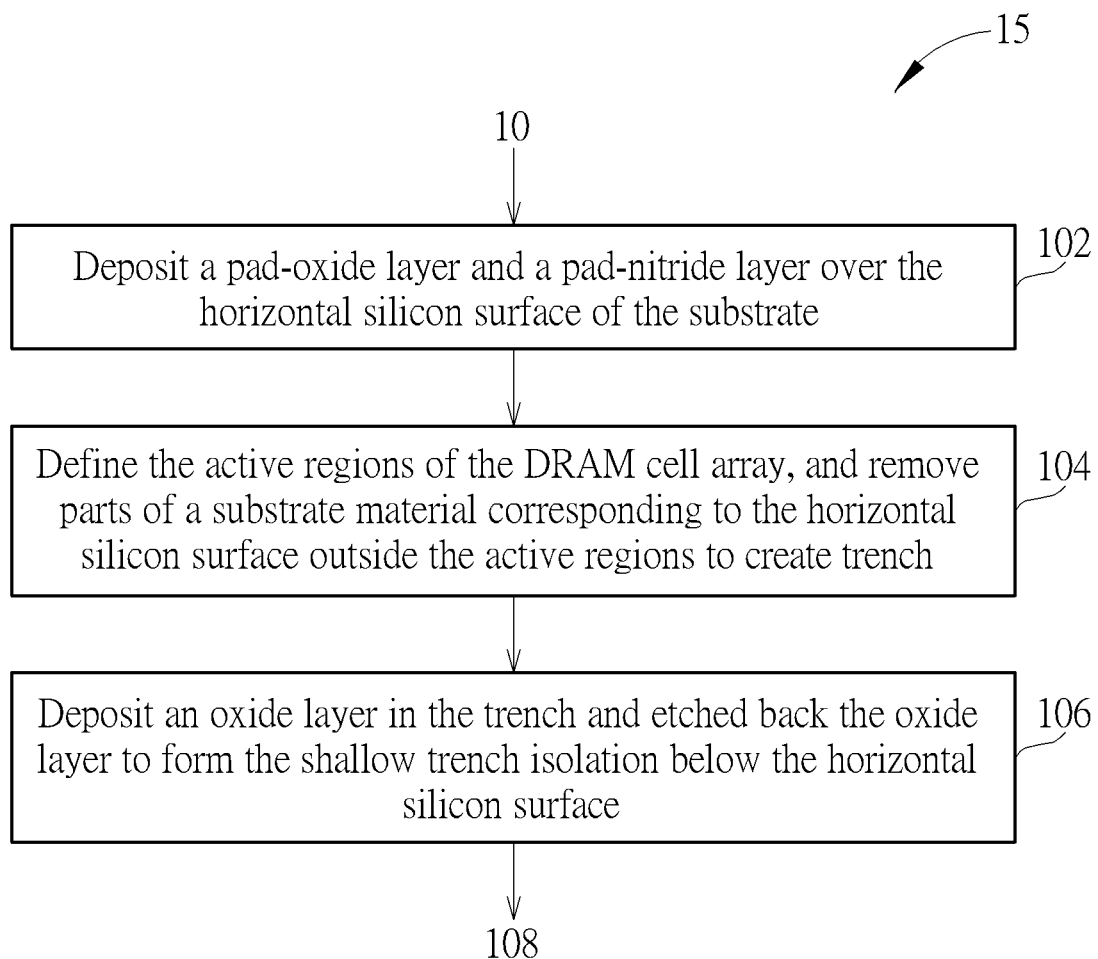
FIGS. 1B-1J are diagrams illustrating FIG. 1A.
Figure 1C:
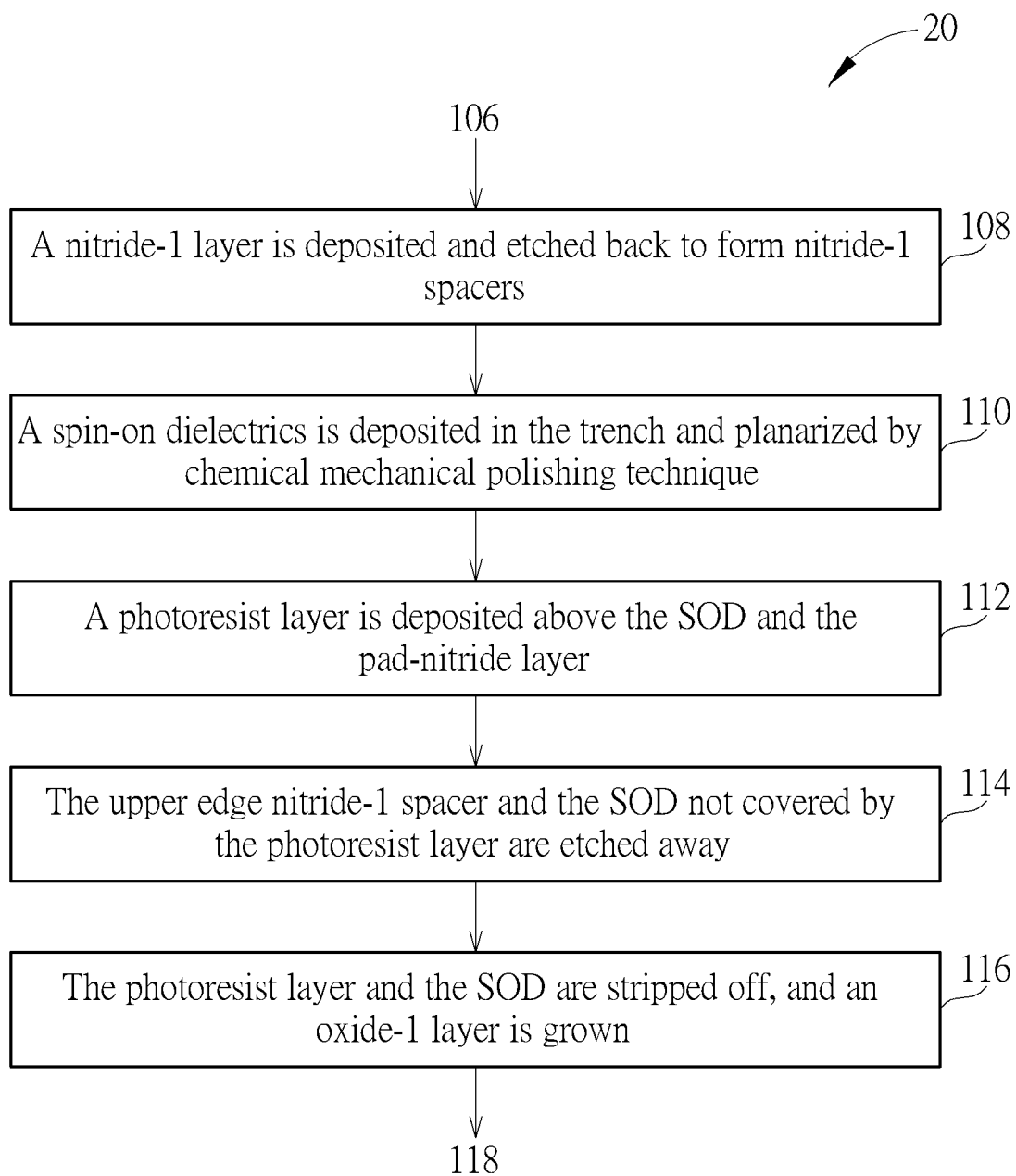
Figure 1D:
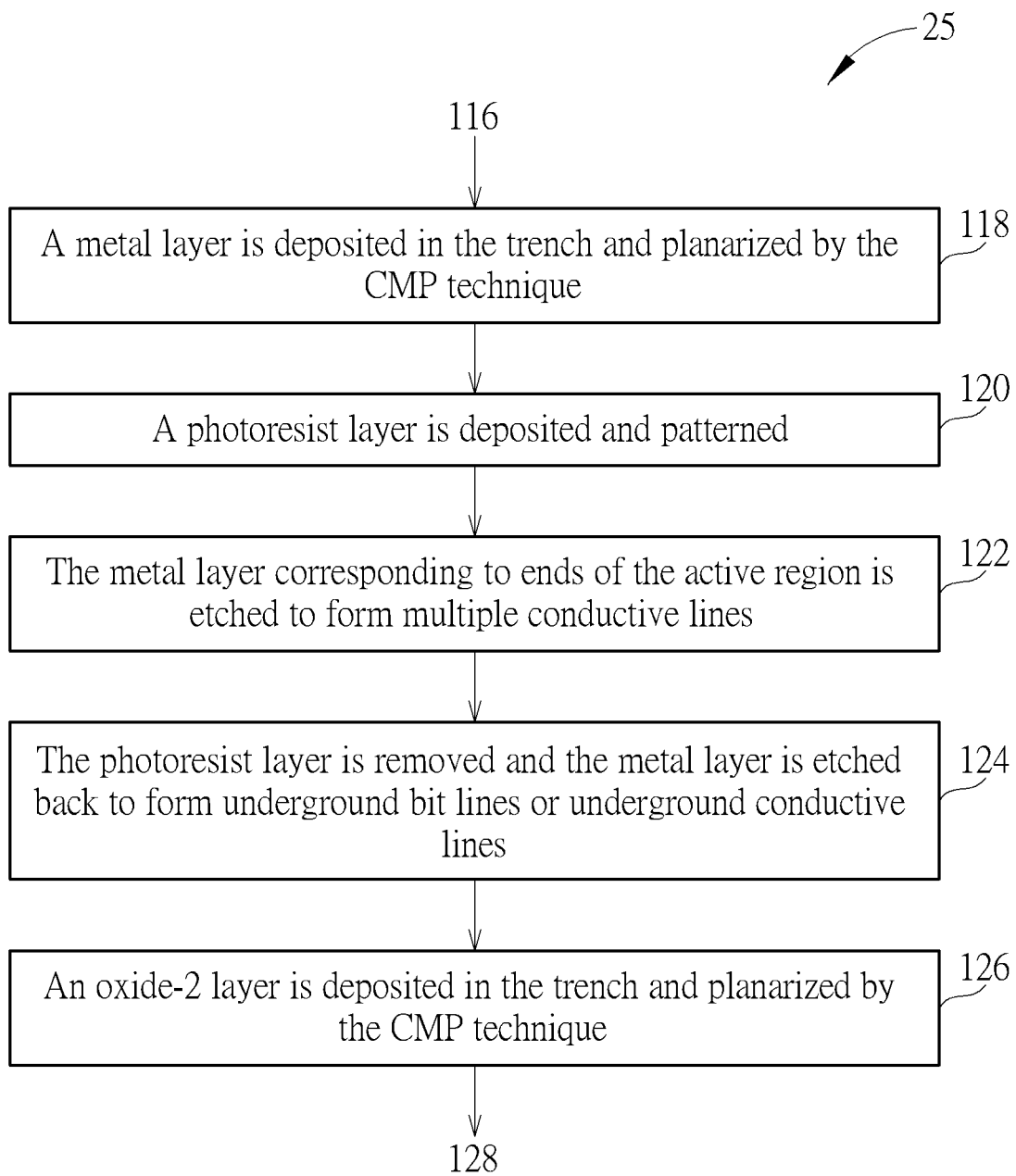
Figure 1E:
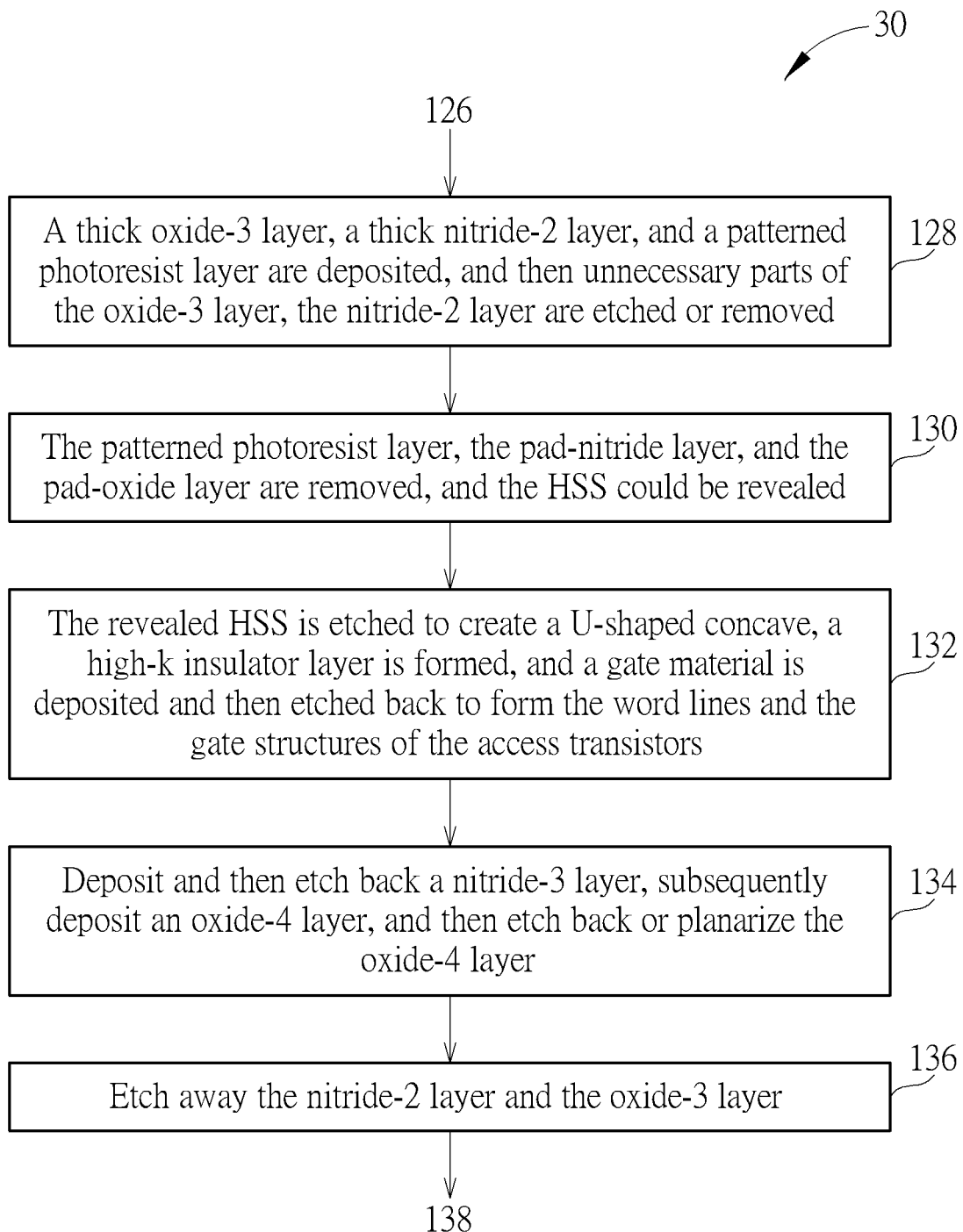
Figure 1F:
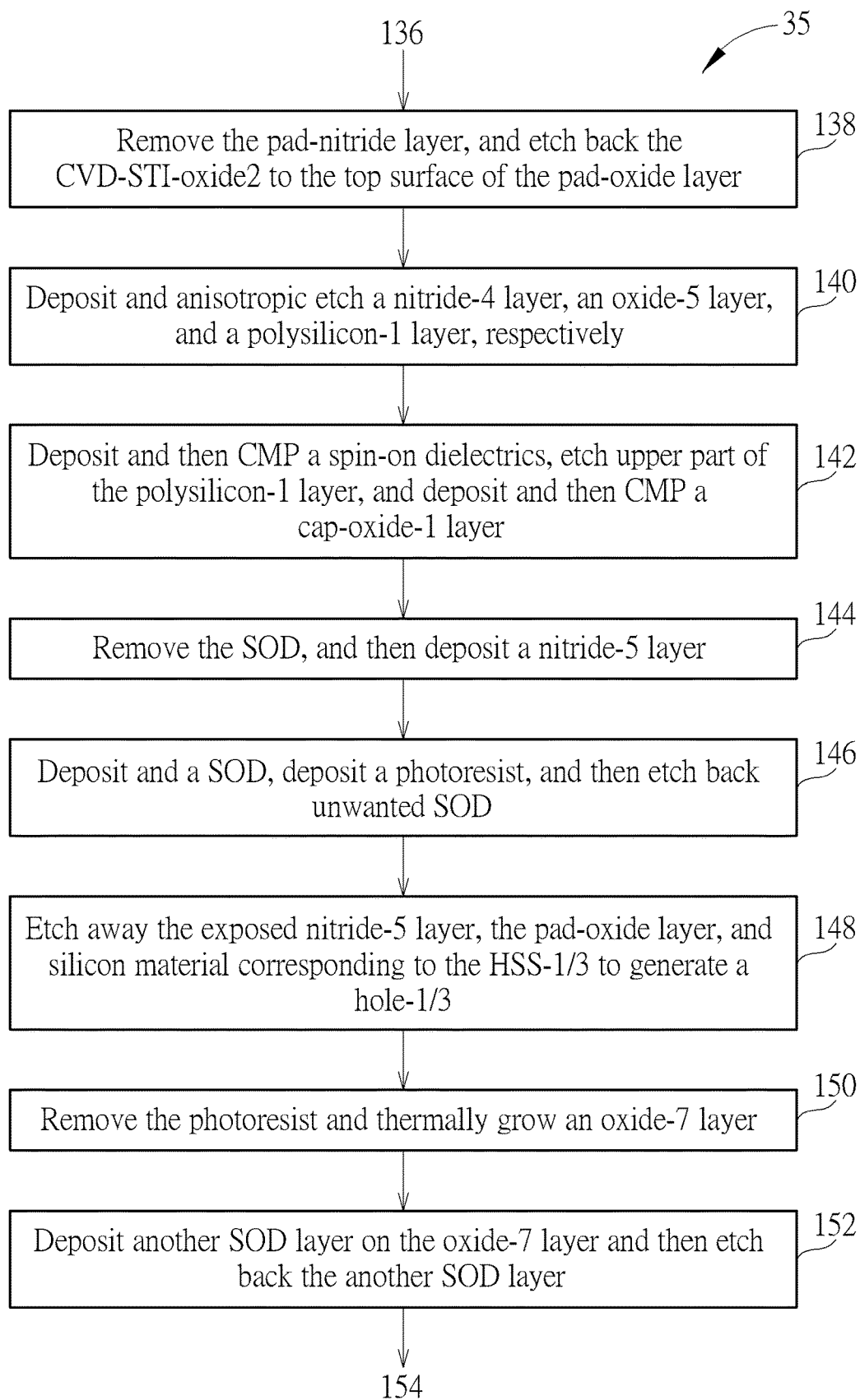
Figure 1G:
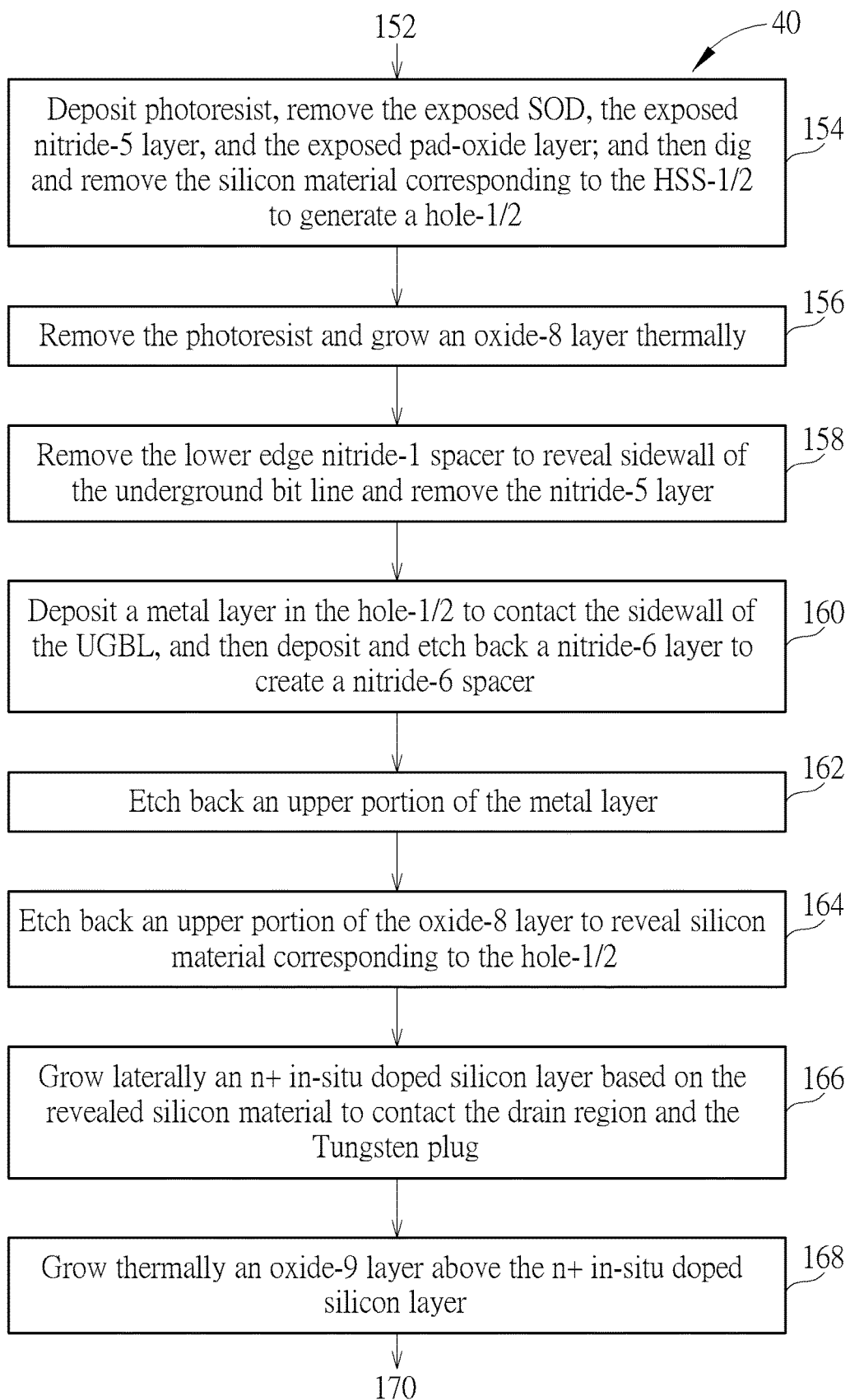
Figure 1H:
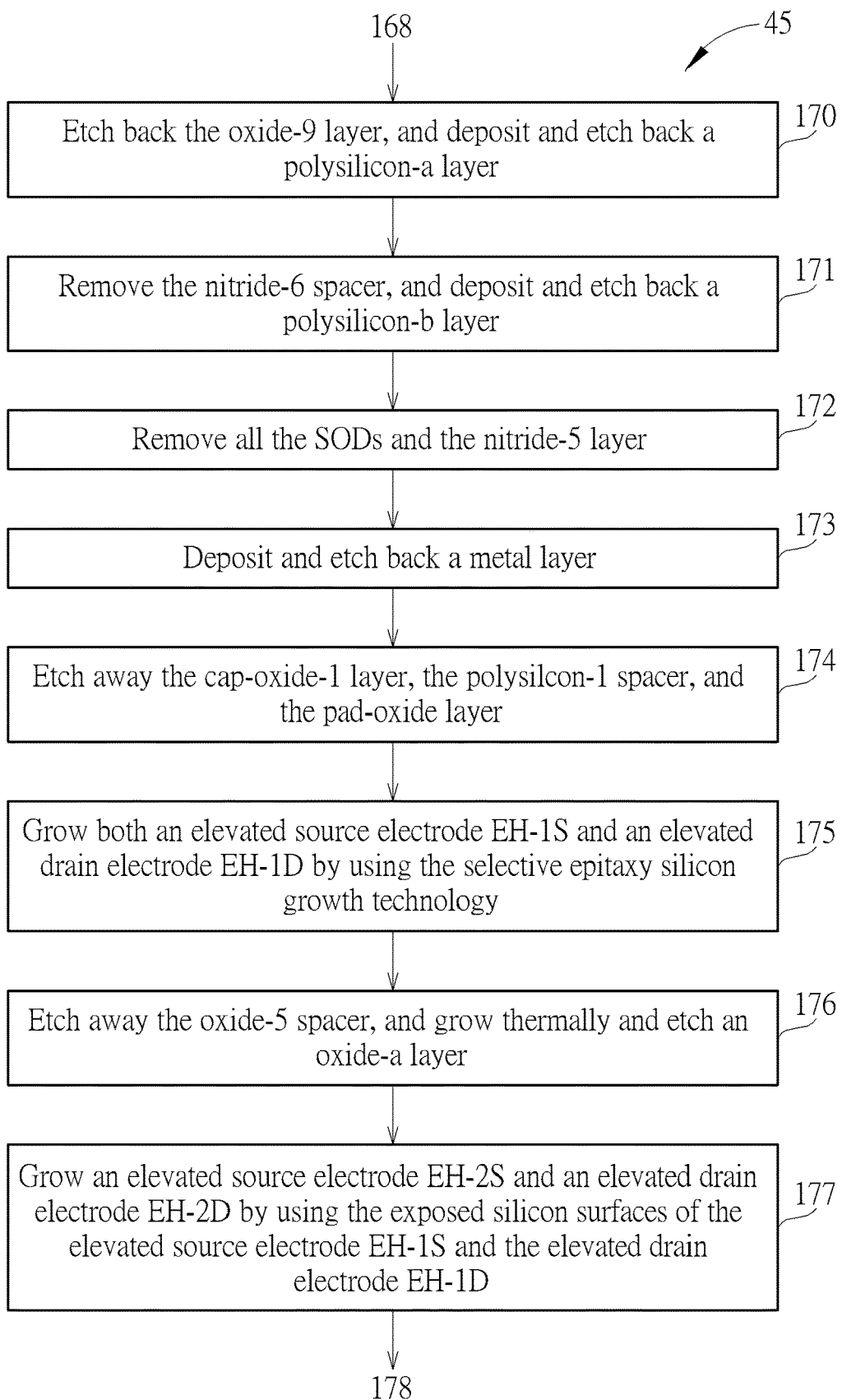
Figure 1I:
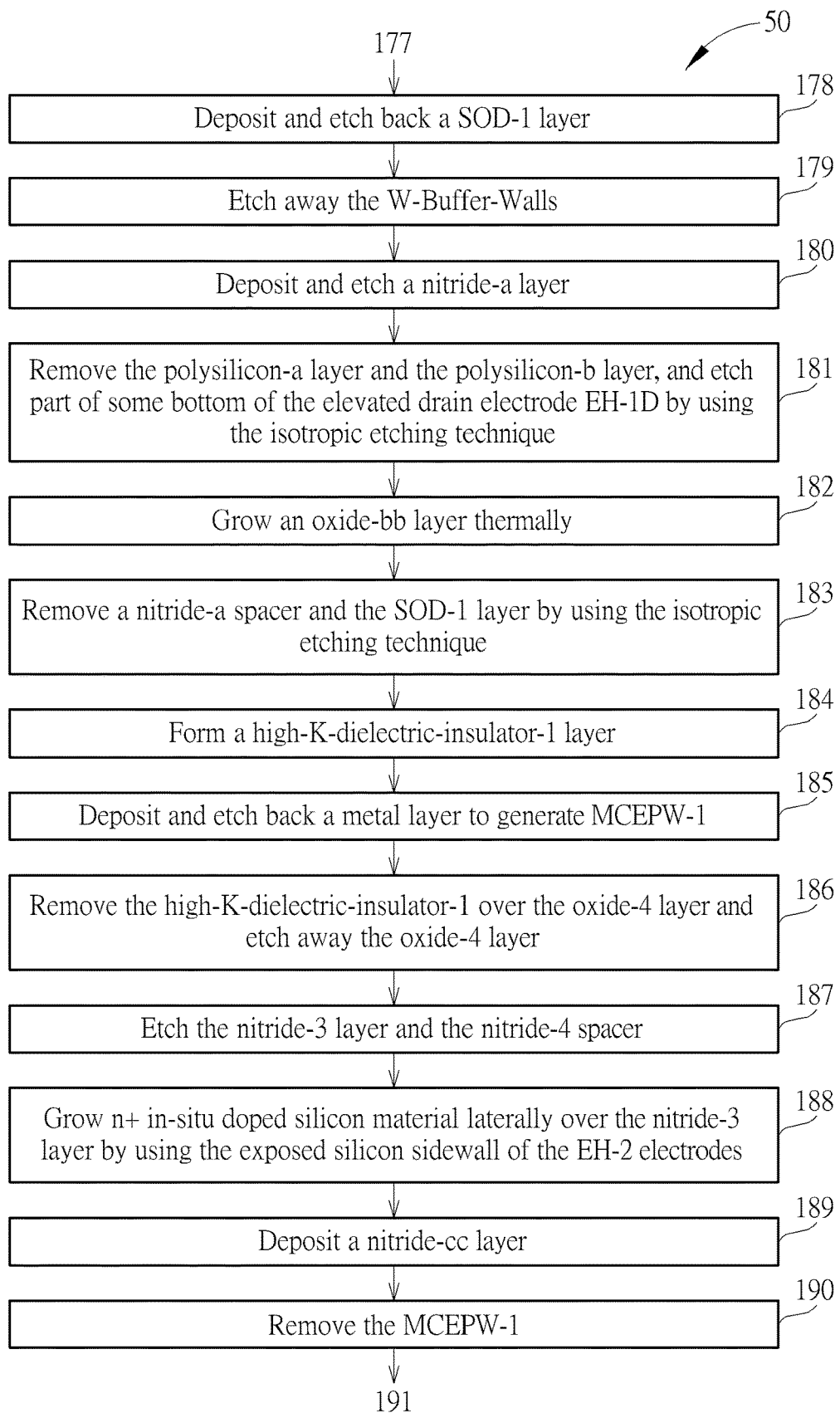
Figure 1J:
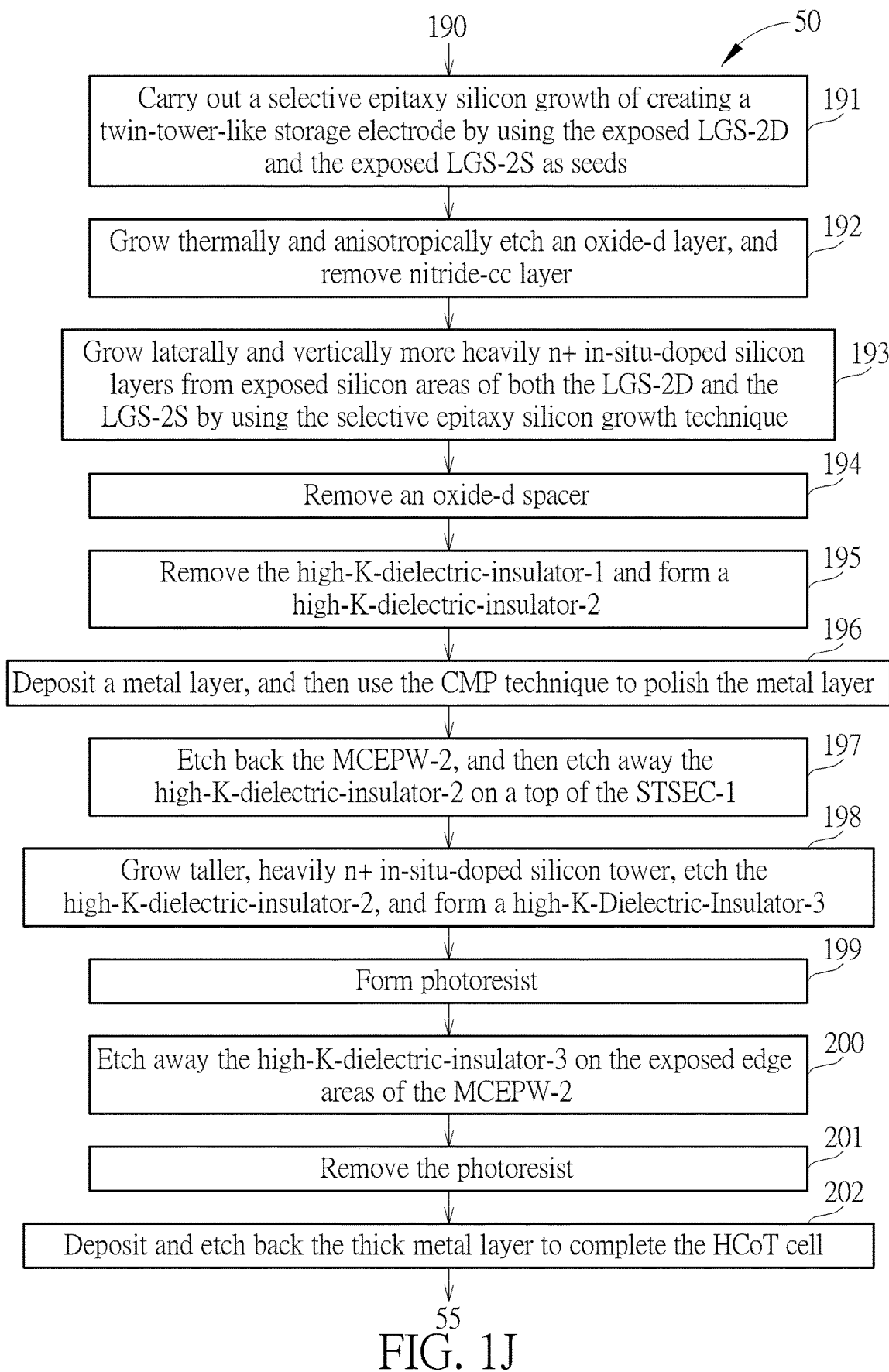
Figure 2:
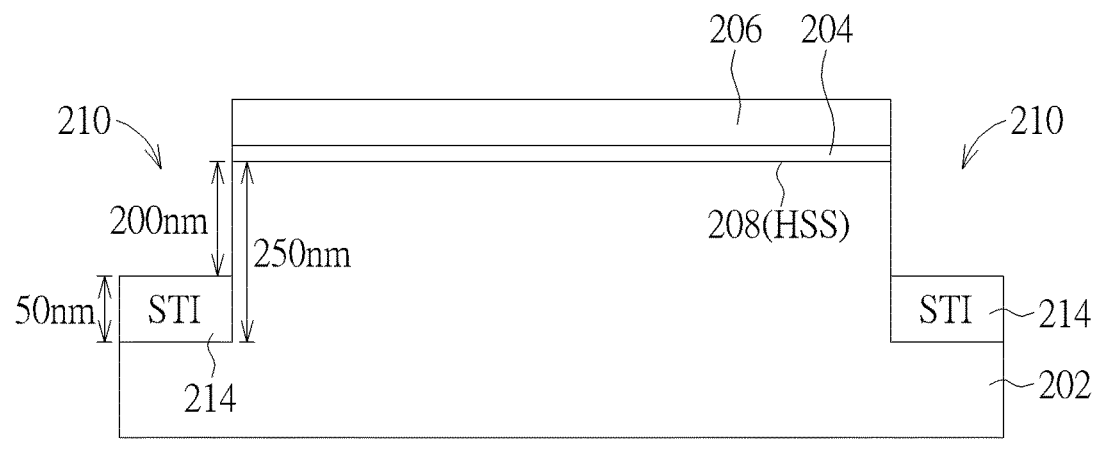
FIG. 2 is a diagram illustrating a top view and a cross-section view along an X direction after the pad-nitride layer and the pad-Oxide layer are deposited and the STI is formed.
Figure 2:
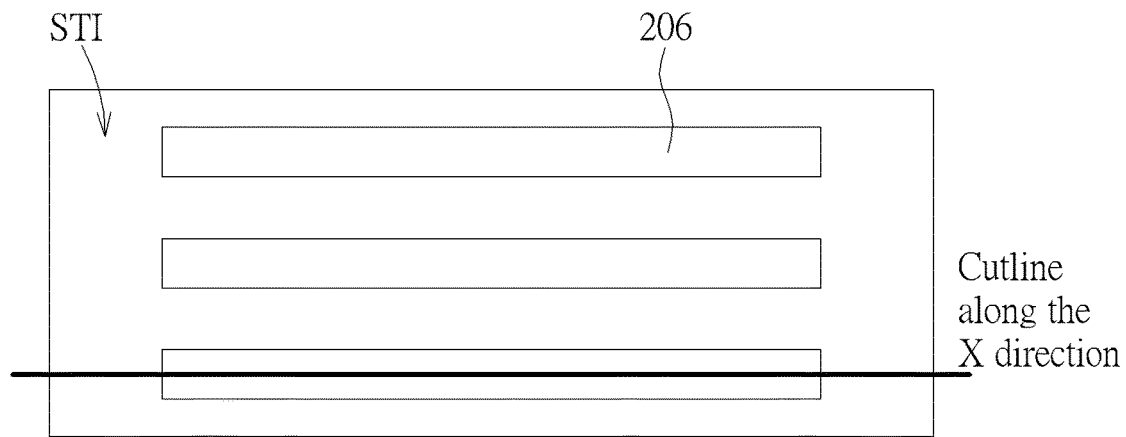

Please refer to FIG. 1B and FIG. 2. Step 15 could include:

Step 102: Deposit a pad-oxide layer 204 and a pad-nitride layer 206 over the horizontal silicon surface (hereinafter, "HSS") 208 of the substrate.

Step 104: Define the active regions of the DRAM cell array, and remove parts of a substrate material (such as silicon material) corresponding to the horizontal silicon surface 208 outside the active regions to create trench 210.

Step 106: Deposit an oxide layer 214 in the trench 210 and etched back the oxide layer 214 to form the shallow trench isolation (STI) below the horizontal silicon surface 208.

Figure 3:
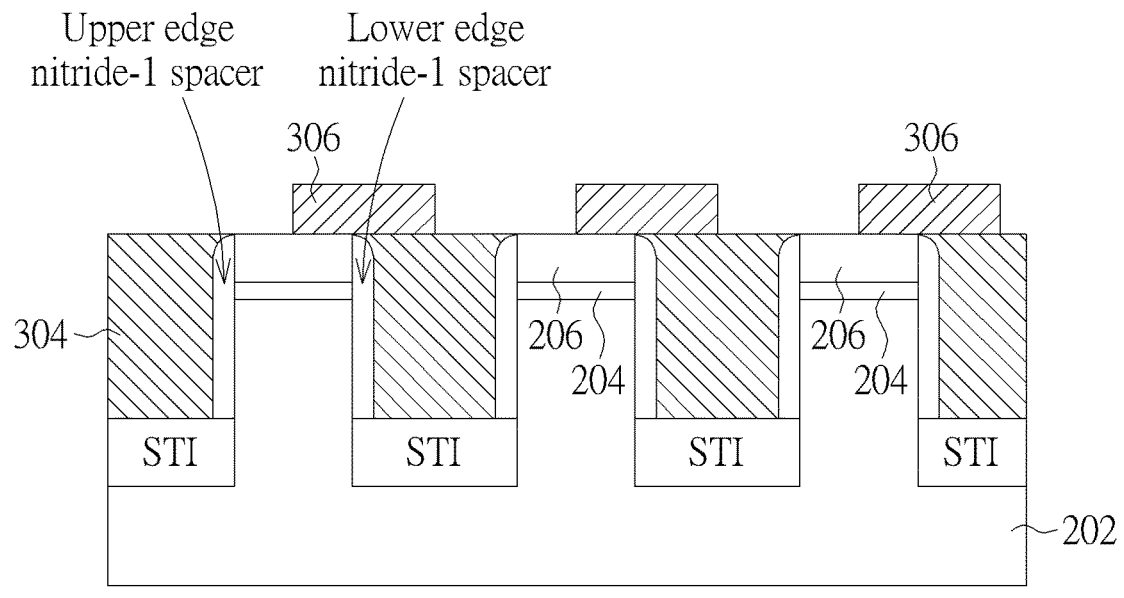
FIG. 3 is a diagram illustrating depositing and etching back the nitride-1 layer to form nitride-1 spacers, and depositing the SOD and the photoresist layer.
Figure 3:
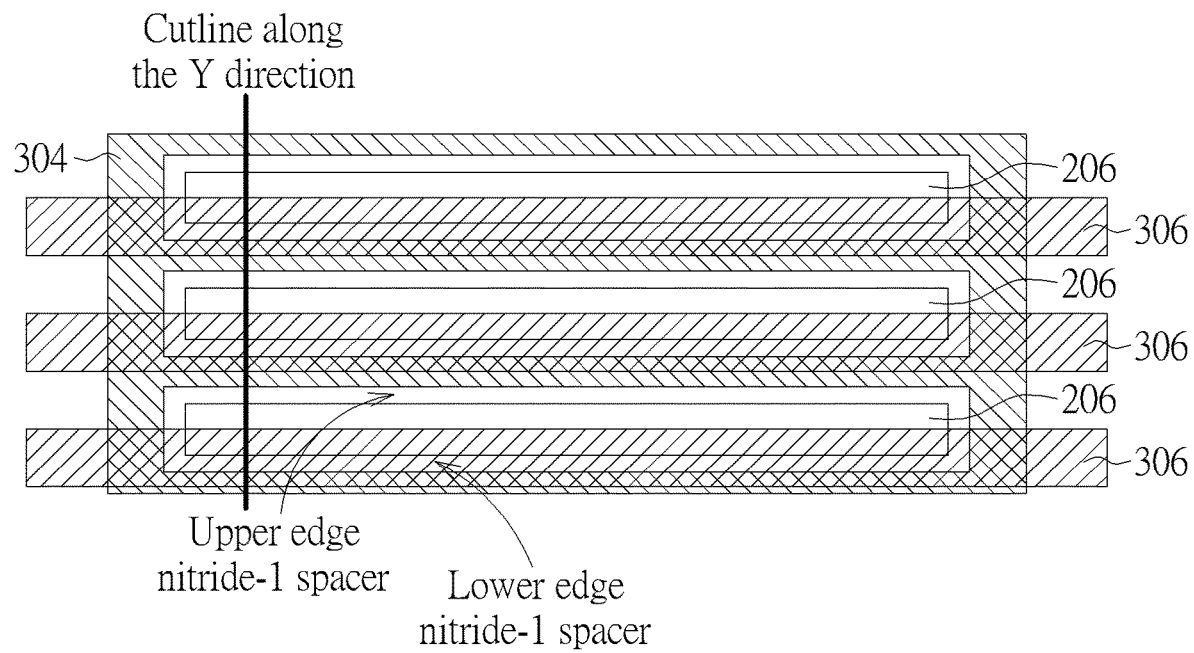

Please refer to FIG. 1C and FIGS. 3-5. Step 20 could include:

Step 108: A nitride-1 layer is deposited and etched back to form nitride-1 spacers (FIG. 3).

Step 110: A spin-on dielectrics (SOD) 304 is deposited in the trench 210 and planarized by chemical mechanical polishing (CMP) technique (FIG. 3).

Step 112: A photoresist layer 306 is deposited above the SOD 304 and the pad-nitride layer 206 (FIG. 3).

Figure 4:
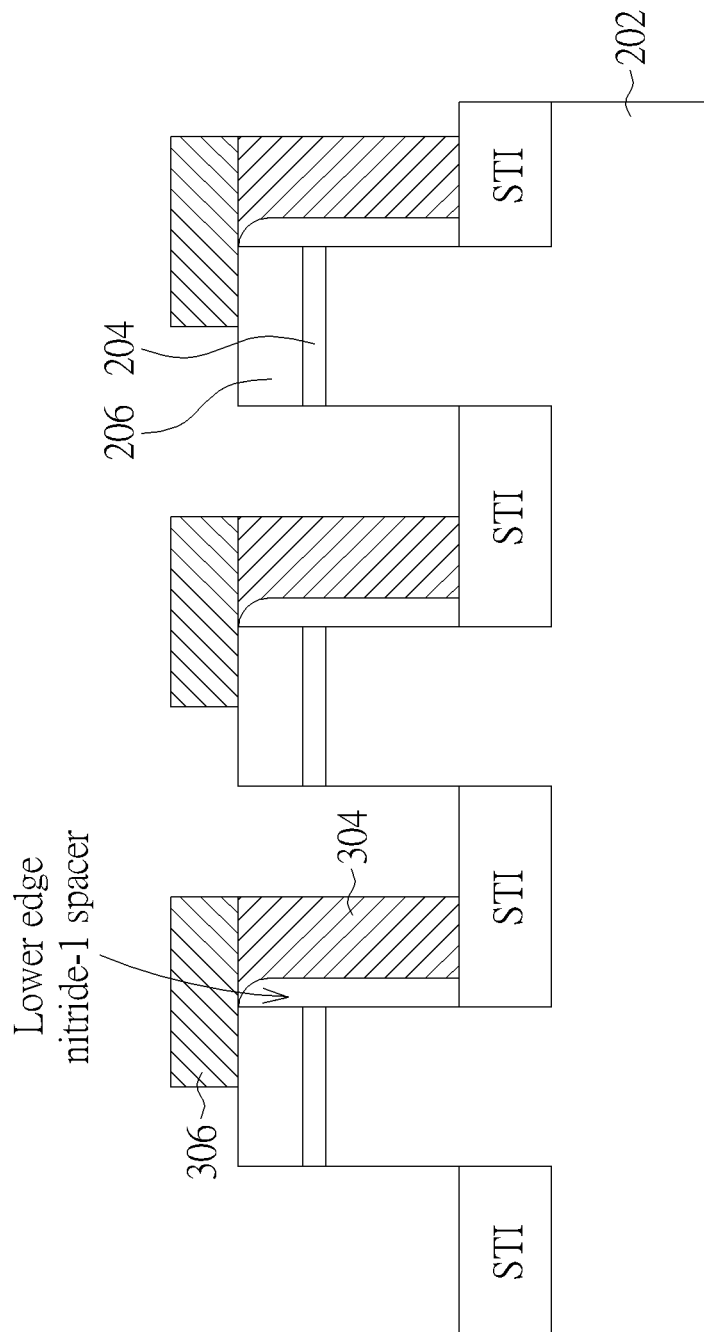
FIG. 4 is a diagram illustrating etching away the upper edge nitride-1 spacer and the SOD not covered by the photoresist layer.

Step 114: The upper edge nitride-1 spacer and the SOD 304 not covered by the photoresist layer 306 are etched away (FIG. 4).

Figure 5:
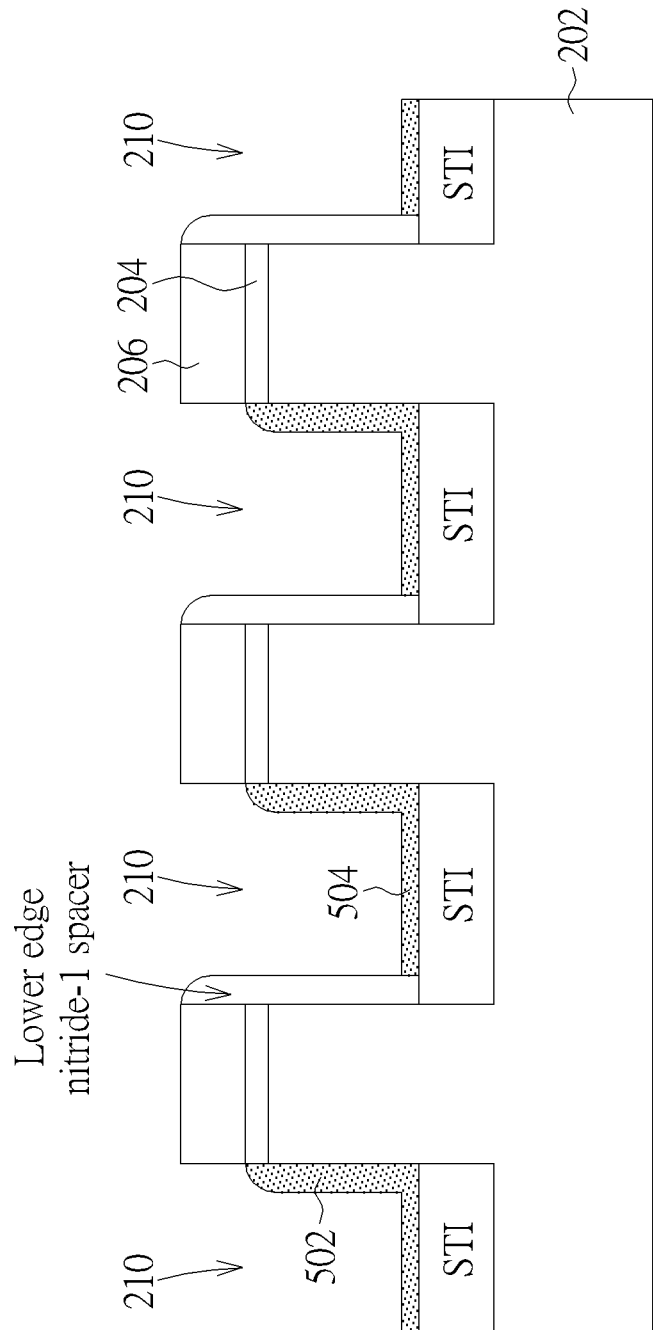
FIG. 5 is a diagram illustrating stripping off the photoresist layer and the SOD, and growing the oxide-1 layer.

Step 116: The photoresist layer 306 and the SOD 304 are stripped off, and an oxide-1 layer 502 is grown, such as thermal growth (FIG. 5).

Figure 6:
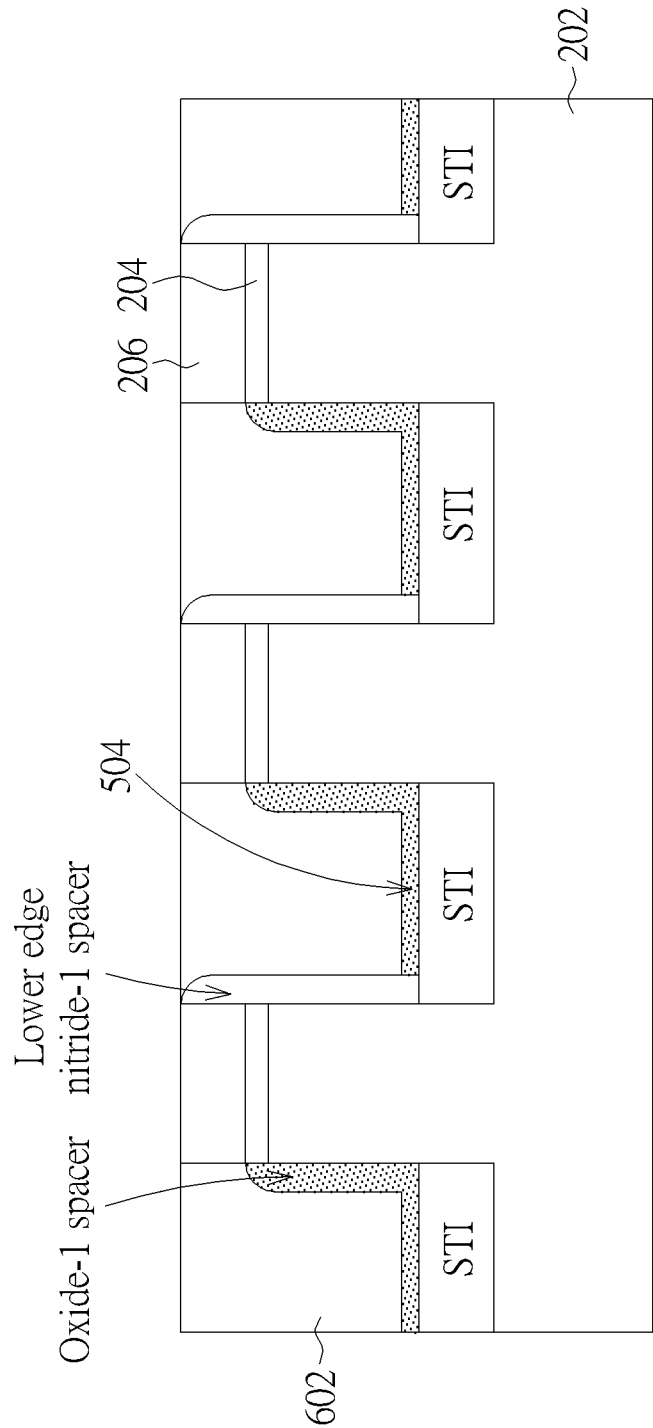
FIG. 6 is a diagram illustrating the metal layer being deposited in the trench and planarized by the CMP technique.

Please refer to FIG. 1D and FIGS. 6-10. Step 25 could include:

Step 118: A metal layer 602 is deposited in the trench 210 and planarized by the CMP technique (FIG. 6).

Figure 7:
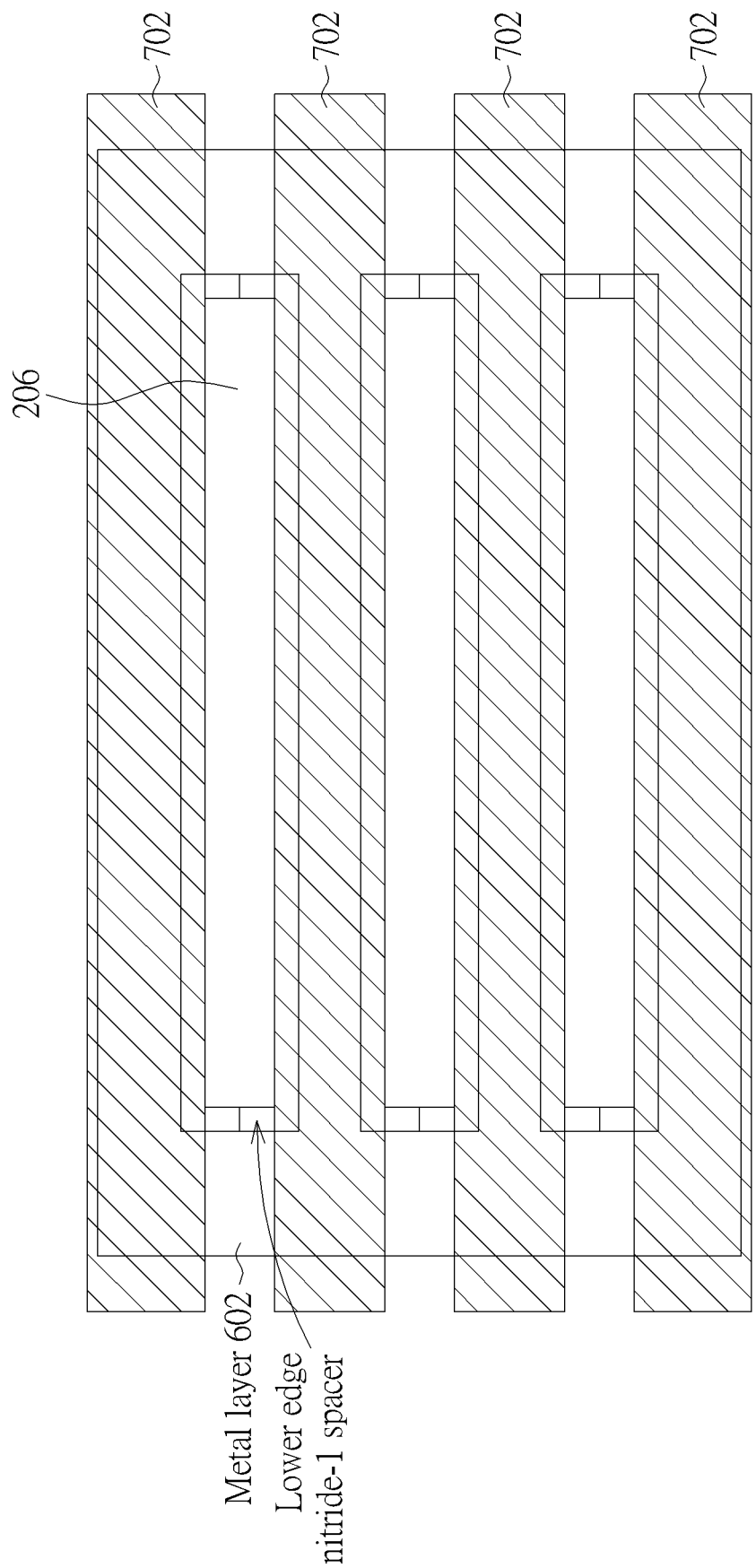
FIG. 7 is a diagram illustrating the photoresist layer being deposited.

Step 120: A photoresist layer 702 is deposited and patterned (FIG. 7).

Figure 8:
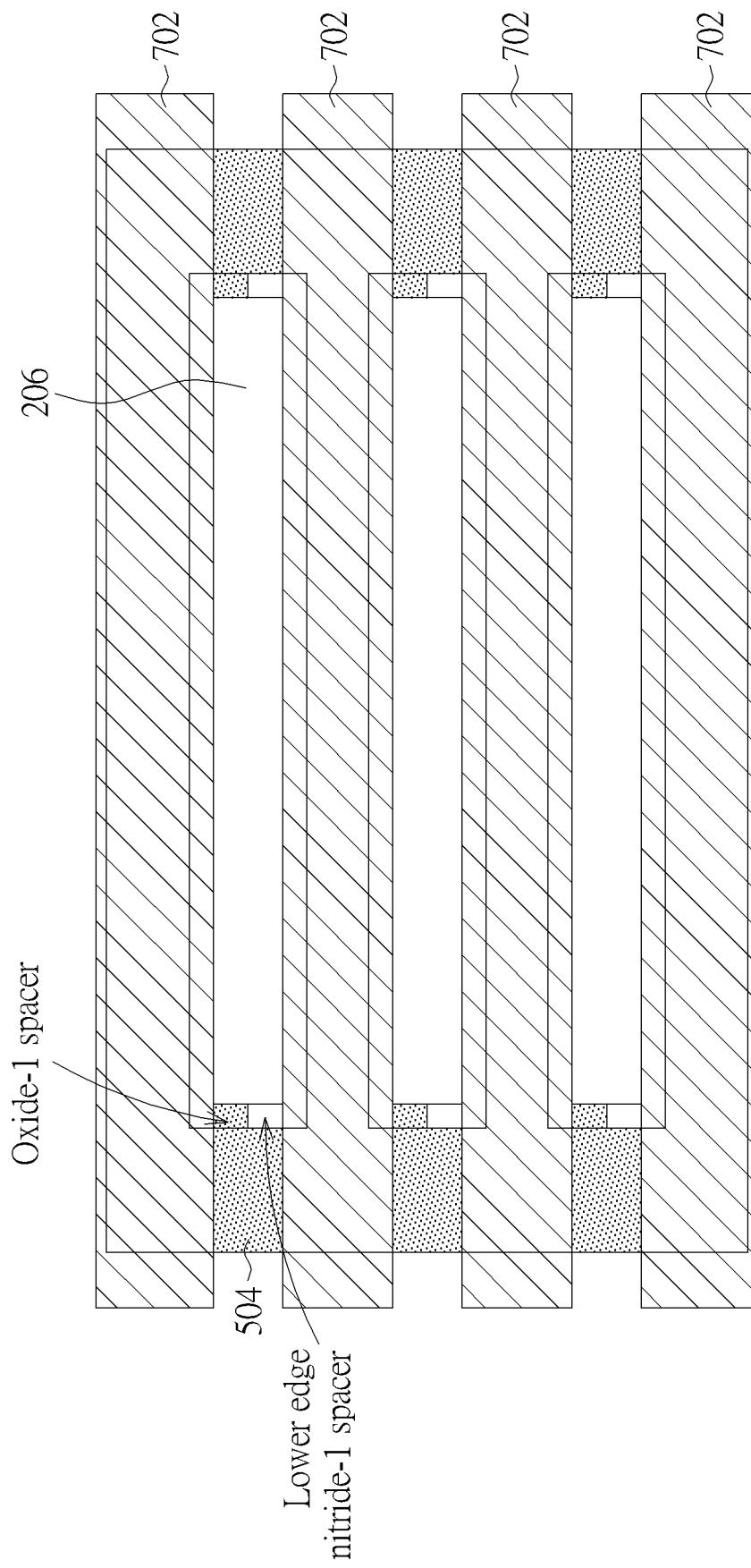
FIG. 8 is a diagram illustrating the metal layer corresponding to ends of the active region being etched.

Step 122: The metal layer 602 corresponding to ends of the active region is etched to form multiple conductive lines (FIG. 8).

Figure 9:
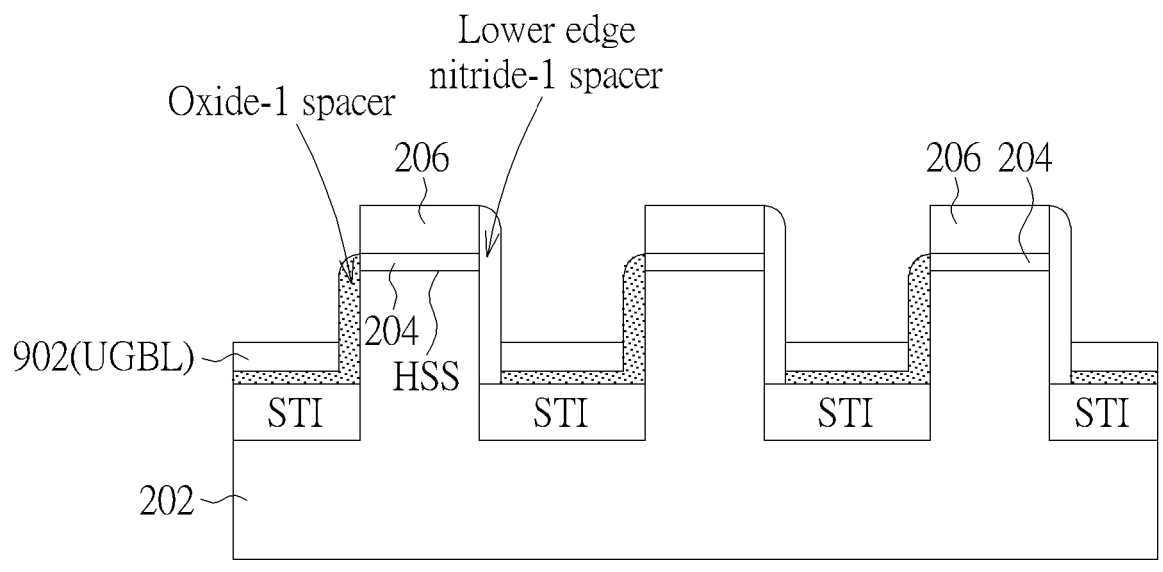
FIG. 9 is a diagram illustrating the photoresist layer being removed and the metal layer being etched back to form underground bit line.
Figure 9:
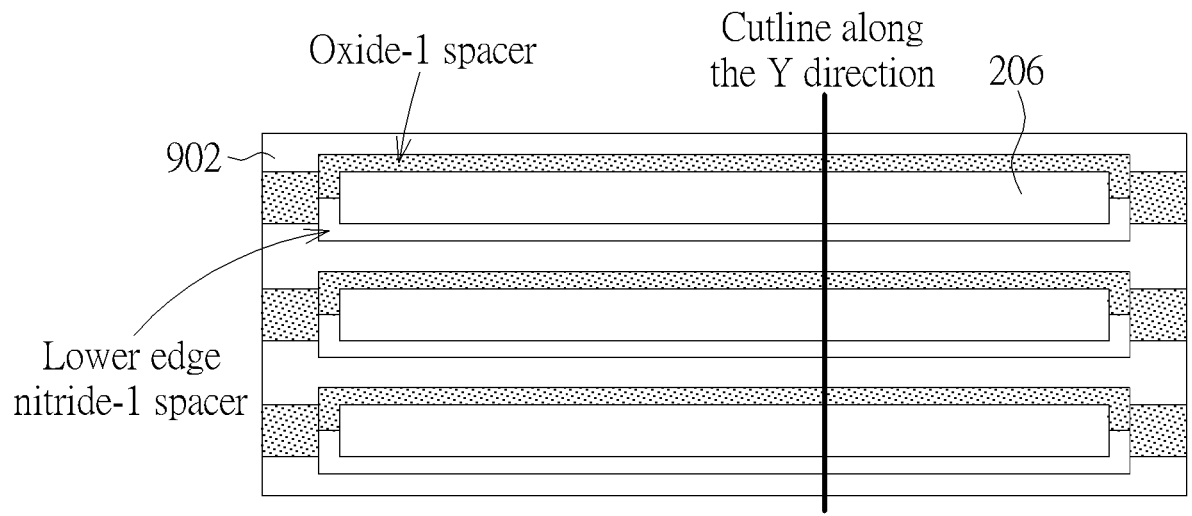

Step 124: The photoresist layer 702 is removed and the metal layer 602 (the multiple conductive lines) is etched back to form underground bit lines (UGBL) 902 or underground conductive lines (FIG. 9).

Figure 10:
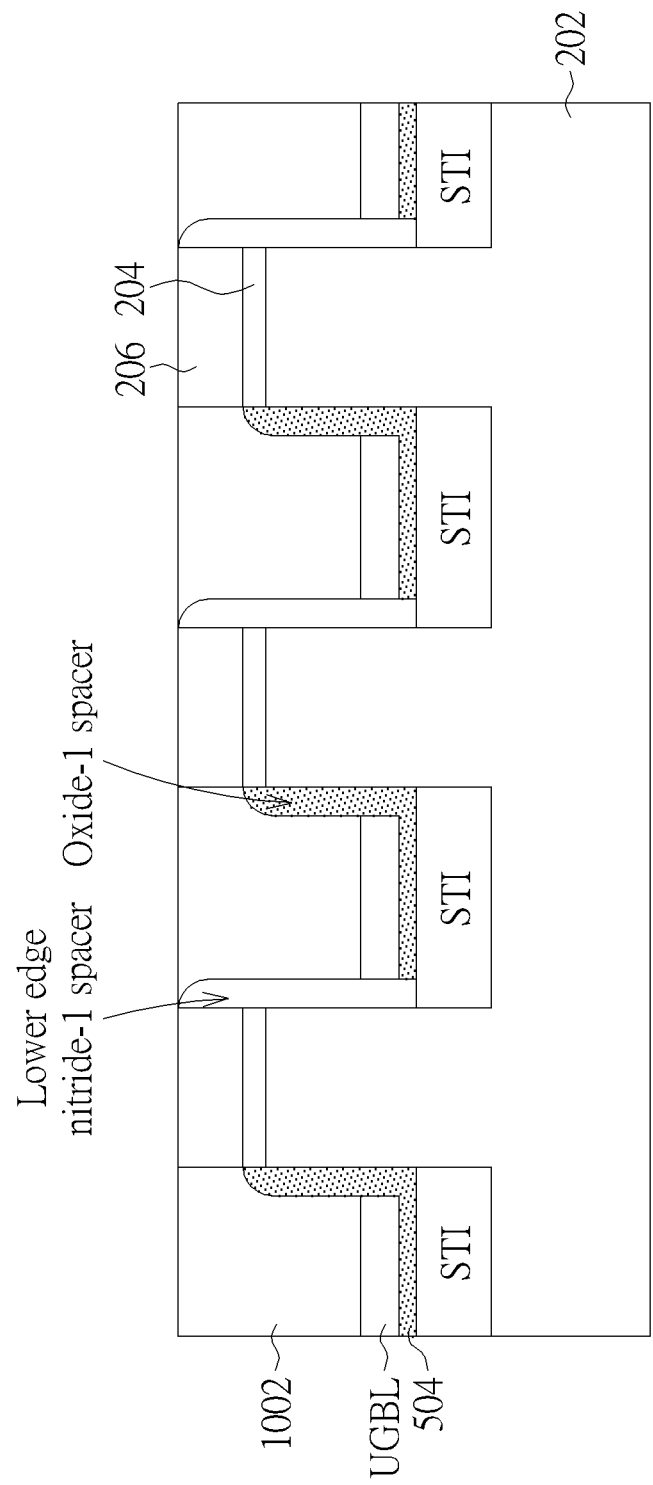
FIG. 10 is a diagram illustrating the oxide-2 layer being deposited in the trench.

Step 126: An oxide-2 layer 1002 is deposited in the trench 210 and planarized by the CMP technique (FIG. 10).

Figure 11:
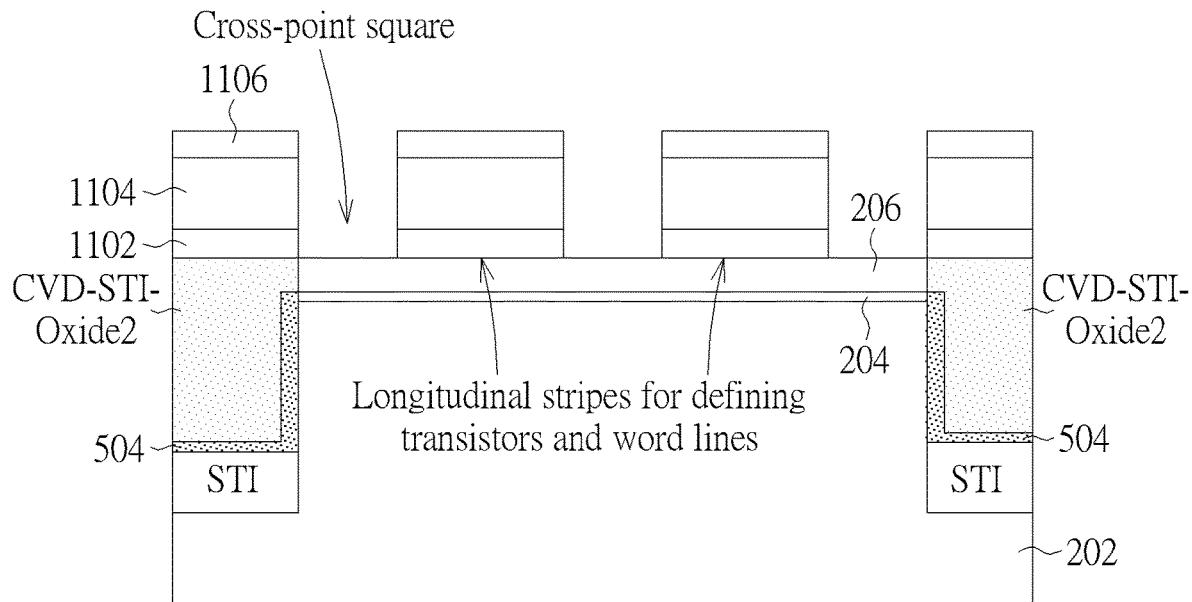
FIG. 11 is a diagram illustrating the oxide-3 layer, the nitride-2 layer, and the photoresist being deposited, and then the unnecessary parts of the oxide-3 layer, the nitride-2 layer, and the photoresist being removed.
Figure 11:
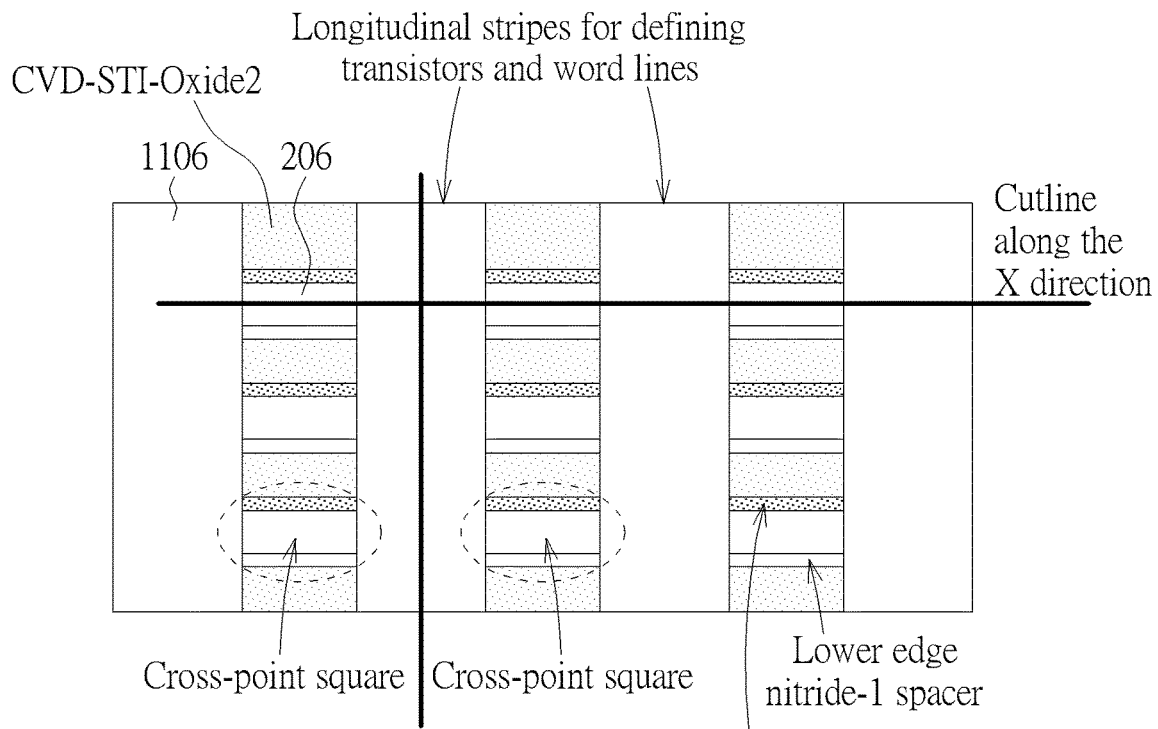

Please refer to FIG. 1E and FIGS. 11-15. Step 30 could include:

Step 128: A thick oxide-3 layer 1102, a thick nitride-2 layer 1104, and a patterned photoresist layer 1106 are deposited, and then unnecessary parts of the oxide-3 layer 1102, the nitride-2 layer 1104 are etched or removed (FIG. 11).

Figure 12:
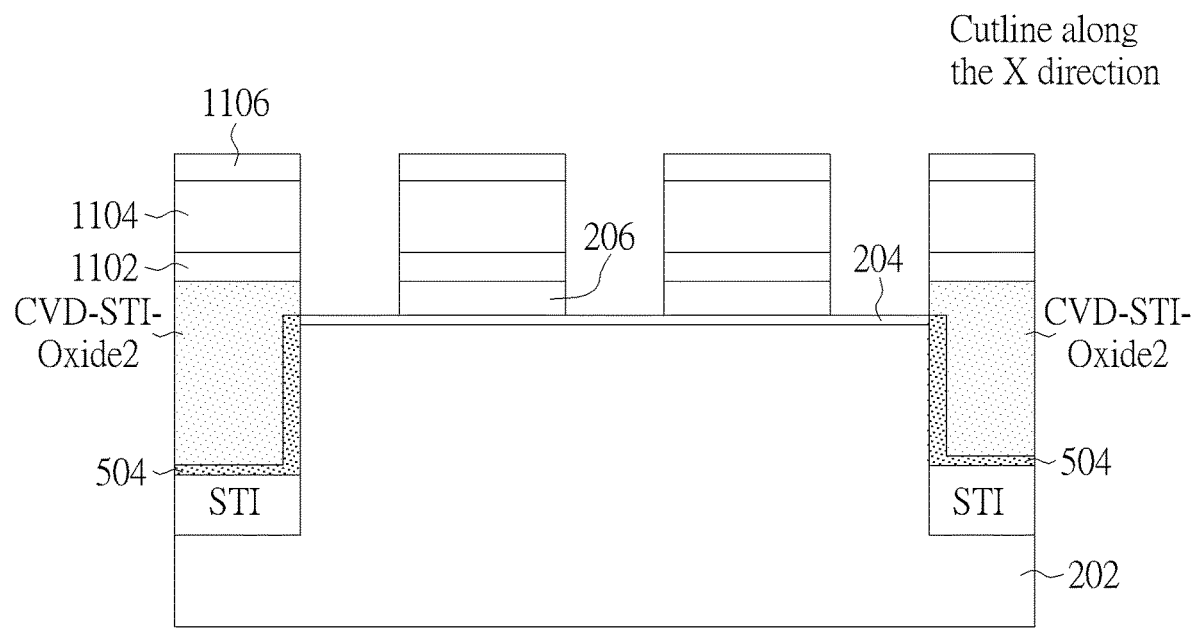
FIG. 12 is a diagram illustrating the photoresist layer, the pad-nitride layer, and the pad-oxide layer being removed.
Figure 12:
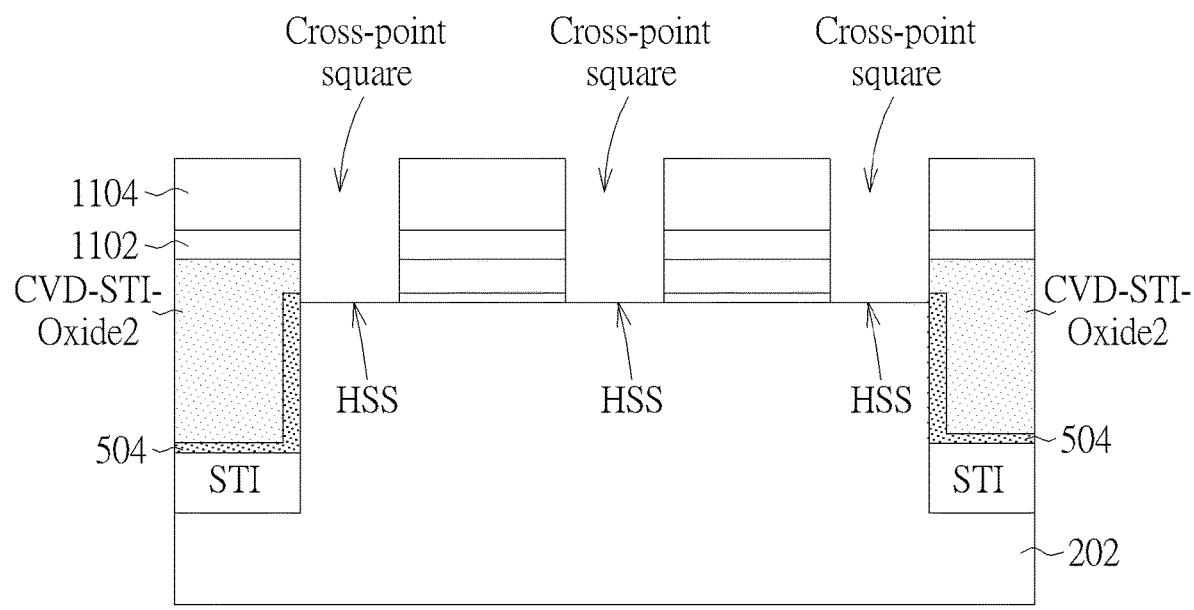

Step 130: The patterned photoresist layer 1106, the pad-nitride layer 206, and the pad-oxide layer 204 are removed, and the HSS could be revealed (FIG. 12).

Figure 13:
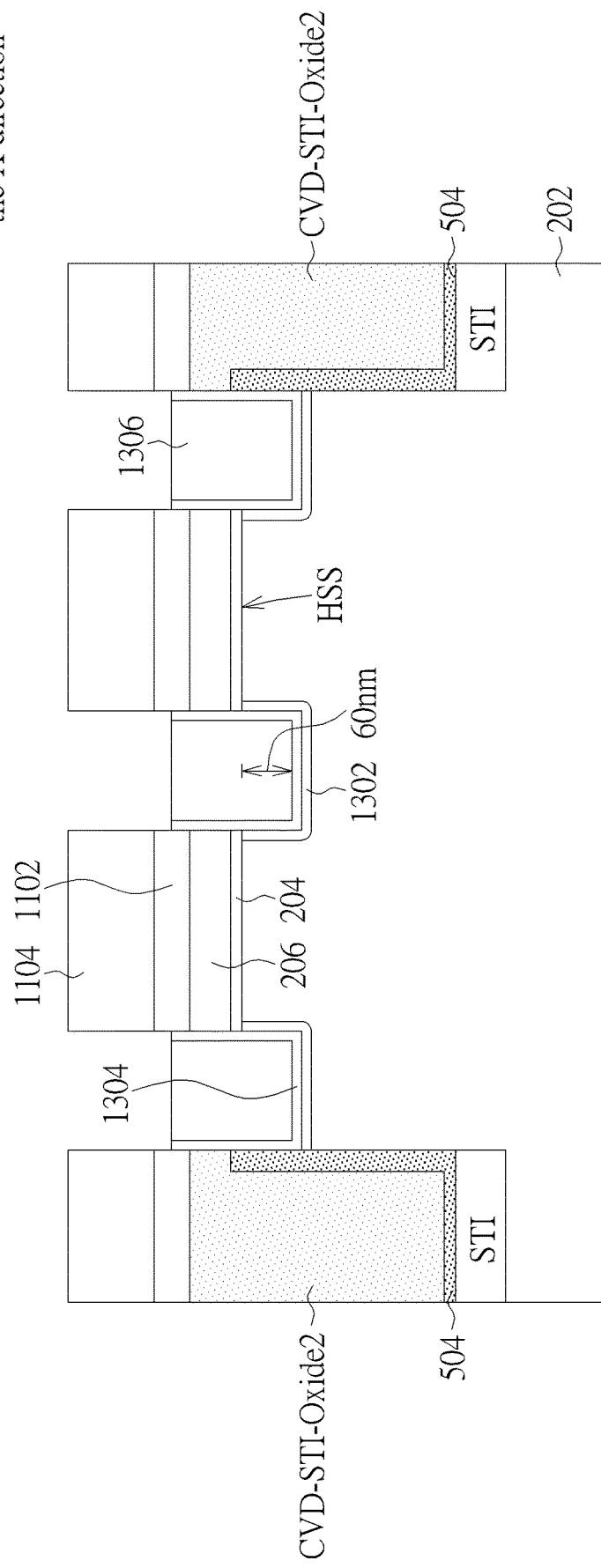
FIG. 13 is a diagram illustrating creating the U-shaped concave, the high-k insulator layer being formed as the gate dielectric layer of the access transistor, and the gate material being deposited and then etched back to form the word lines and the gate structures of the access transistors.

Step 132: The revealed HSS is etched to create a U-shaped concave, a high-k insulator layer 1304 is formed, and a gate material 1306 (such as Tungsten) is deposited and then etched back to form the word lines and the gate structures of the access transistors (FIG. 13). Such access transistor could be named as U-transistor.

Figure 14:
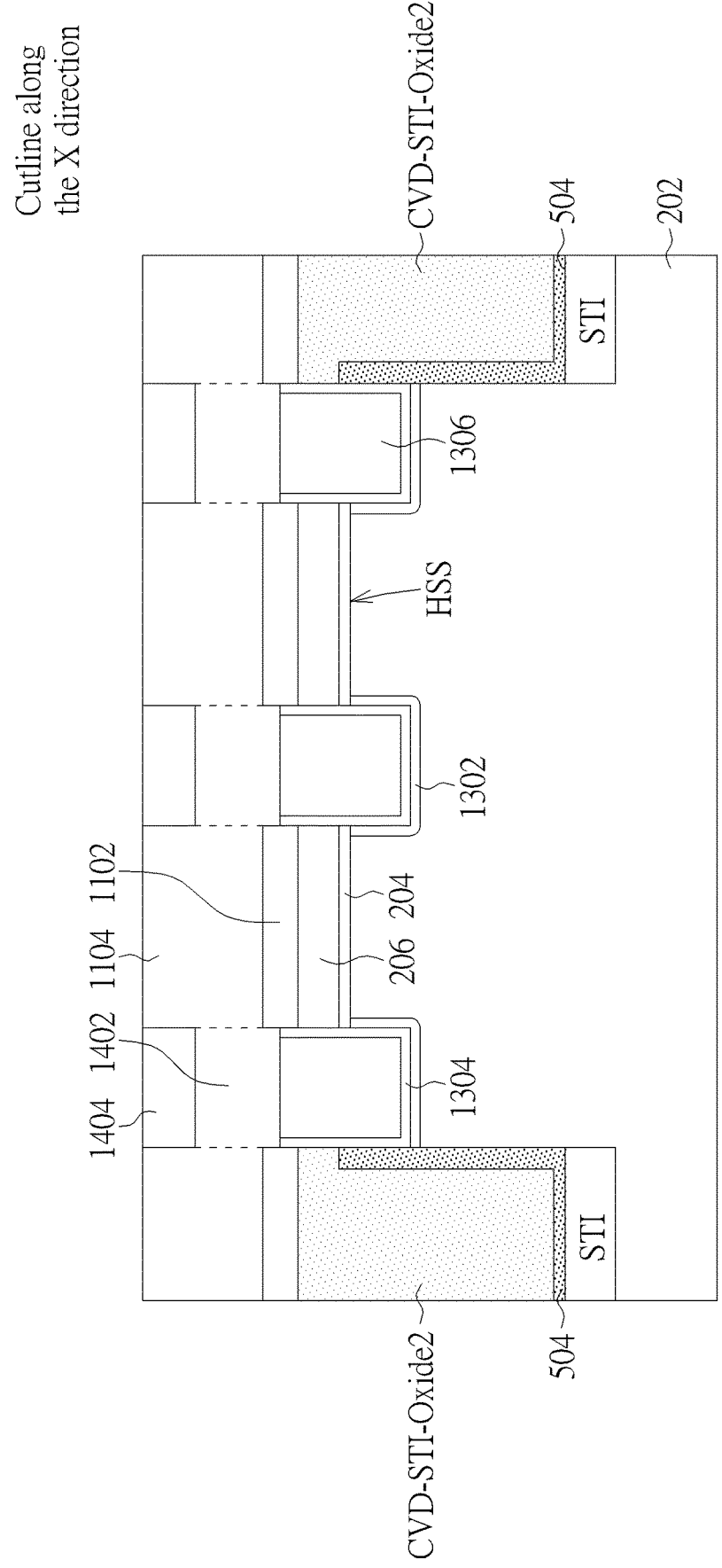
FIG. 14 is a diagram illustrating the nitride-3 layer and the oxide-4 layer being deposited and then polishing back the nitride-3 layer and the oxide-4 layer.

Step 134: Deposit and then etch back a nitride-3 layer 1402, subsequently deposit an oxide-4 layer 1404, and then etch back or planarize the oxide-4 layer 1404 (FIG. 14).

Figure 15:
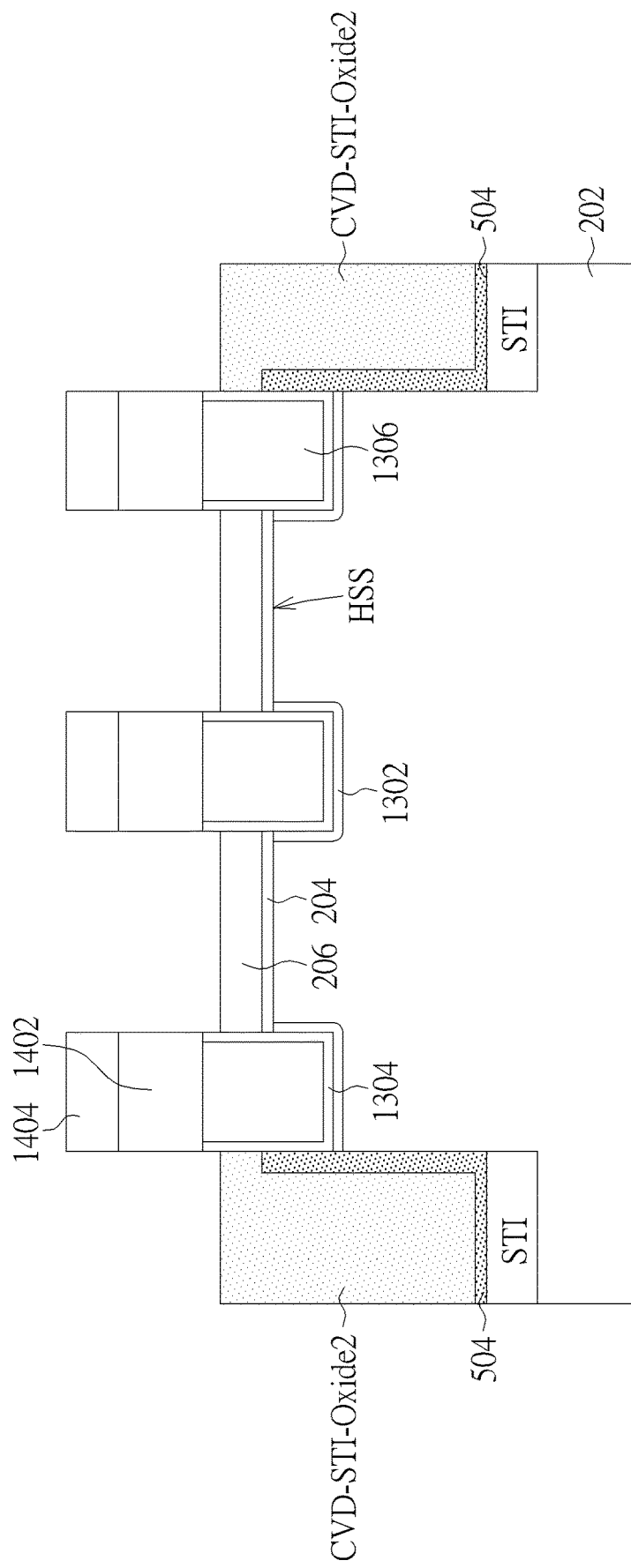
FIG. 15 is a diagram illustrating the nitride-2 layer and the oxide-3 layer being etched away.

Step 136: Etch away the nitride-2 layer 1104 and the oxide-3 layer 1102 (FIG. 15).

Please refer to FIG. 1F and FIGS. 16-22. Step 35 could include:

Step 138: Remove the pad-nitride layer 206, and etch back the CVD-STI-oxide2 to the top of the pad-oxide layer 204.

Figure 16:
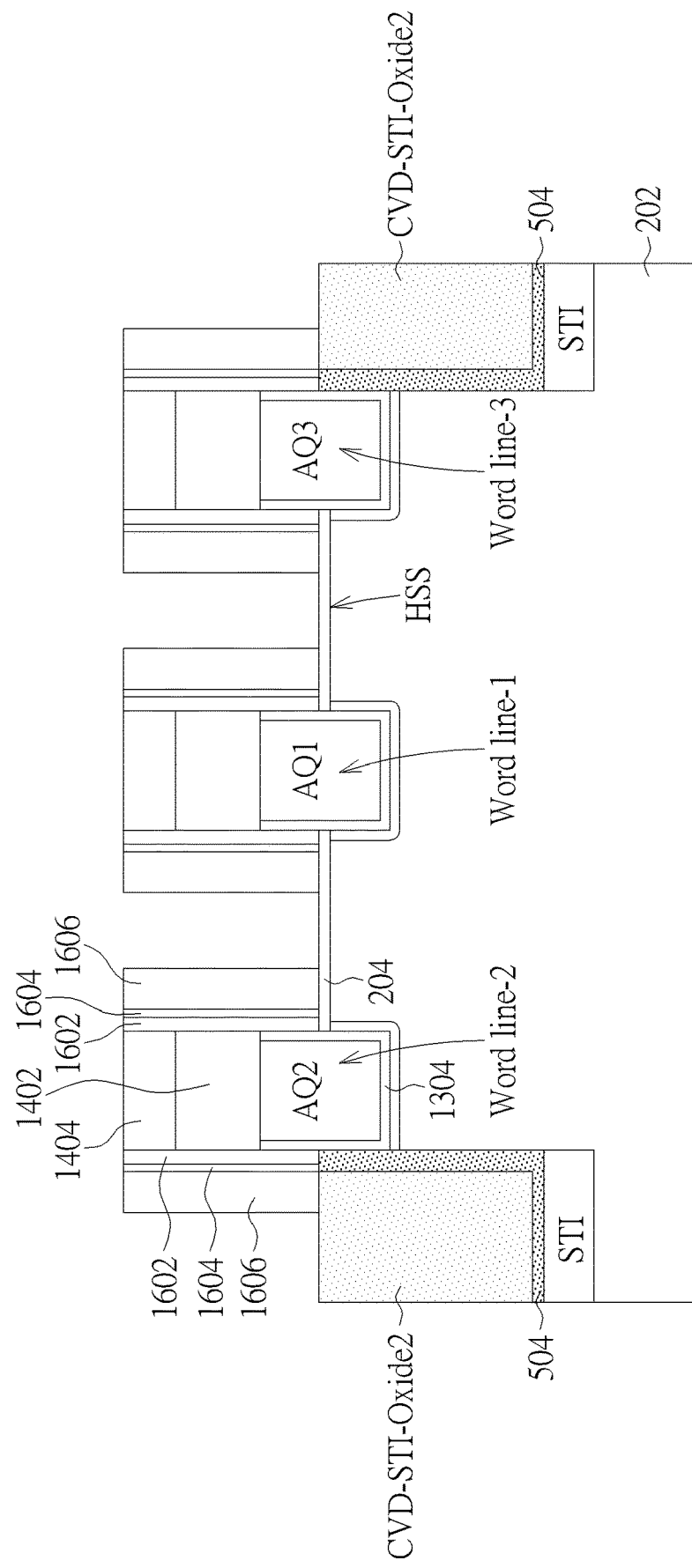
FIG. 16 is a diagram illustrating the pad-nitride layer 206 being removed, the CVD-STI-oxide2 being etched back, and the nitride-4 layer, the oxide-5 layer, the polysilicon-1 layer being deposited and etched.

Step 140: Deposit and anisotropic etch a nitride-4 layer 1602, an oxide-5 layer 1604, and a polysilicon-1 layer 1606, respectively (FIG. 16).

Figure 17:
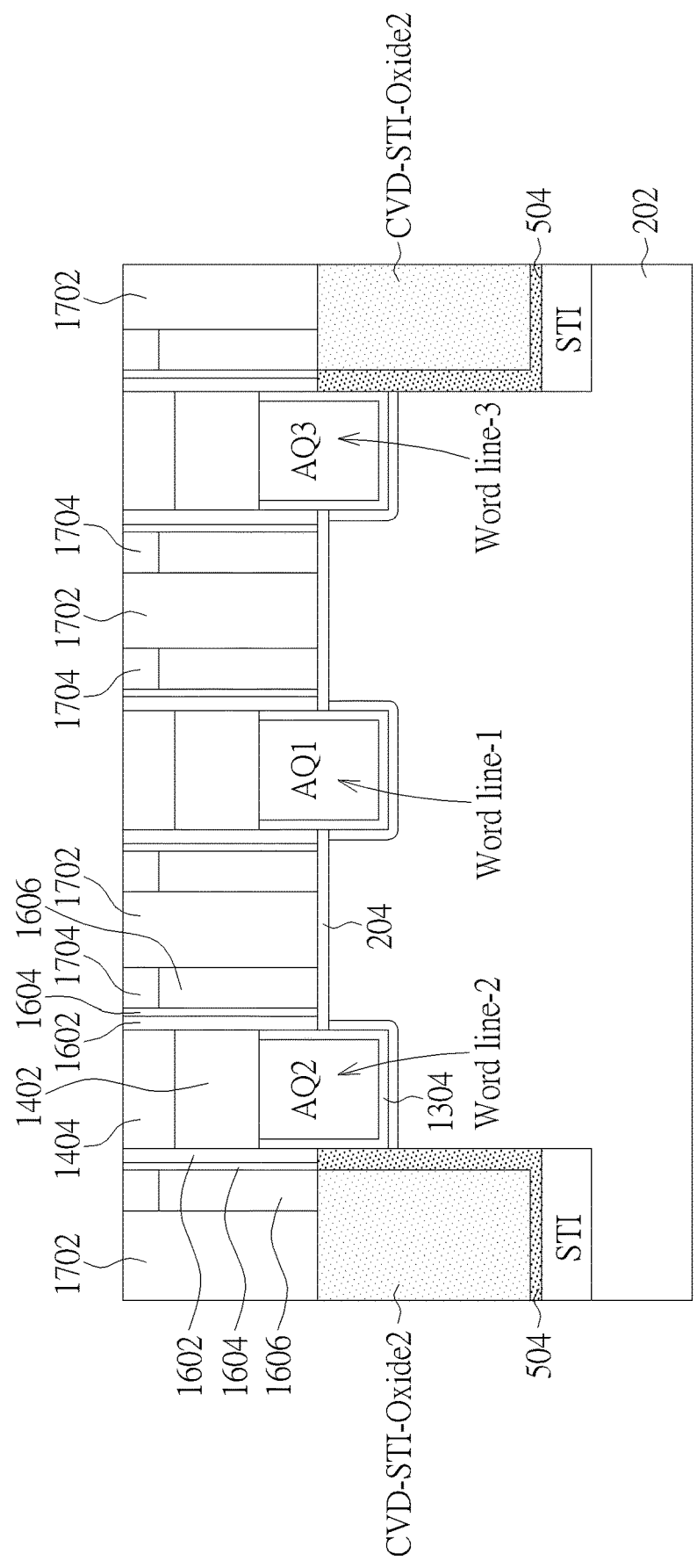
FIG. 17 is a diagram illustrating the SOD being deposited and polished, some upper part of the polysilicon-1 layer being etched, and the cap-oxide-1 layer being deposited and planarized.

Step 142: Deposit and then CMP a spin-on dielectrics (SOD) 1702, etch upper part of the polysilicon-1 layer 1606, and deposit and then CMP a cap-oxide-1 layer 1704 (FIG. 17).

Figure 18:
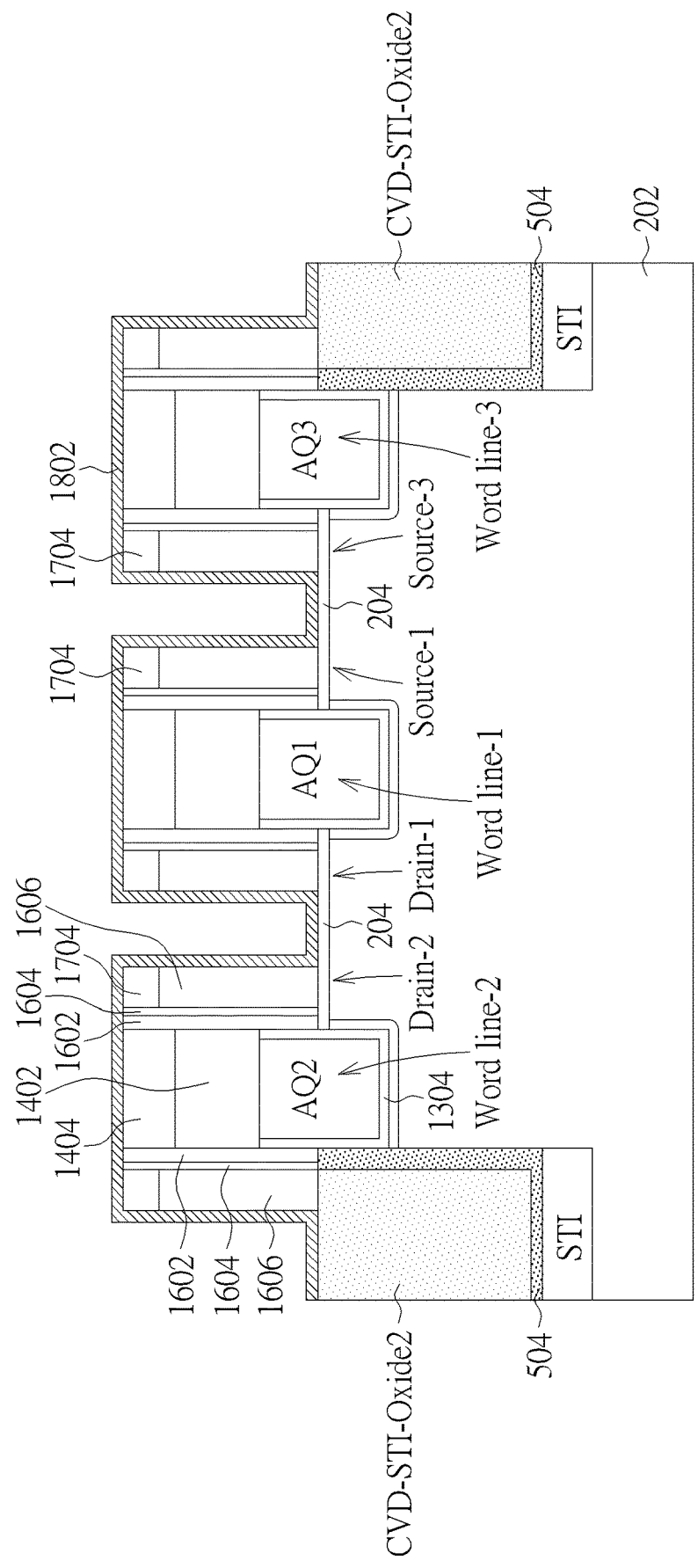
FIG. 18 is a diagram illustrating the SOD being etched away and the nitride-5 layer 1802 being deposited.

Step 144: Remove the SOD 1702, and then deposit a nitride-5 layer 1802 (FIG. 18).

Figure 19:
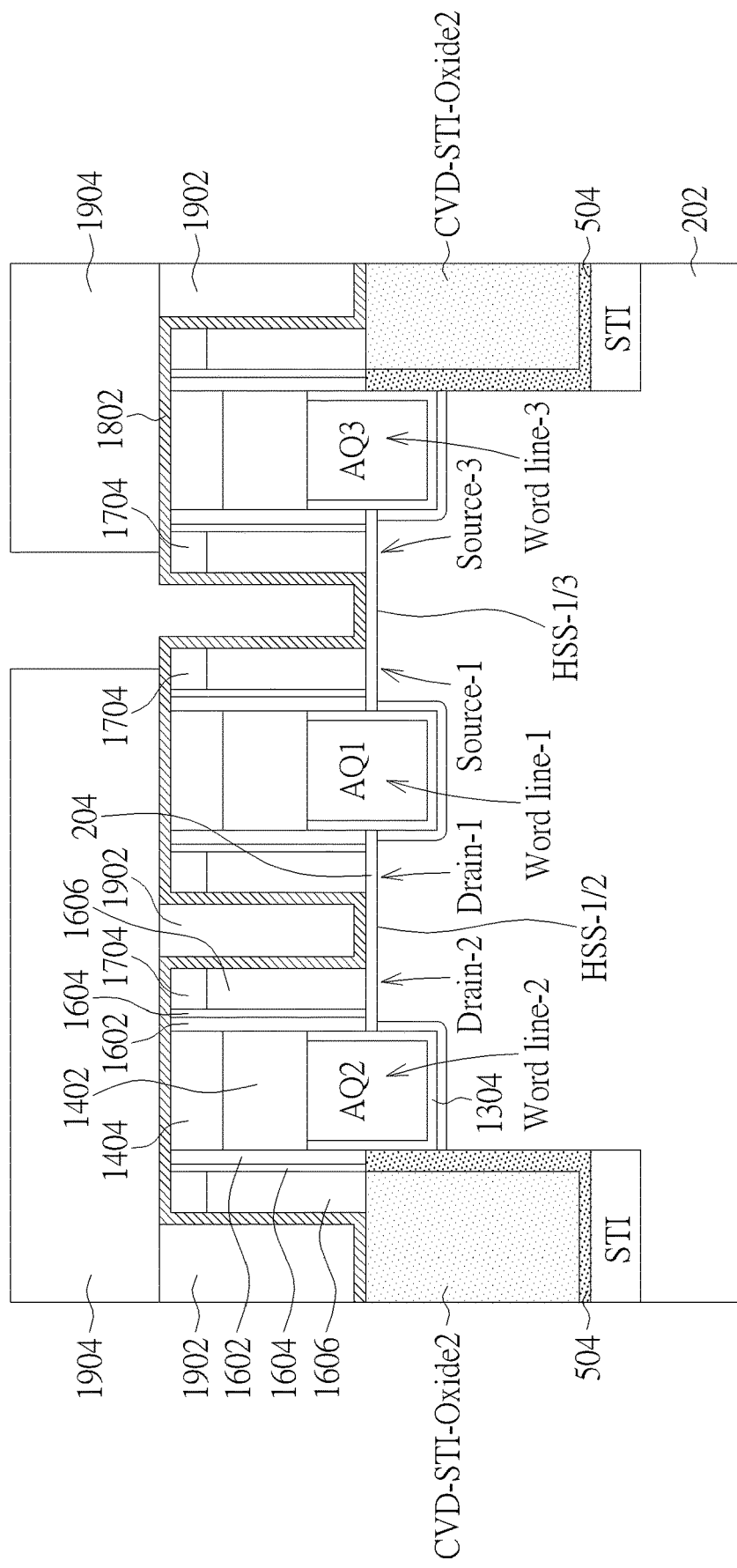
FIG. 19 is a diagram illustrating the SOD being deposited, the photoresist being deposited, and the SOD corresponding to the areas reserved for the source region being removed.

Step 146: Deposit and then CMP a SOD 1902, deposit a photoresist 1904, and then etch back unwanted SOD 1902 (FIG. 19).

Figure 20:
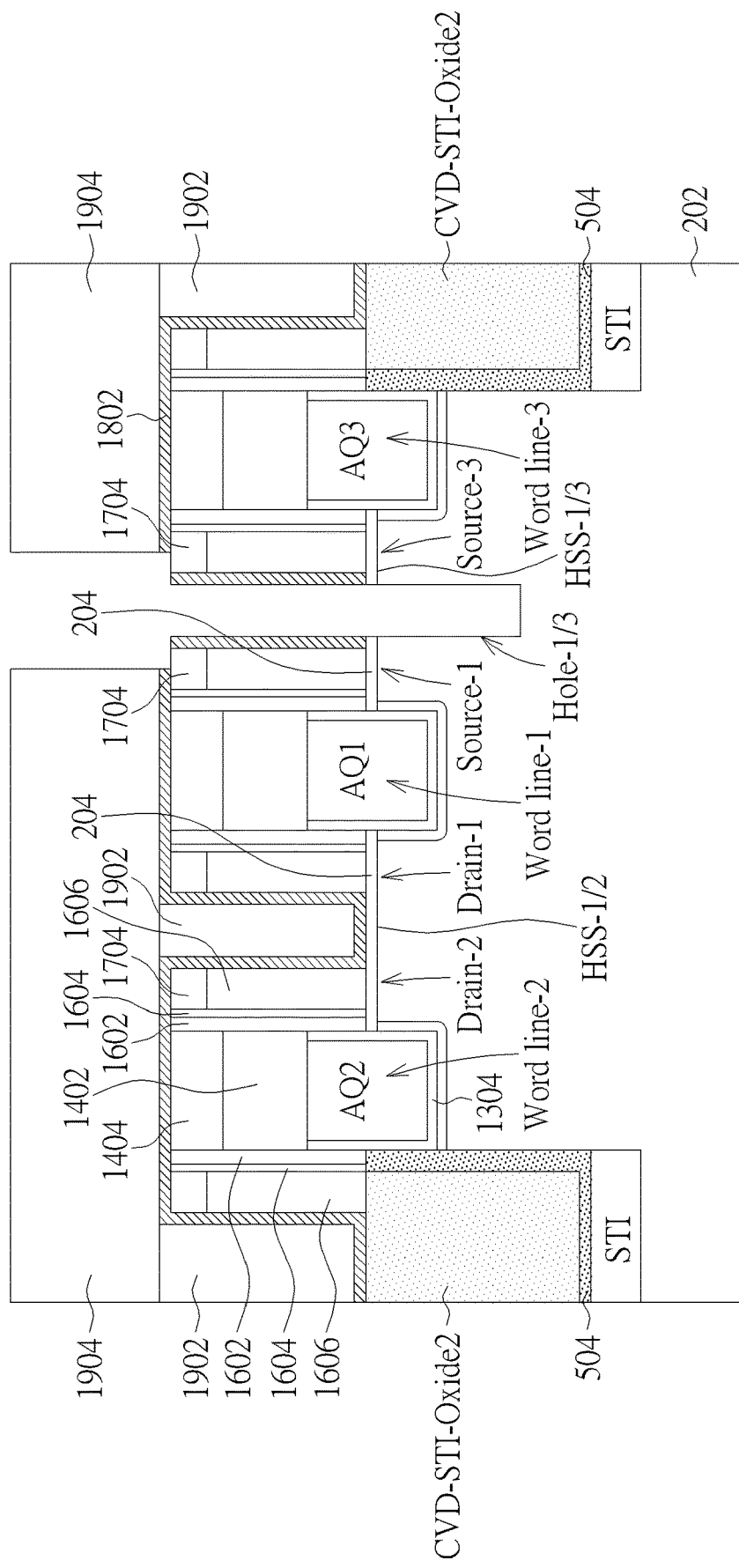
FIG. 20 is a diagram illustrating the exposed nitride-5 layer and the pad-oxide layer at a center of the source region being etched away and the silicon material corresponding to the center of the source region being dug to generate the hole-1/3.

Step 148: Etch away the exposed nitride-5 layer 1802, the pad-oxide layer 204, and silicon material corresponding to the HSS-1/3 to generate a hole-1/3 (FIG. 20).

Figure 21:
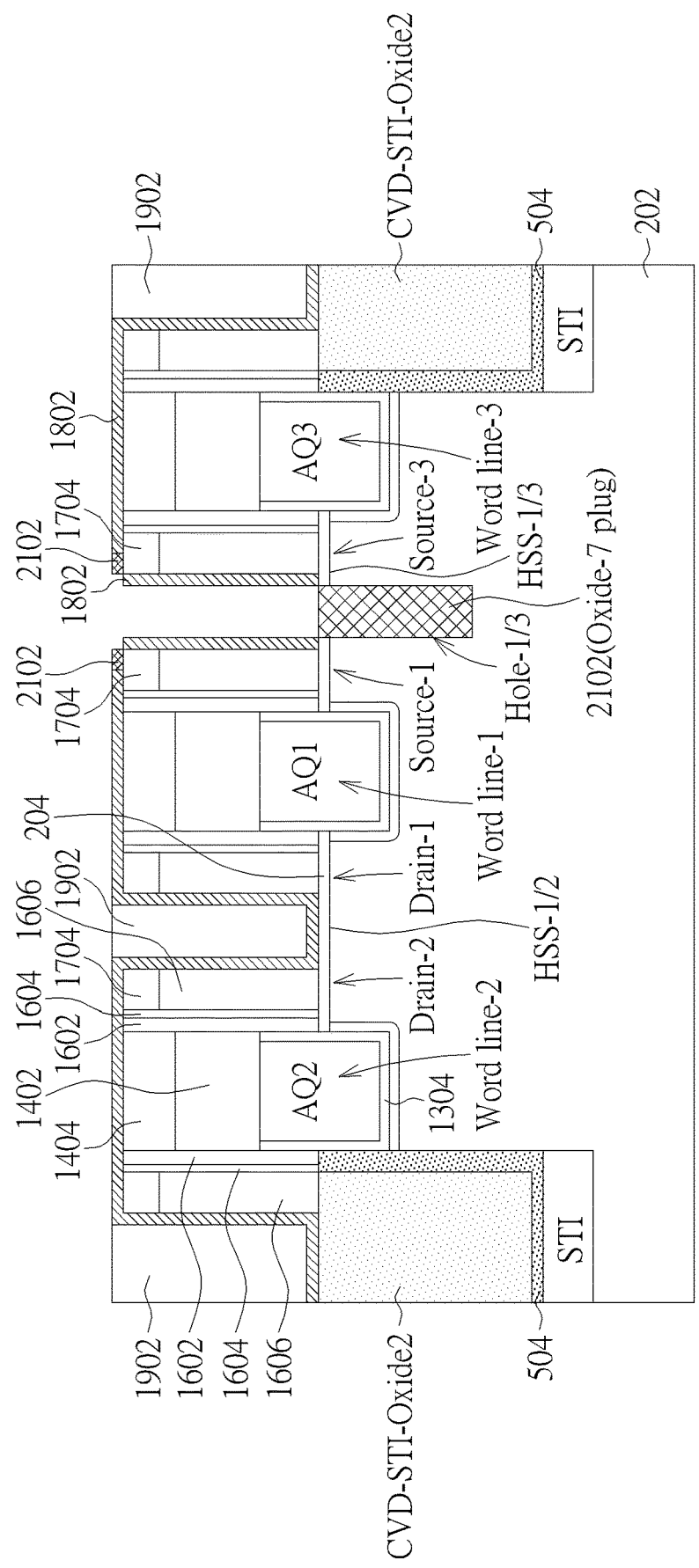
FIG. 21 is a diagram illustrating the oxide-7 layer being grown thermally in the hole-1/3.

Step 150: Remove the photoresist 1904 and thermally grow an oxide-7 layer 2102 (FIG. 21).

Figure 22:
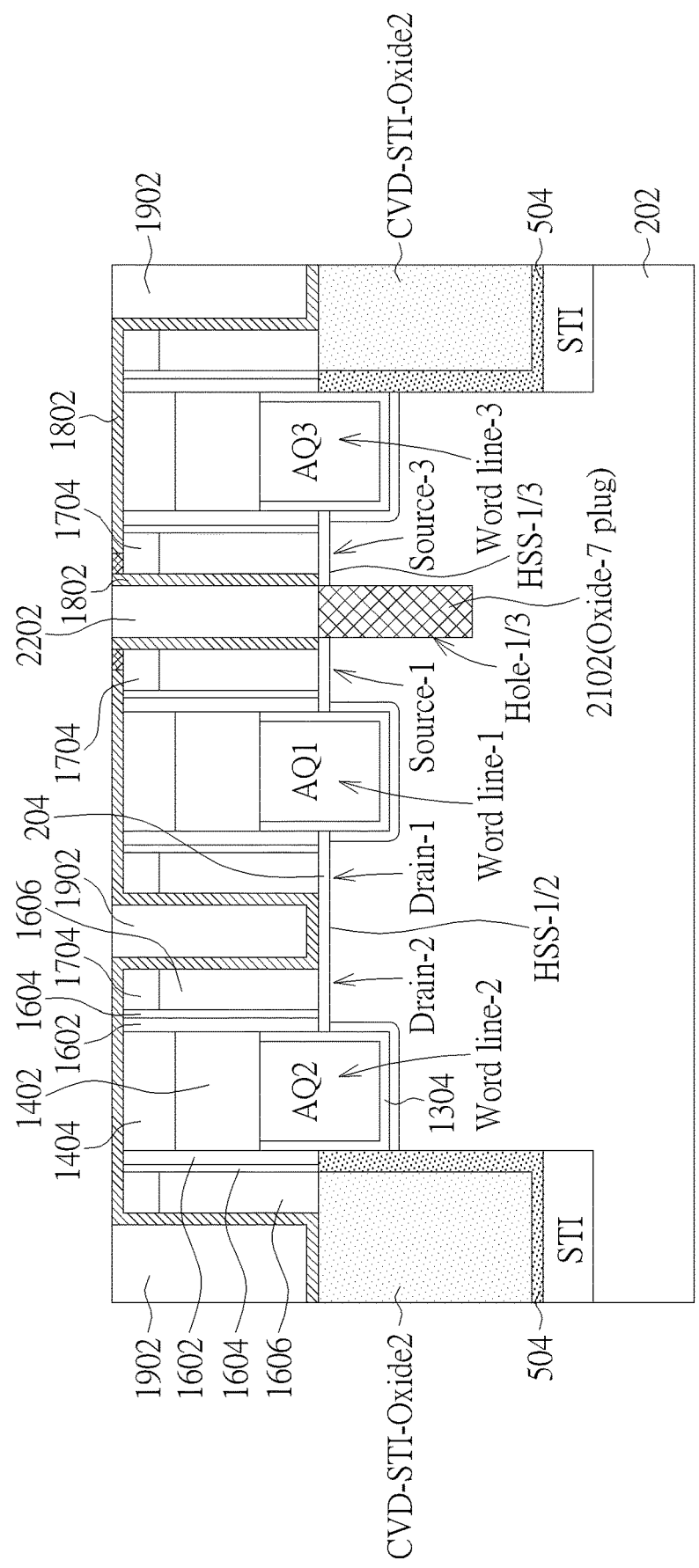
FIG. 22 is a diagram illustrating the another SOD layer being deposited and etched back.

Step 152: Deposit another SOD layer 2202 on the oxide-7 layer 2102 and then etch back the another SOD layer 2202 (FIG. 22).

Figure 23:
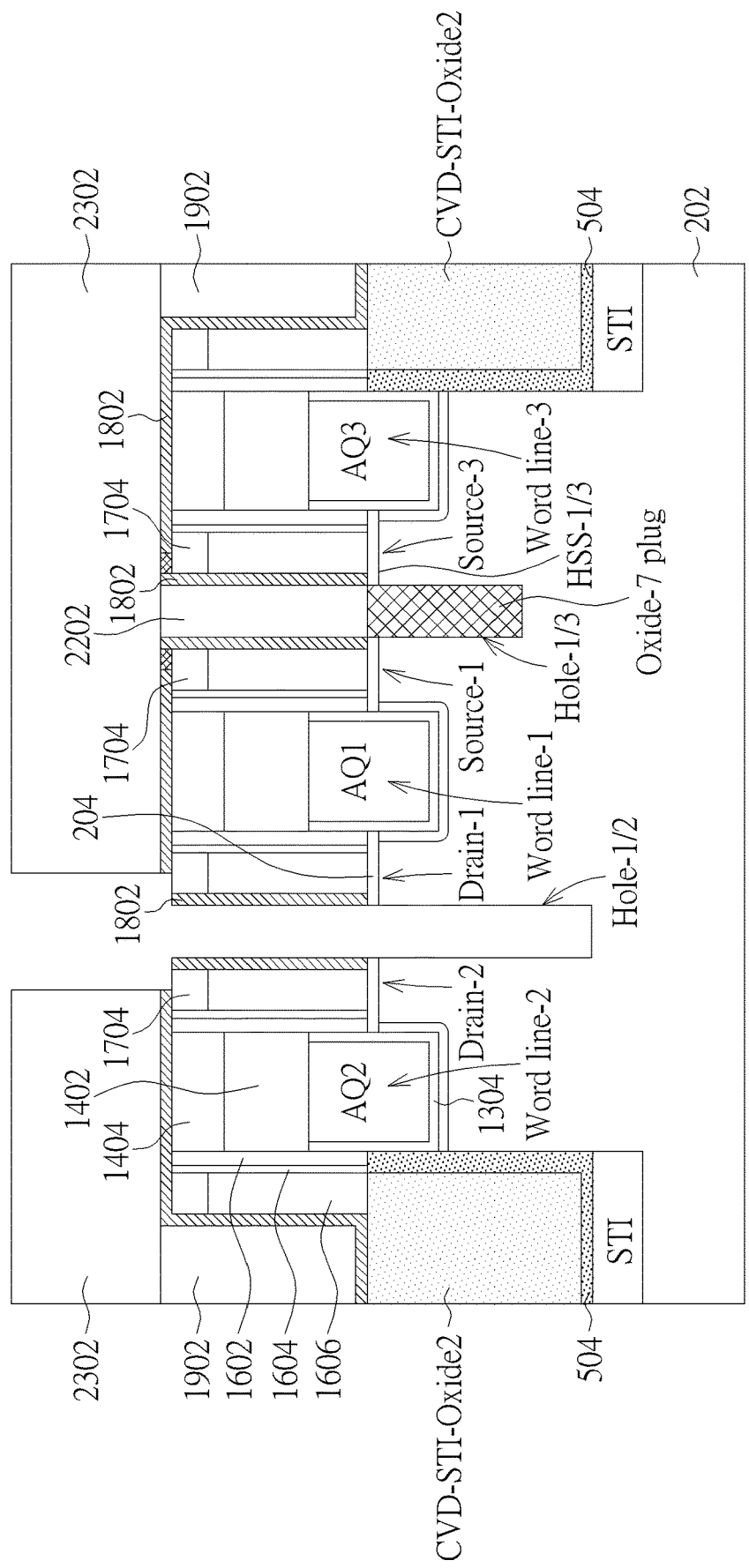
FIG. 23 is a diagram illustrating the photoresist being deposited to cover the area corresponding to the source region and to expose the area reserved for the drain region, the exposed SOD, the exposed nitride-5 layer, the exposed pad-oxide layer underneath, and silicon material being removed to generate the hole-1/2.

Please refer to FIG. 1G and FIGS. 23-33. Step 40 could include:

Step 154: Deposit photoresist 2302, remove the exposed SOD 1902, the exposed nitride-5 layer 1802, and the exposed pad-oxide layer 204; and then dig and remove the silicon material corresponding to the HSS-1/2 to generate a hole-1/2 (FIG. 23).

Figure 24:
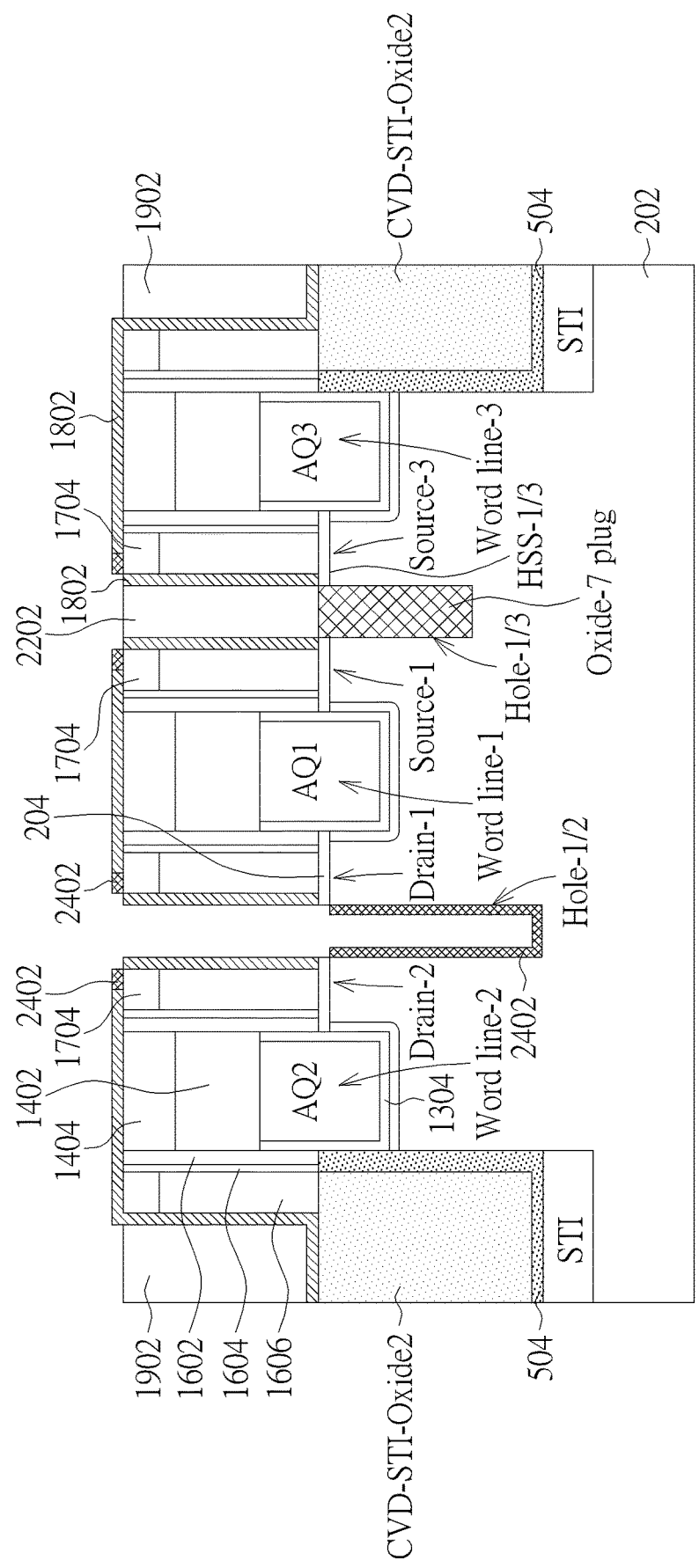
FIG. 24 is a diagram illustrating the photoresist being removed and the oxide-8 layer being thermally grown to generate the oxide-8 spacer.
Figure 25:
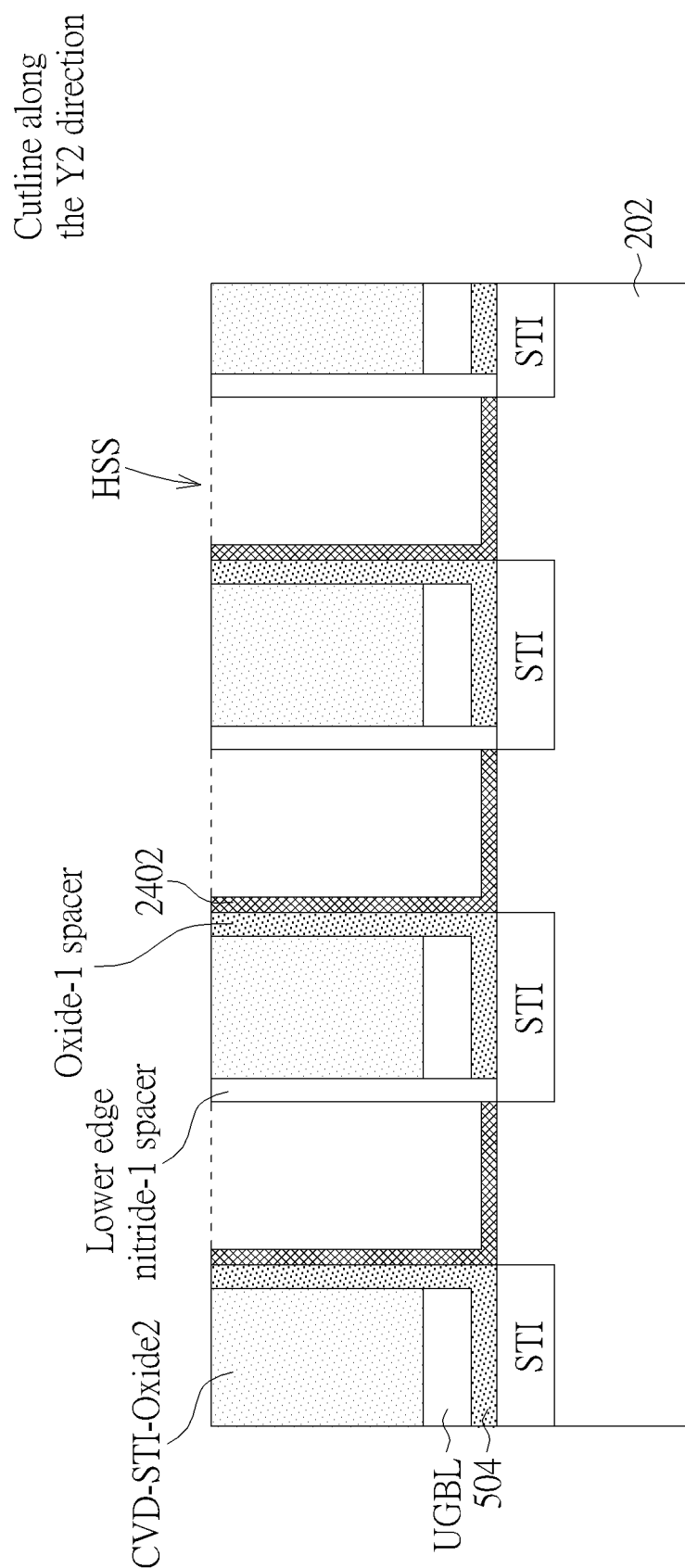
FIG. 25 is a diagram illustrating a cross-section view of the DRAM cell array along a Y2 direction showing the cross section of the hole-1/2.

Step 156: Remove the photoresist 2302 and grow an oxide-8 layer 2402 thermally (FIG. 24 & FIG. 25).

Figure 26:
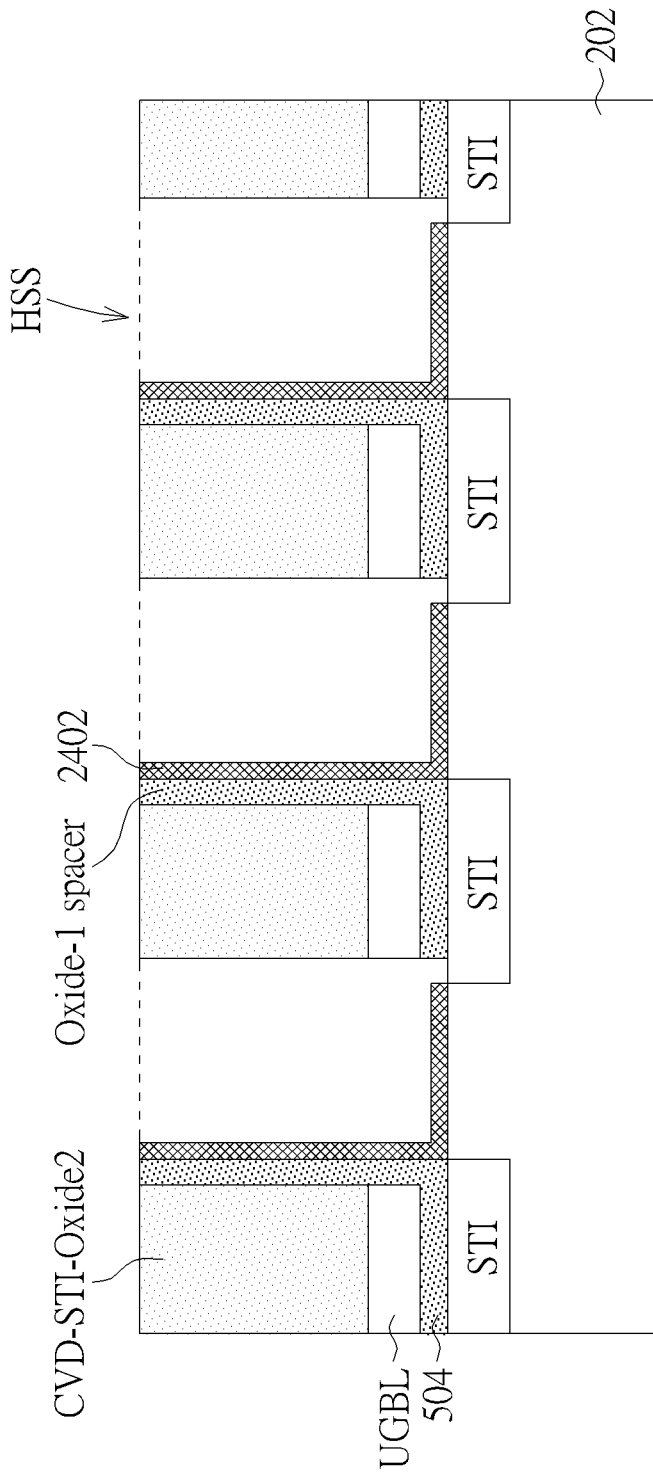
FIG. 26 is a diagram illustrating the lower edge nitride-1 spacer inside the hole-1/2 being etched.
Figure 27:
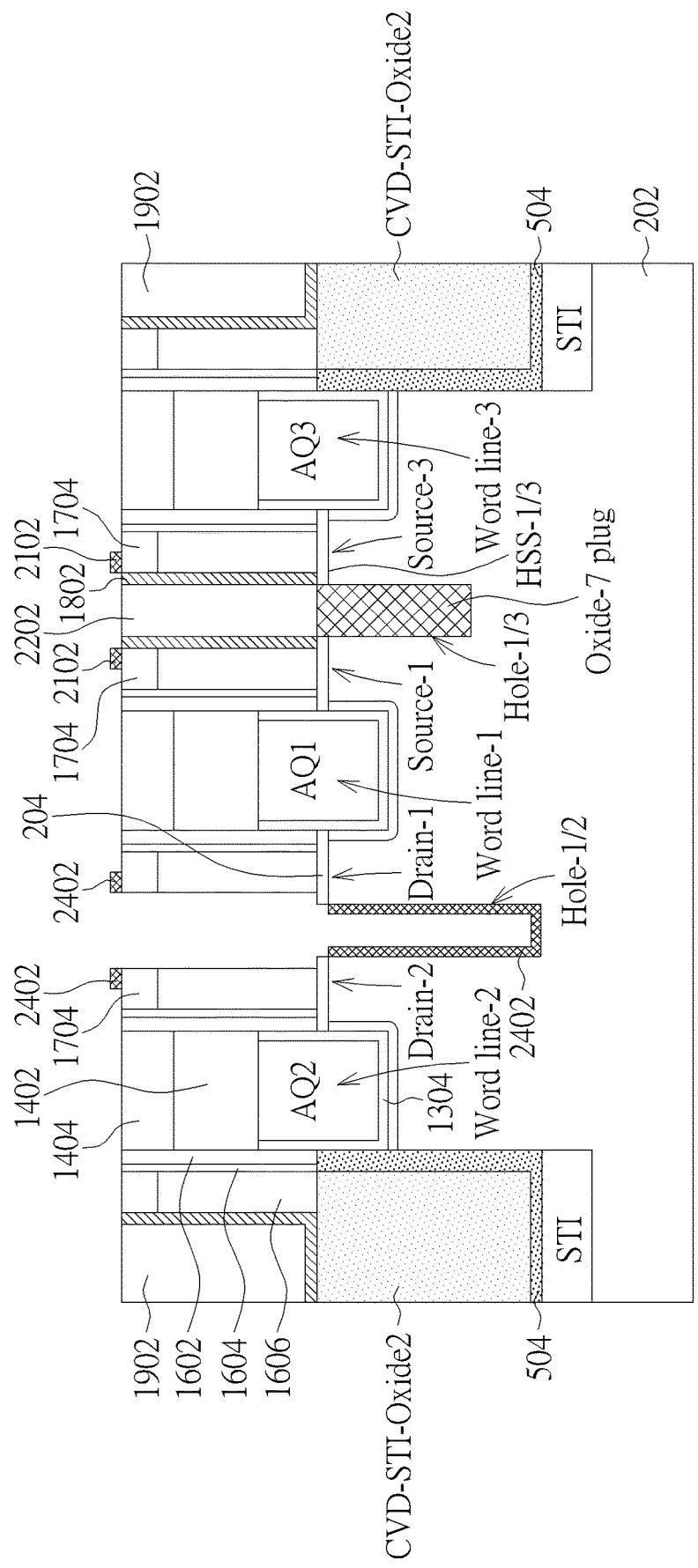
FIG. 27 is a diagram illustrating the nitride-5 layer being removed.

Step 158: Remove the lower edge nitride-1 spacer to reveal sidewall of the underground bit line and remove the nitride-5 layer 1802 (FIG. 26 & FIG. 27).

Figure 28:
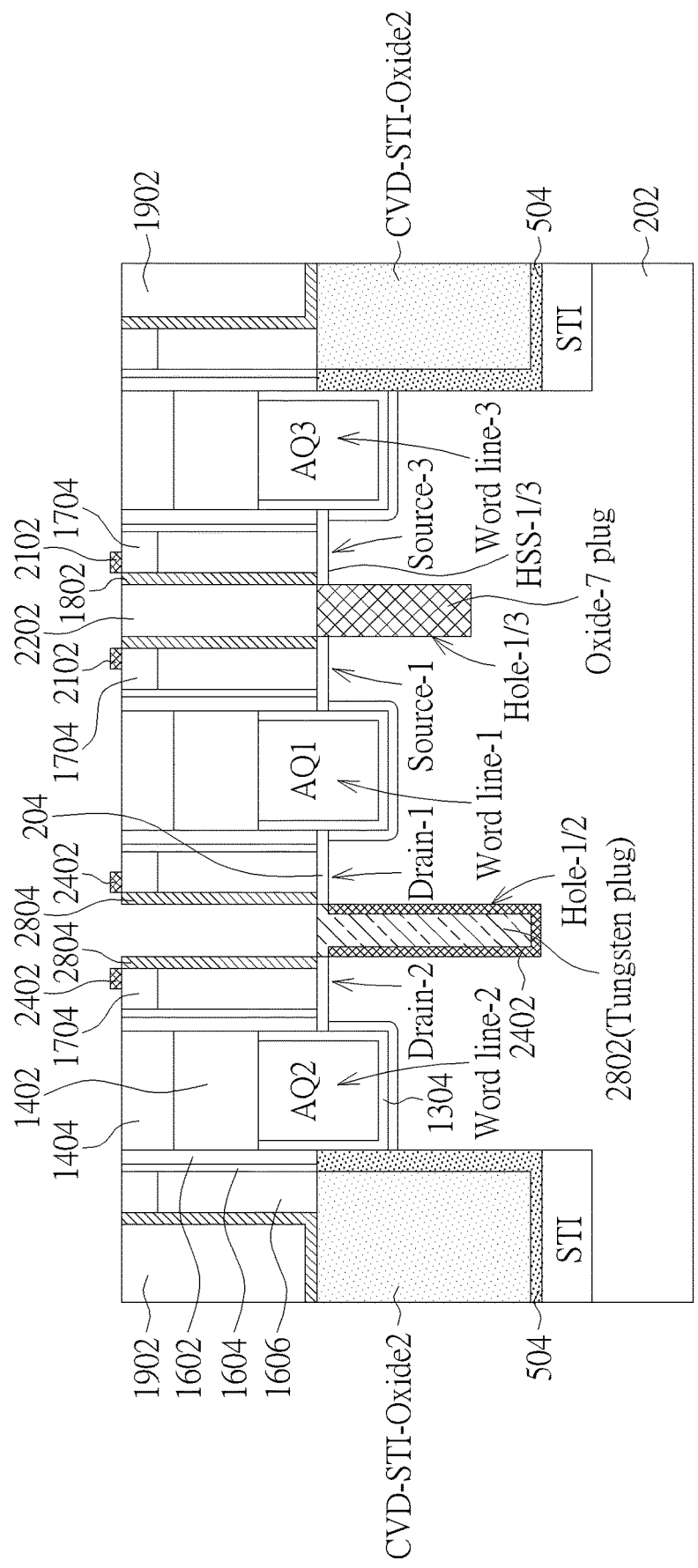
FIG. 28 is a diagram illustrating the metal layer being deposited and etched back to leave Tungsten plug inside the hole-1/2, and the nitride-6 layer being deposited and etched.

Step 160: Deposit a metal layer 2802 in the hole-1/2 to contact the sidewall of the UGBL, and then deposit and etch back a nitride-6 layer 2804 to create a nitride-6 spacer (FIG. 28).

Figure 29:
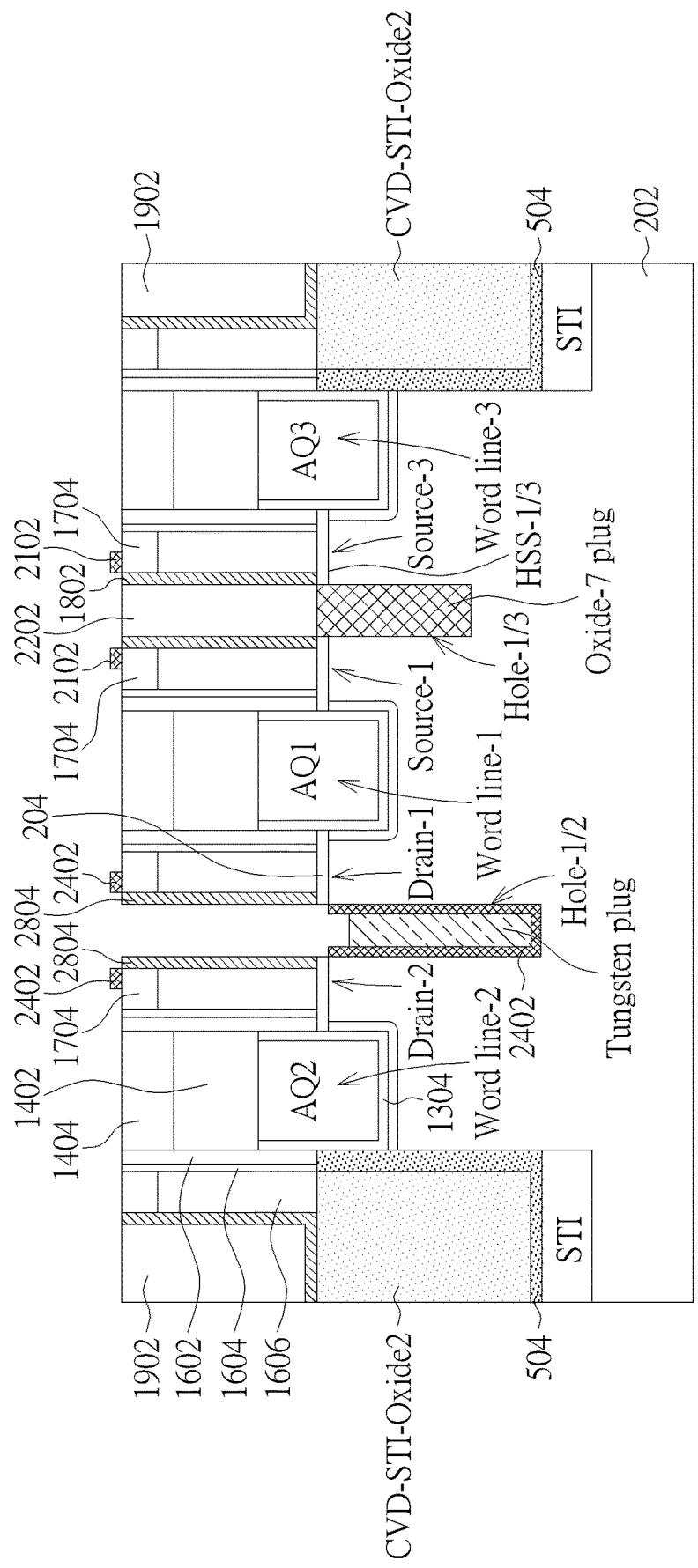
FIG. 29 is a diagram illustrating some upper portion of the Tungsten plug below the HSS being etched back.
Figure 30:
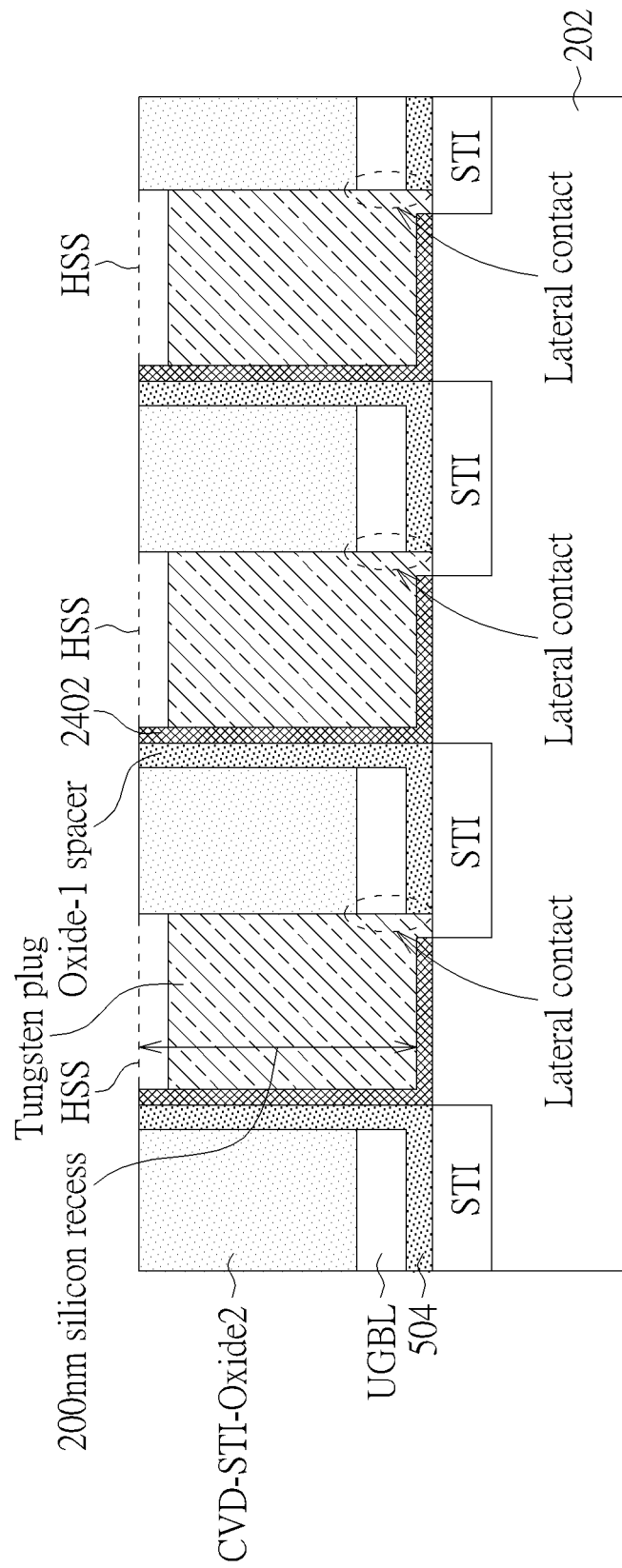
FIG. 30 is a diagram illustrating the Tungsten plug being connected to the UGBL.

Step 162: Etch back an upper portion of the metal layer 2802 (FIG. 29 & FIG. 30).

Figure 31:
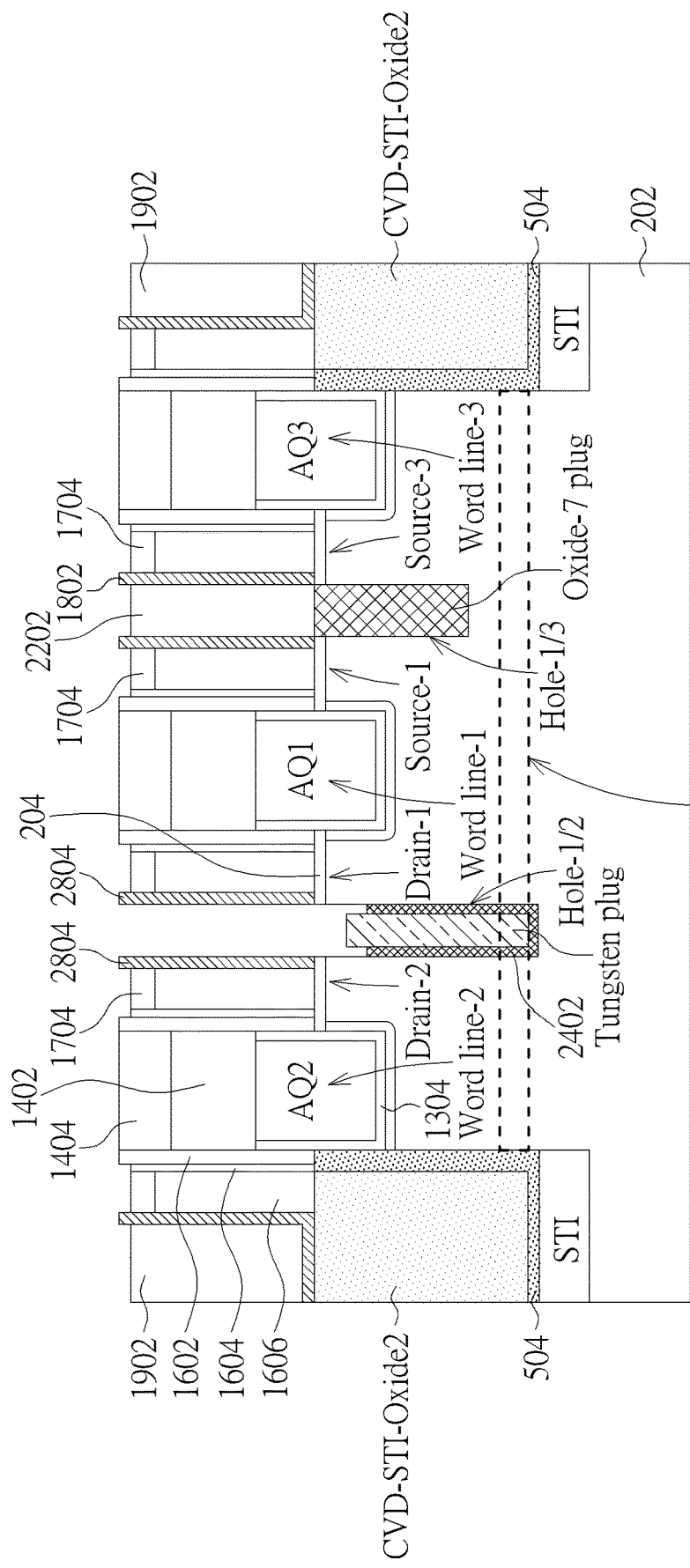
FIG. 31 is a diagram illustrating the upper portion of the oxide-8 layer being removed.

Step 164: Etch back an upper portion of the oxide-8 layer 2402 to reveal silicon material corresponding to the hole-1/2 (FIG. 31).

Figure 32:
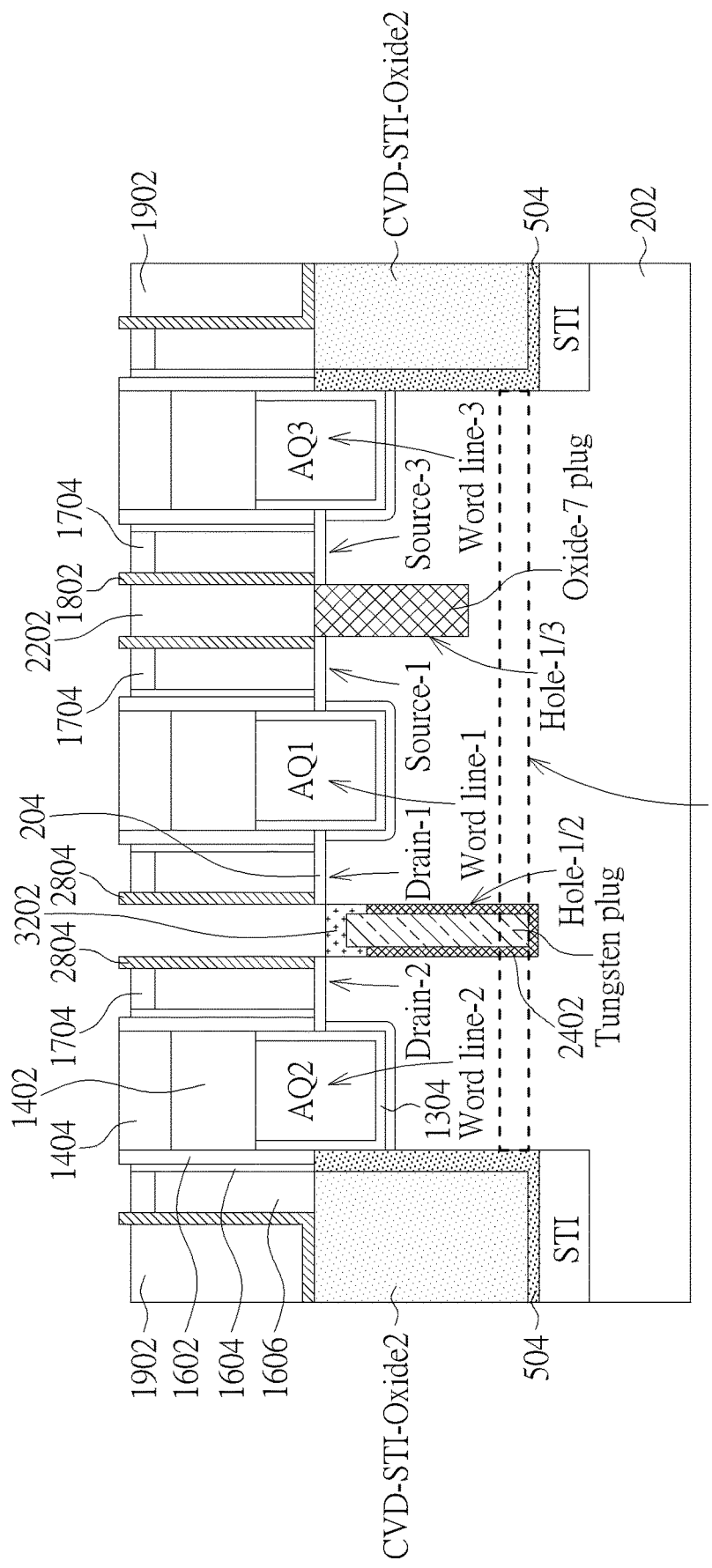
FIG. 32 is a diagram illustrating the n+ in-situ doped silicon layer being grown laterally to form the n+ silicon drain-collar.

Step 166: Grow laterally an n+ in-situ doped silicon layer 3202 based on the revealed silicon material to contact the drain region and the Tungsten plug (FIG. 32).

Figure 33:
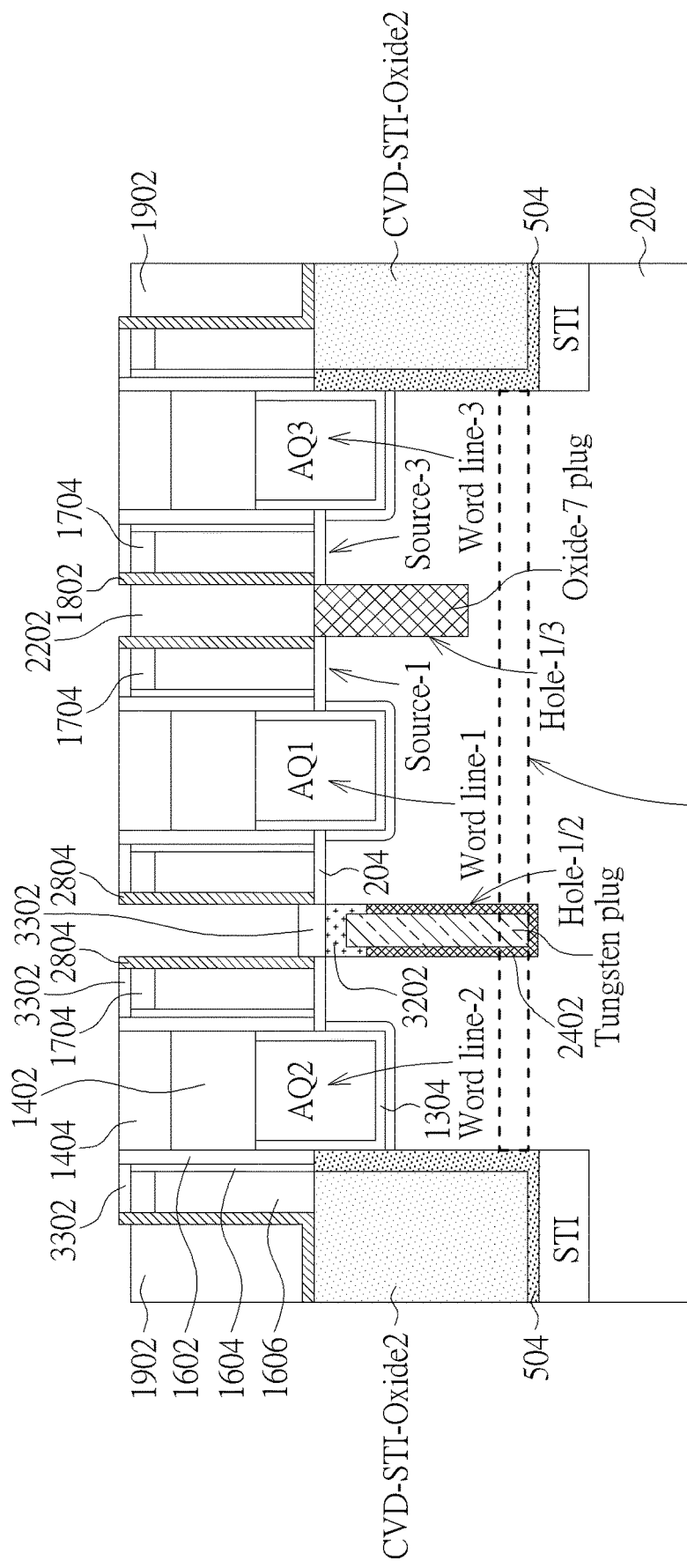
FIG. 33 is a diagram illustrating the oxide-9 layer being thermally grown locally over the n+ silicon drain-collar.

Step 168: Grow thermally an oxide-9 layer 3302 above the n+ in-situ doped silicon layer 3202 (FIG. 33).

Figure 34:
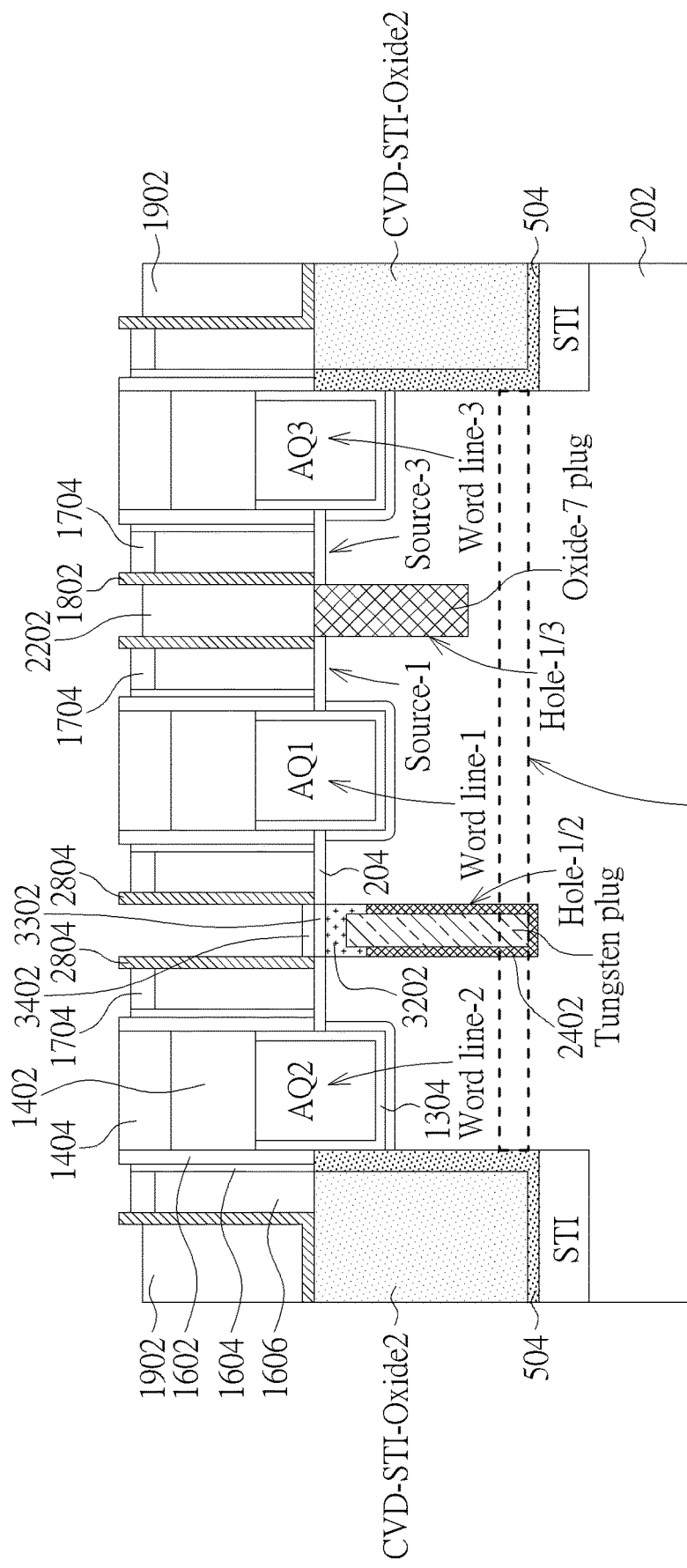
FIG. 34 is a diagram illustrating the oxide-9 layer being etched back, and the polysilicon-a layer being deposited and etched back.

Please refer to FIG. 1H and FIGS. 34-42. Step 45 could include:

Step 170: Etch back the oxide-9 layer 3302, and deposit and etch back a polysilicon-a layer 3402 (FIG. 34).

Figure 35:
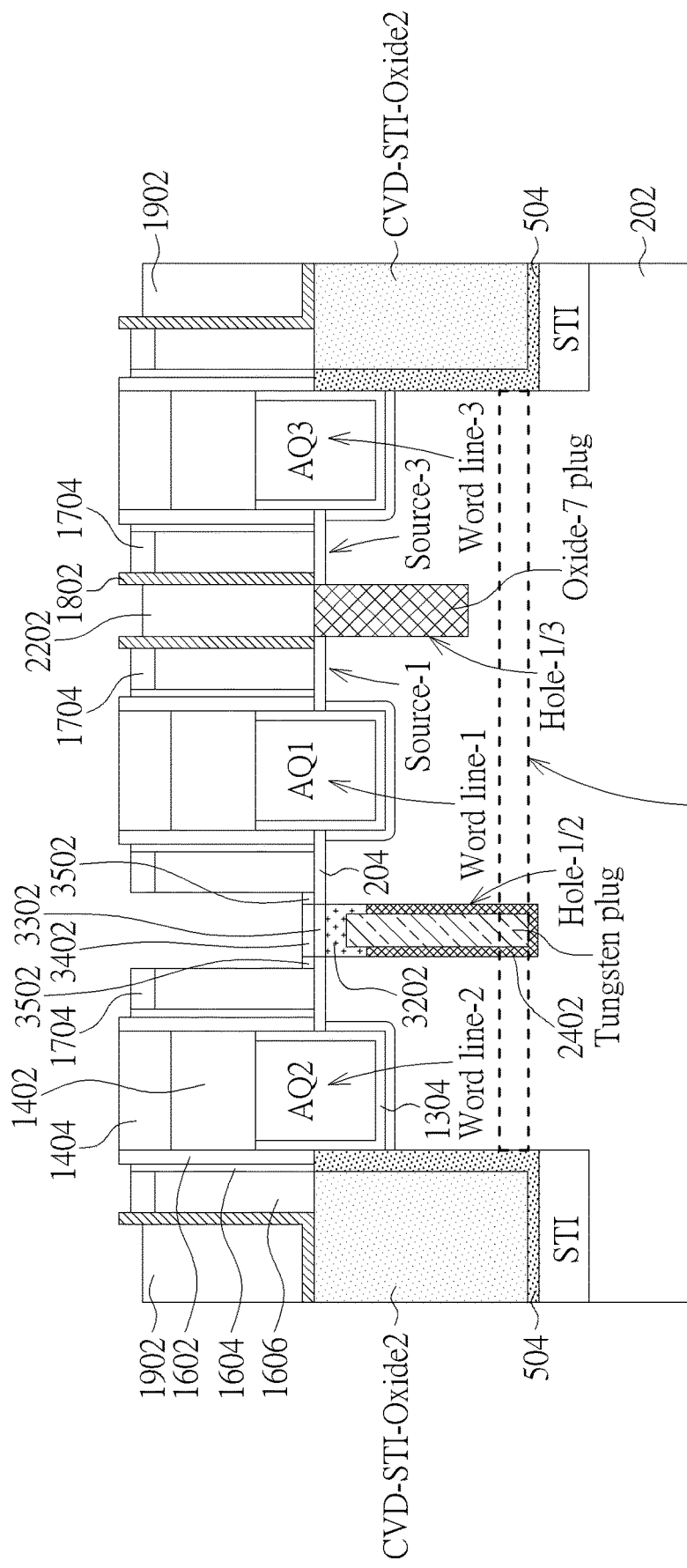
FIG. 35 is a diagram illustrating the nitride-6 spacer being removed, and the polysilicon-b layer being deposited and etched back.

Step 171: Remove the nitride-6 spacer, and deposit and etch back a polysilicon-b layer 3502 (FIG. 35).

Figure 36:
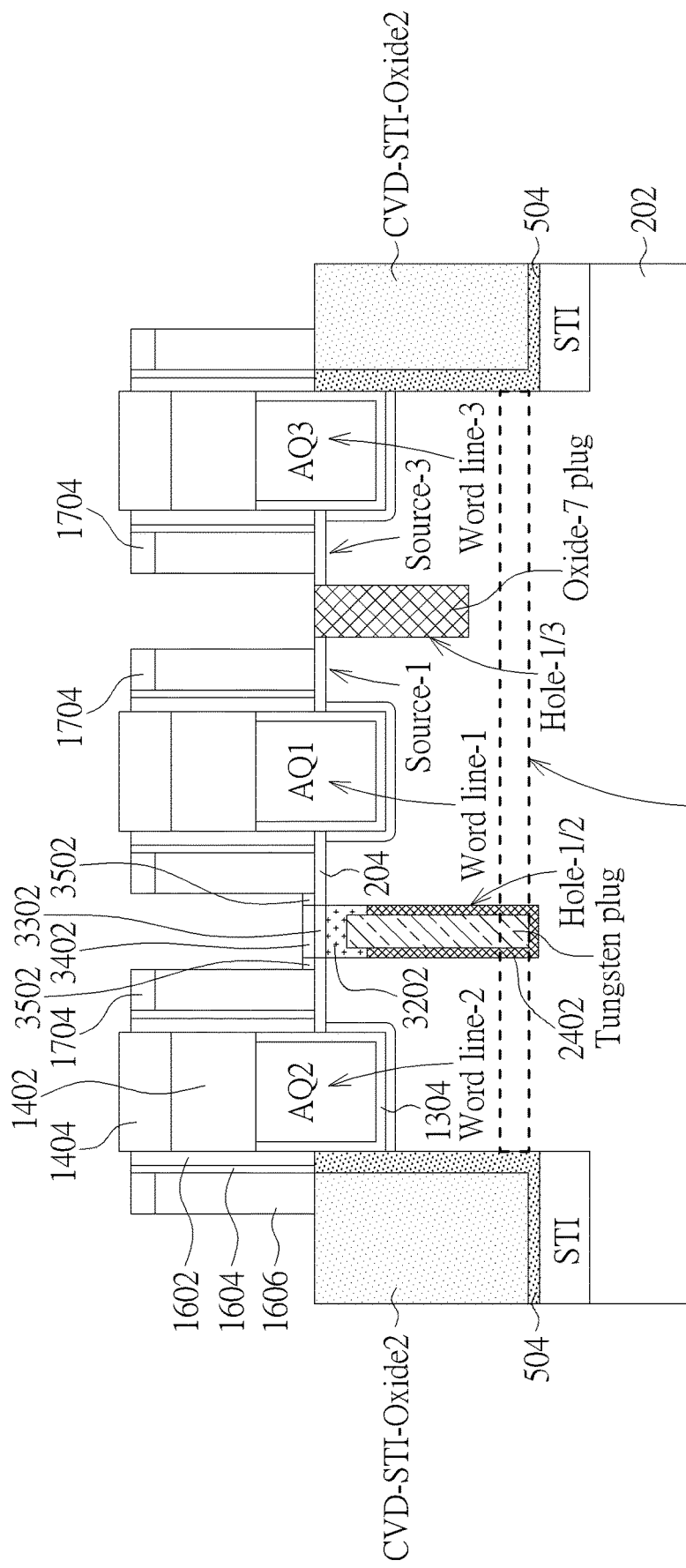
FIG. 36 is a diagram illustrating the all the SODs and the nitride-5 layer being removed.

Step 172: Remove all the SODs and the nitride-5 layer 1802 (FIG. 36).

Figure 38:
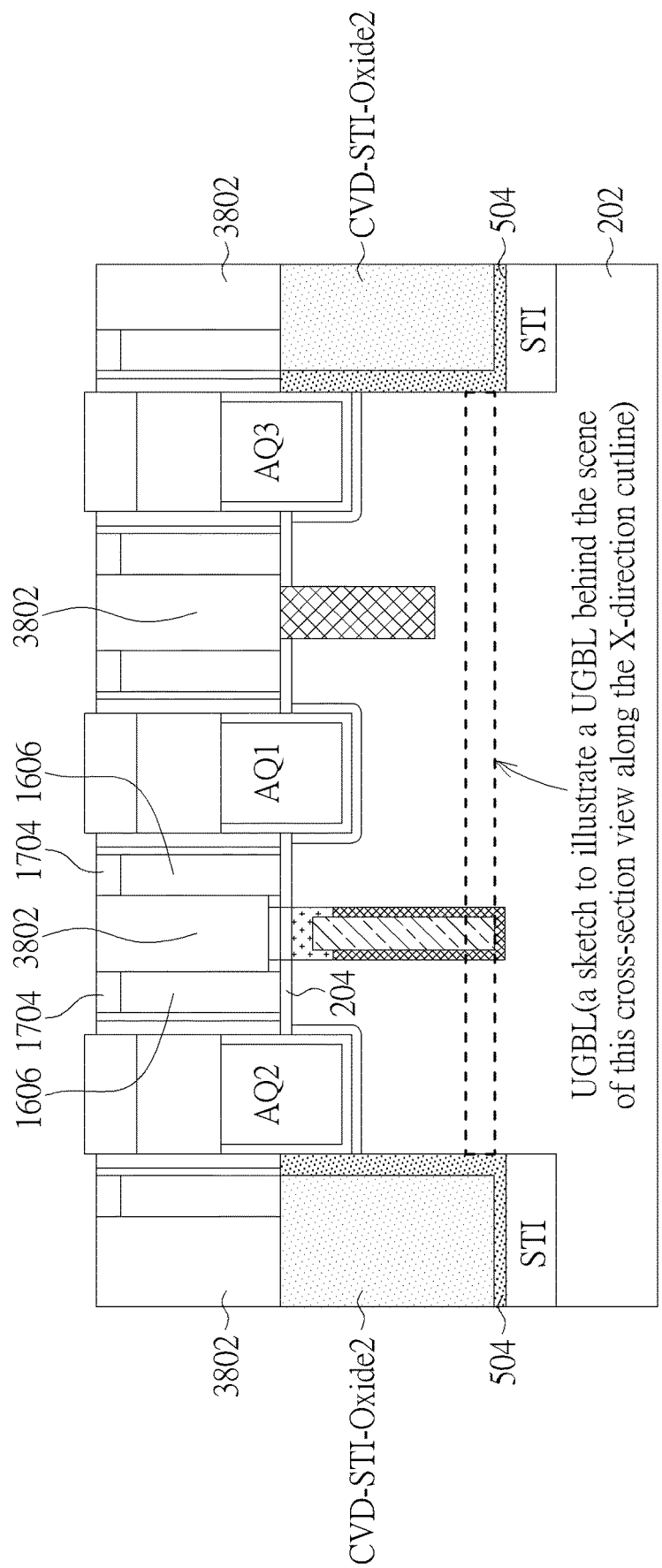
FIG. 38 is a diagram illustrating the metal layer being deposited and some portion of the metal layer being etched back to form W-Buffer-Walls.

Step 173: Deposit and etch back a metal layer (e.g. Tungsten) 3802 (FIG. 38).

Figure 39:
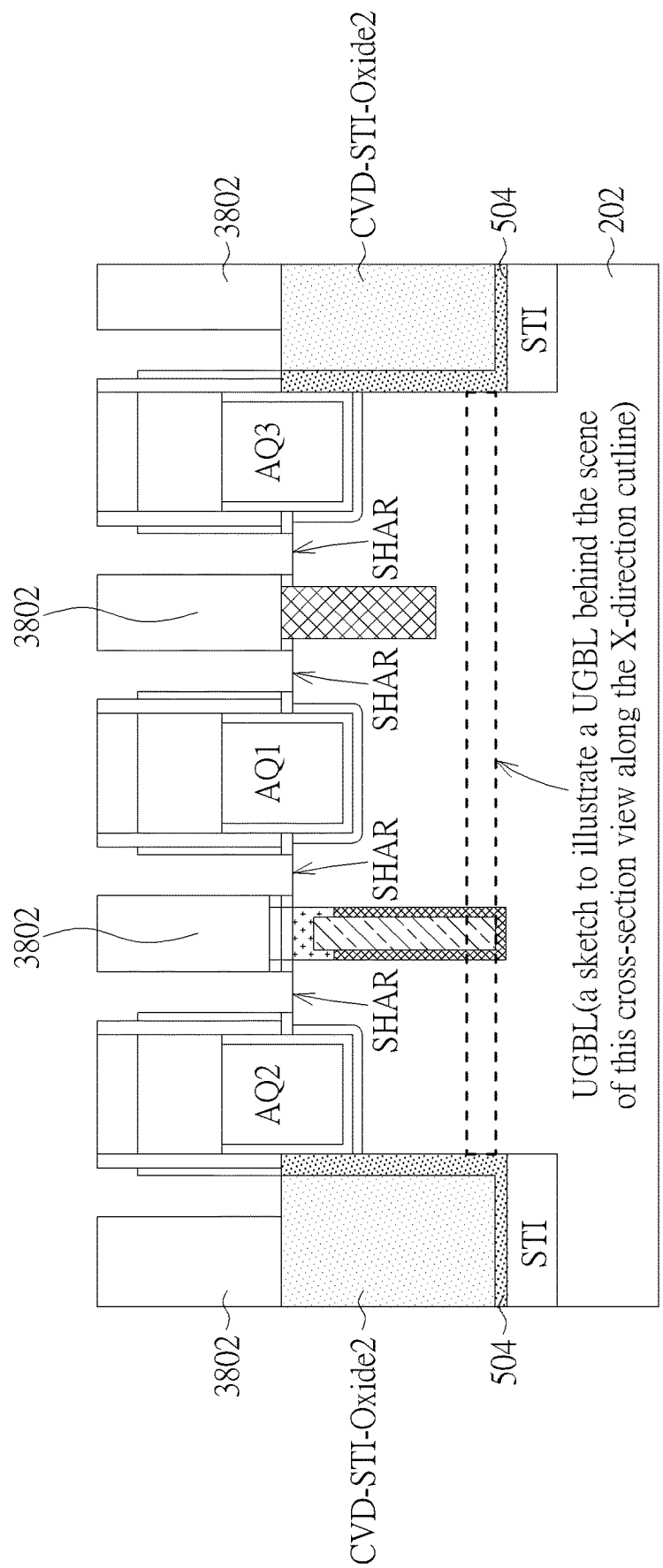
FIG. 39 is a diagram illustrating the cap-oxide-1 layer, the polysilcon-1 spacer, and the pad-oxide layer being removed to expose the HSS corresponding to the source region and the drain region.

Step 174: Etch away the cap-oxide-1 layer 1704, the polysilicon-1 spacer, and the pad-oxide layer 204 (FIG. 39).

Figure 40:
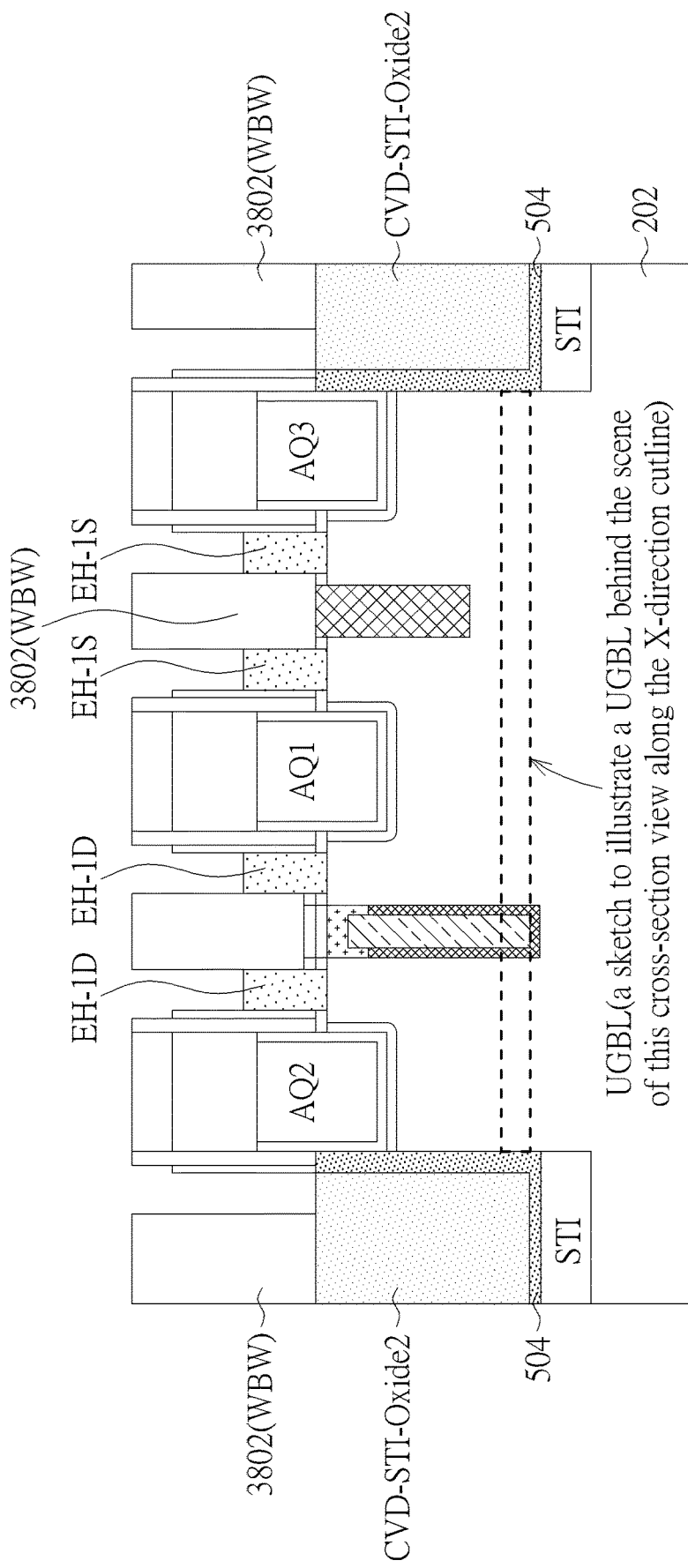
FIG. 40 is a diagram illustrating the elevated source electrode EH-1S and the elevated drain electrode EH-1D being grown.
Figures 1, 40:
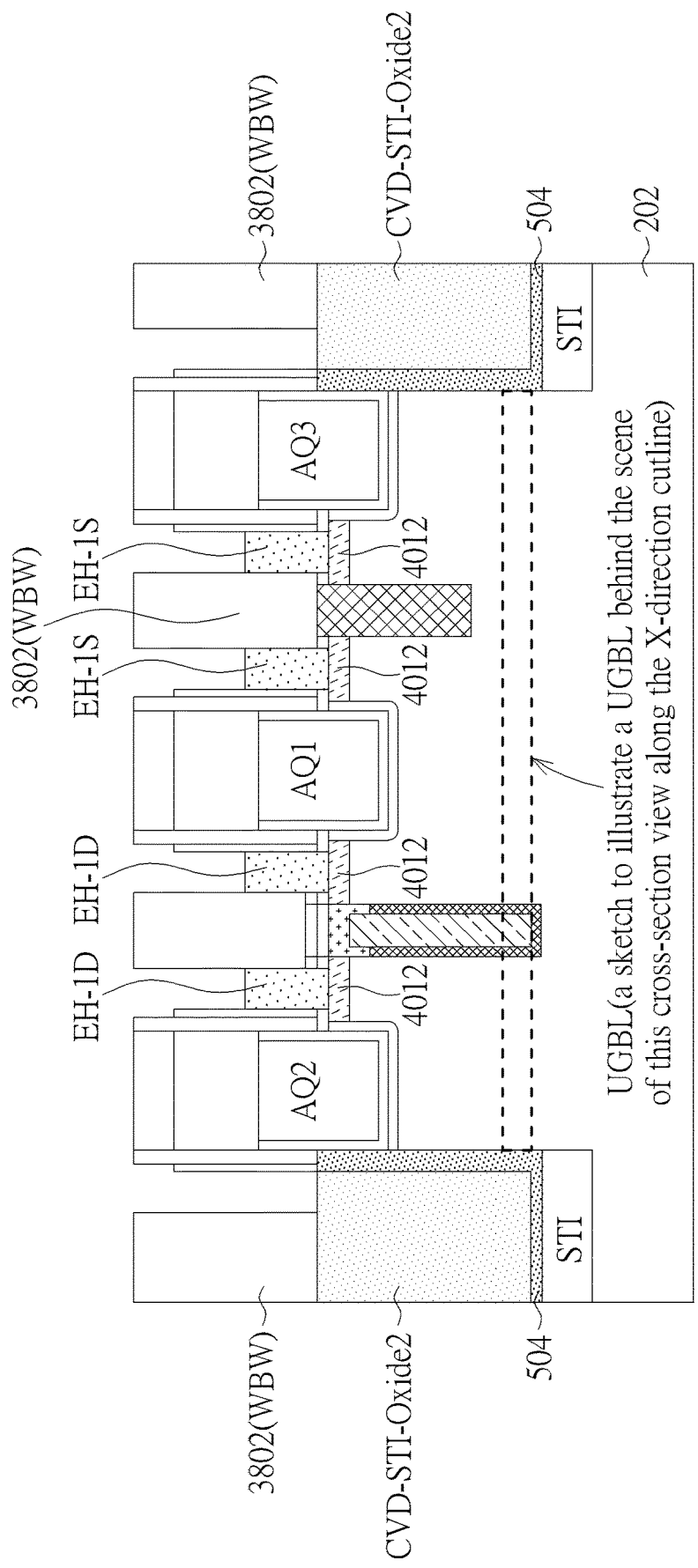

Step 175: Grow both an elevated source electrode EH-1S and an elevated drain electrode EH-1D by using the selective epitaxy silicon growth technology (FIG. 40).

Figure 41:
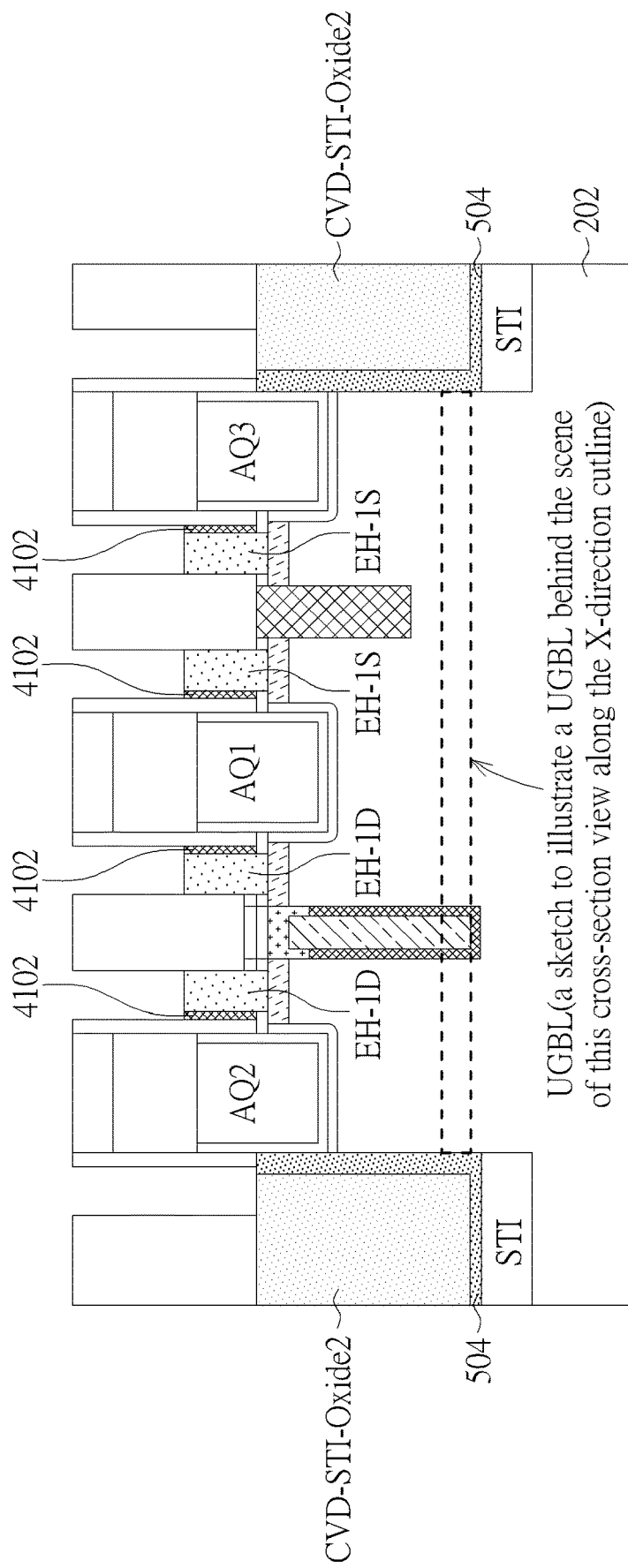
FIG. 41 is a diagram illustrating the oxide-5 spacer being etched and the oxide-a layer being thermally grown and etched.

Step 176: Etch away the oxide-5 spacer, and grow thermally and etch an oxide-a layer 4102 (FIG. 41).

Figure 42:
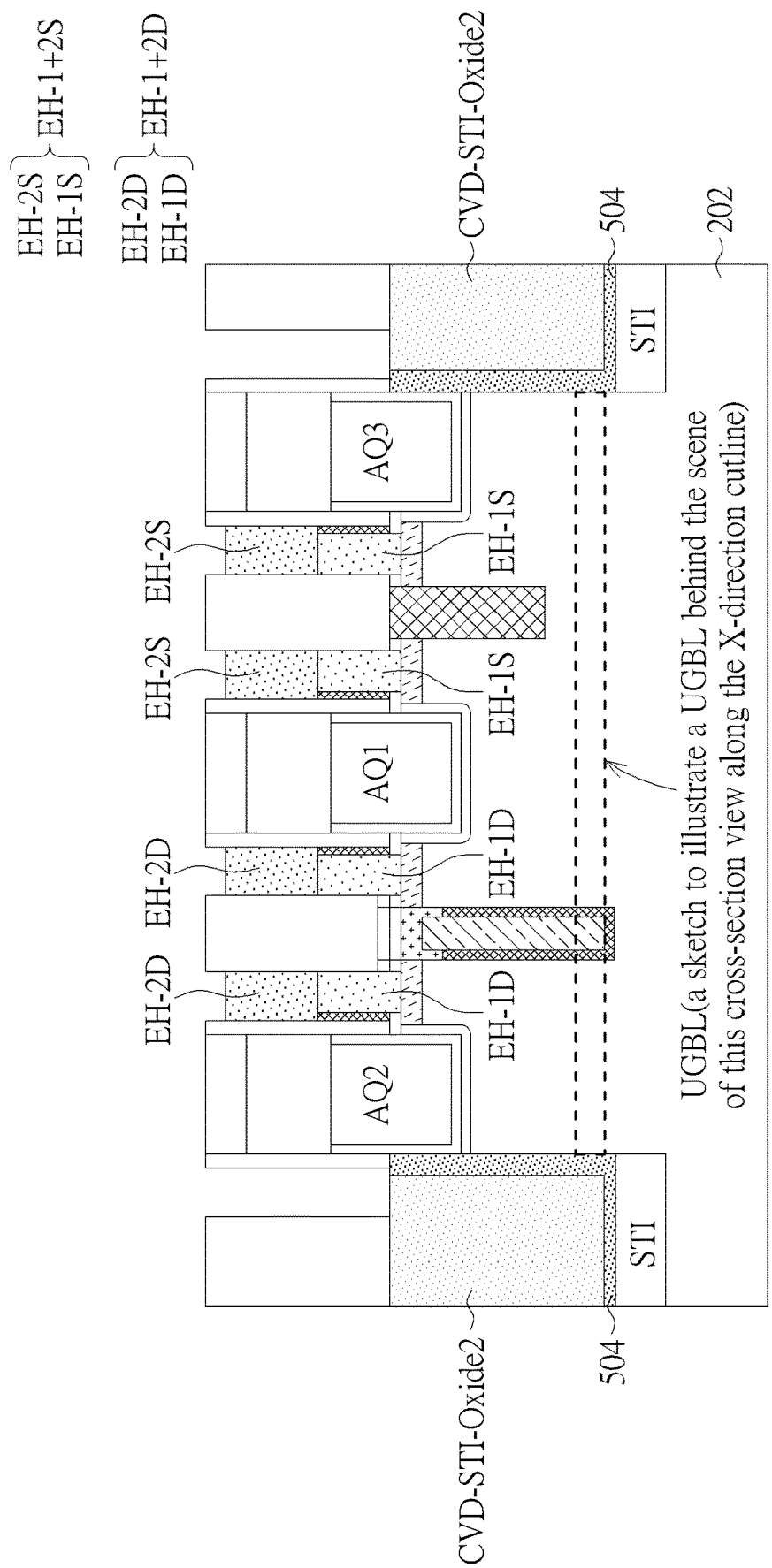
FIG. 42 is a diagram illustrating the elevated source electrode EH-2S and the elevated drain electrode EH-2D being grown.

Step 177: Grow an elevated source electrode EH-2S and an elevated drain electrode EH-2D by using the exposed silicon surfaces of the elevated source electrode EH-1S and the elevated drain electrode EH-1D (FIG. 42).

Figure 43:
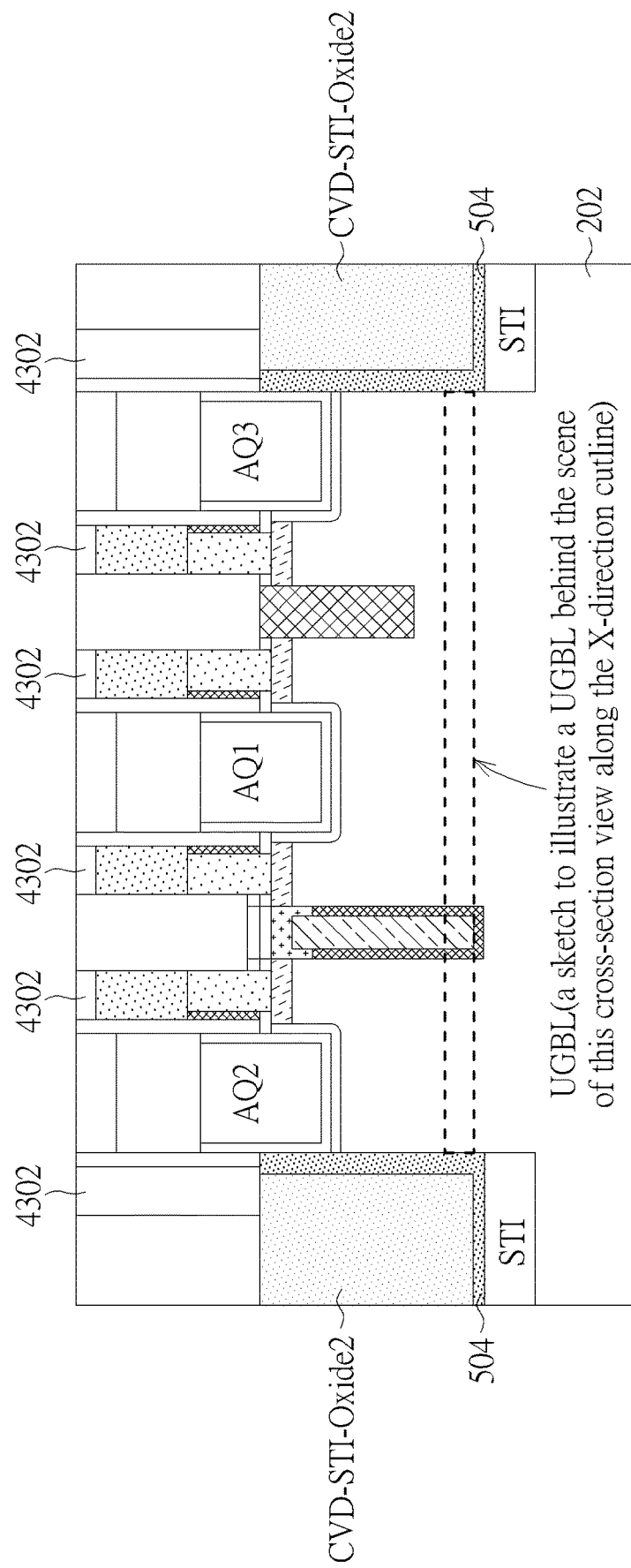
FIG. 43 is a diagram illustrating the thick SOD-1 layer being deposited and etched back.

Please refer to FIGS. 1I, 1J and FIGS. 43-67. Step 50 could include:

Step 178: Deposit and etch back a SOD-1 layer 4302 (FIG. 43).

Figure 44:
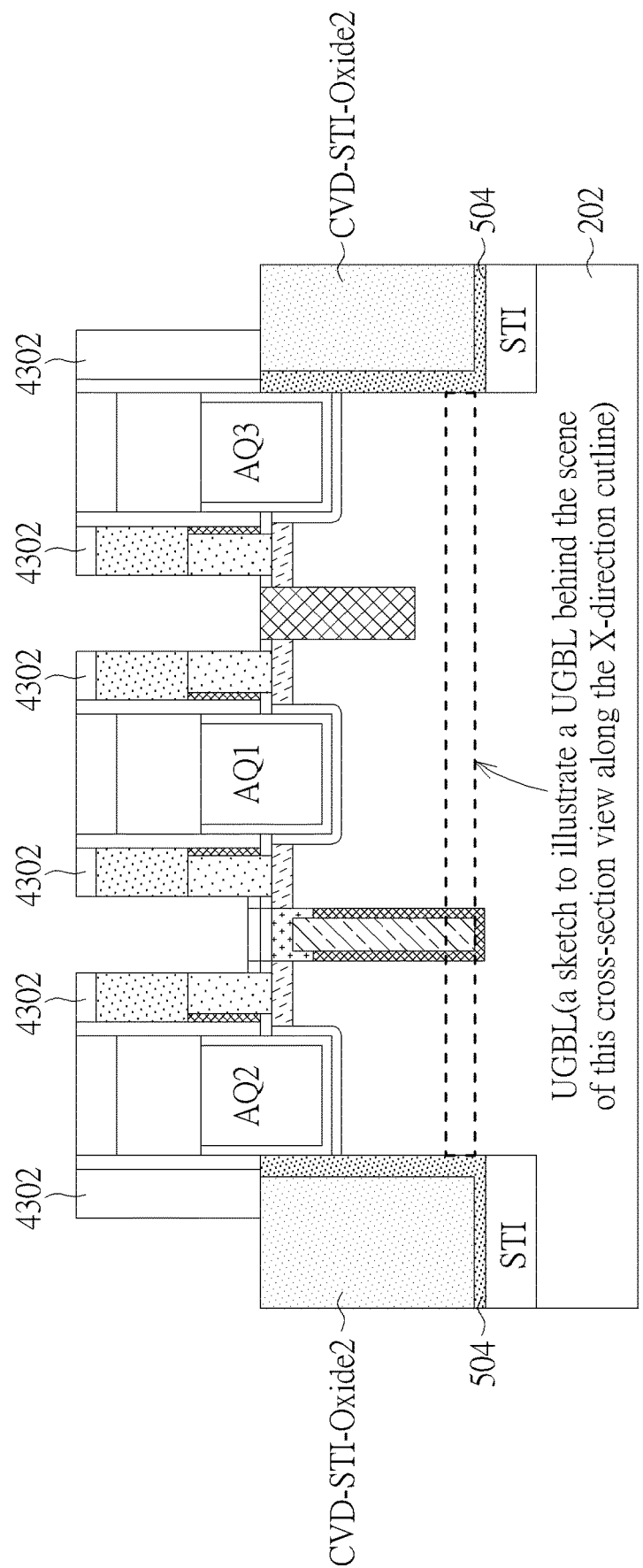
FIG. 44 is a diagram illustrating the WBW being etched away.

Step 179: Etch away the W-Buffer-Walls (WBW) (FIG. 44).

Figure 45:
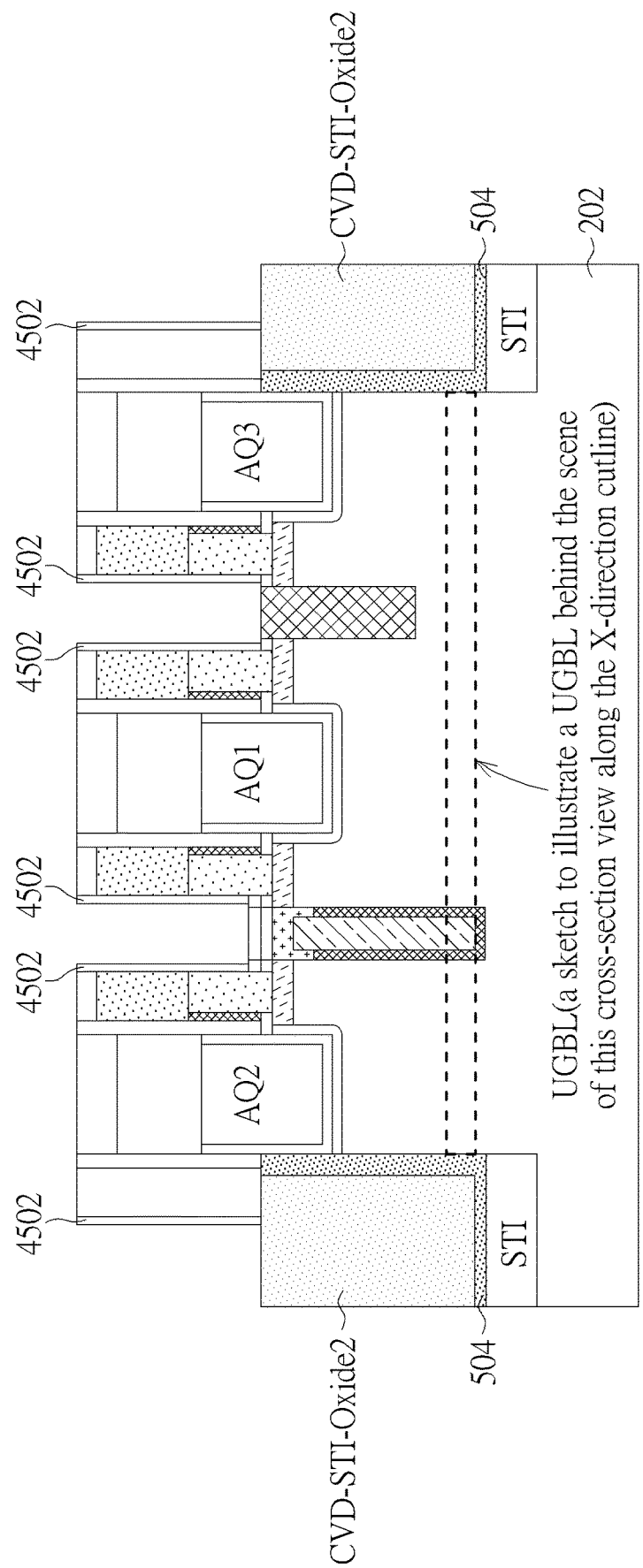
FIG. 45 is a diagram illustrating the nitride-a layer being deposited and etched by using the anisotropic etching technique.

Step 180: Deposit and etch a nitride-a layer 4502 (FIG. 45).

Figure 46:
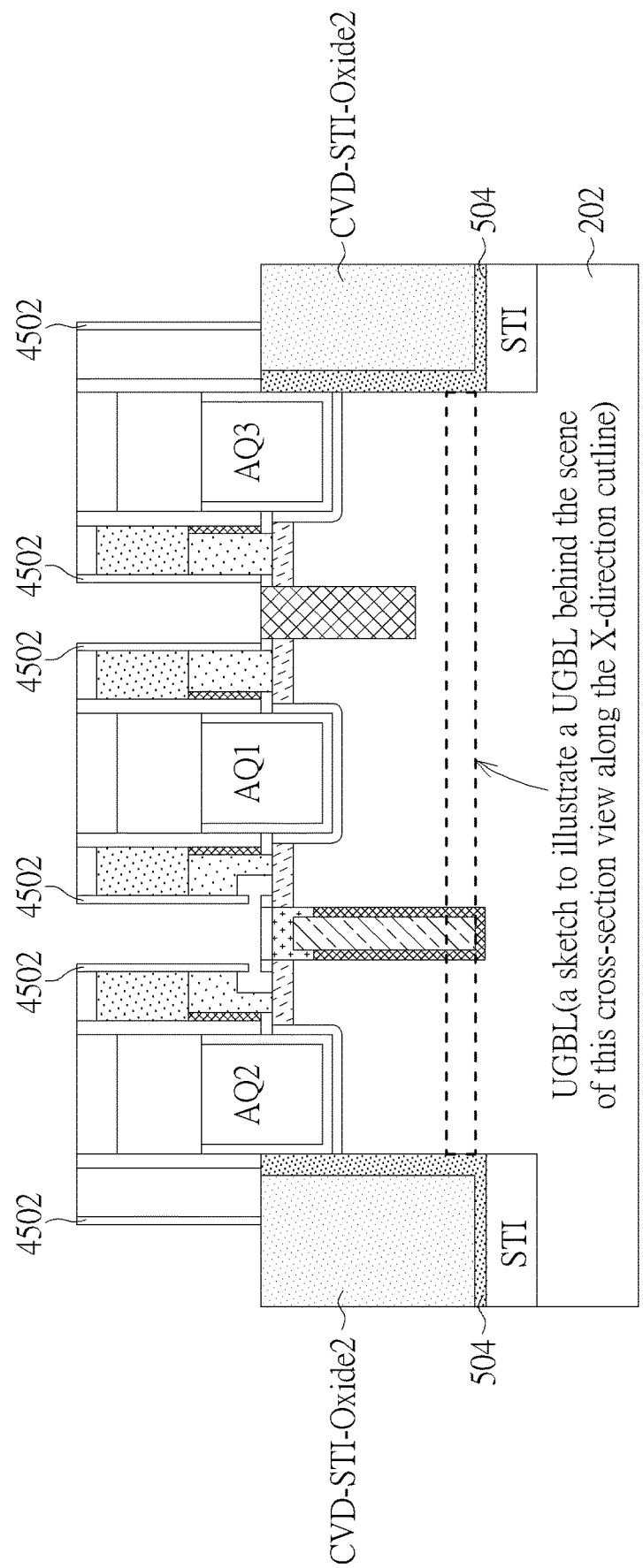
FIG. 46 is a diagram illustrating the polysilicon-a layer and the polysilicon-b layer being removed and the part of some bottom of the elevated drain electrode EH-1D being etched.

Step 181: Remove the polysilicon-a layer 3402 and the polysilicon-b layer 3502, and etch part of some bottom of the elevated drain electrode EH-1D by using the isotropic etching technique (FIG. 46).

Figure 47:
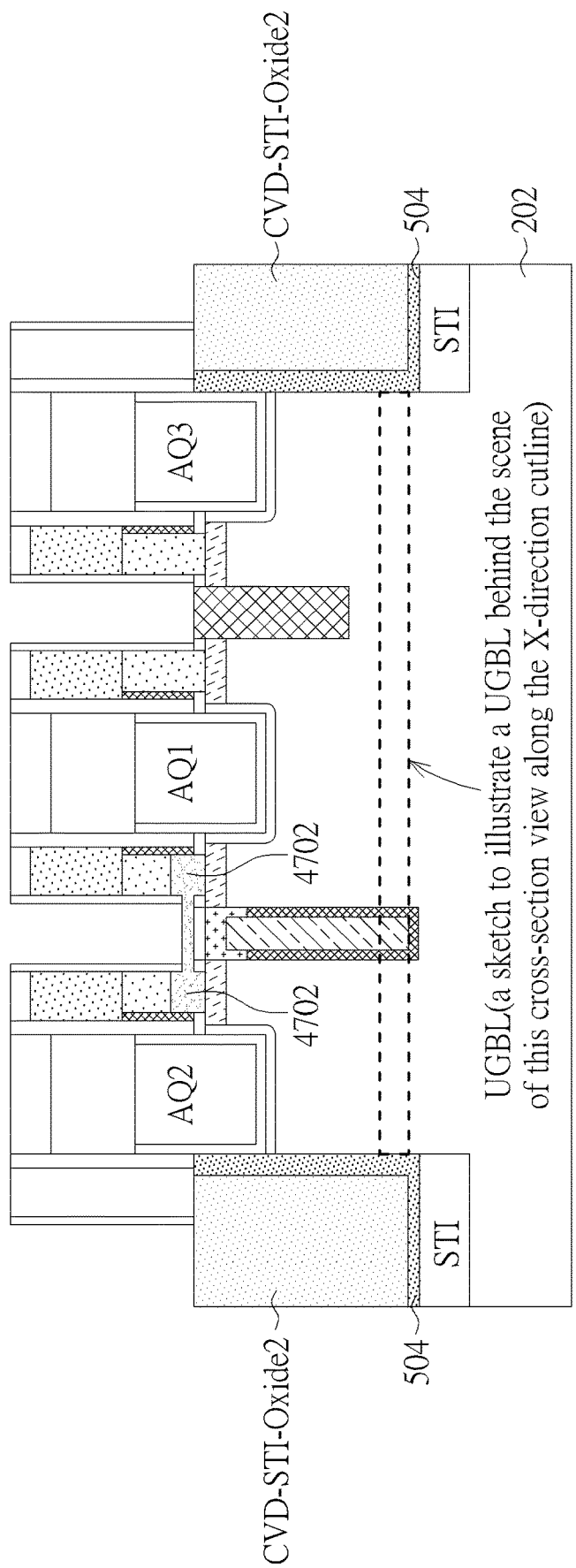
FIG. 47 is a diagram illustrating the oxide-bb layer being grown thermally.

Step 182: Grow an oxide-bb layer 4702 thermally (FIG. 47).

Figure 48:
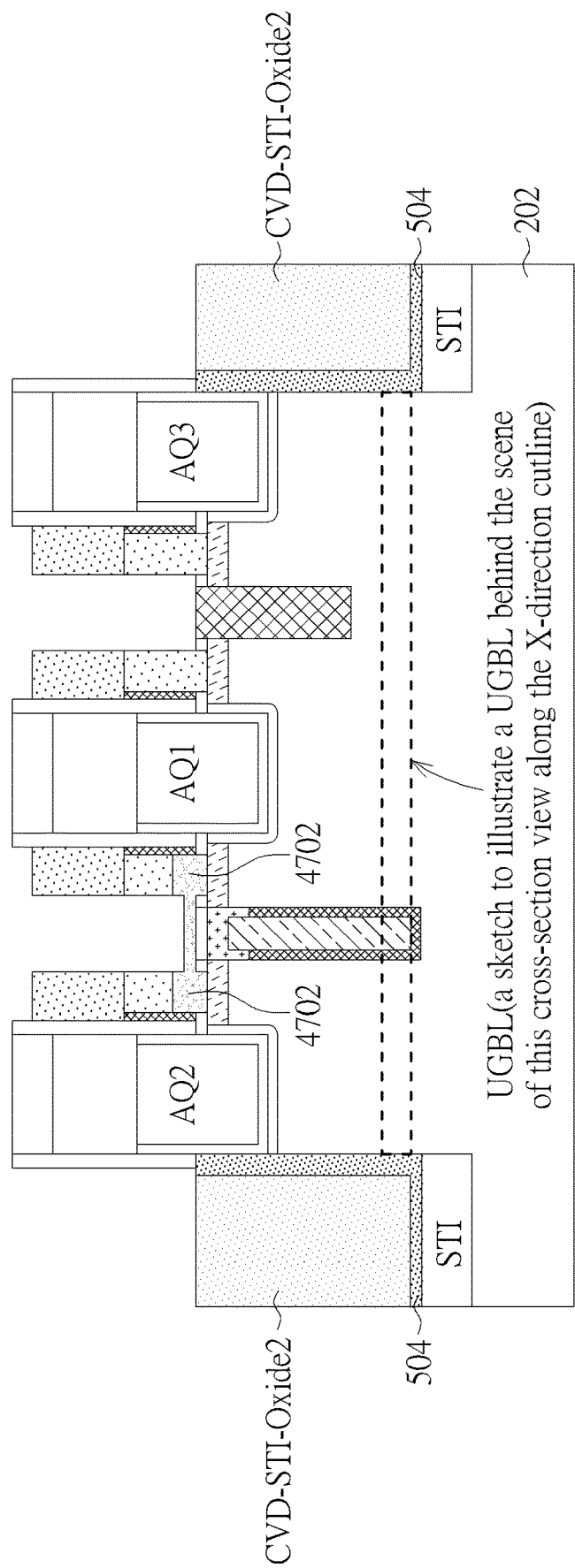
FIG. 48 is a diagram illustrating the nitride-a spacer and the SOD-1 layer being removed.

Step 183: Remove a nitride-a spacer and the SOD-1 layer 4302 by using the isotropic etching technique (FIG. 48).

Figure 49:
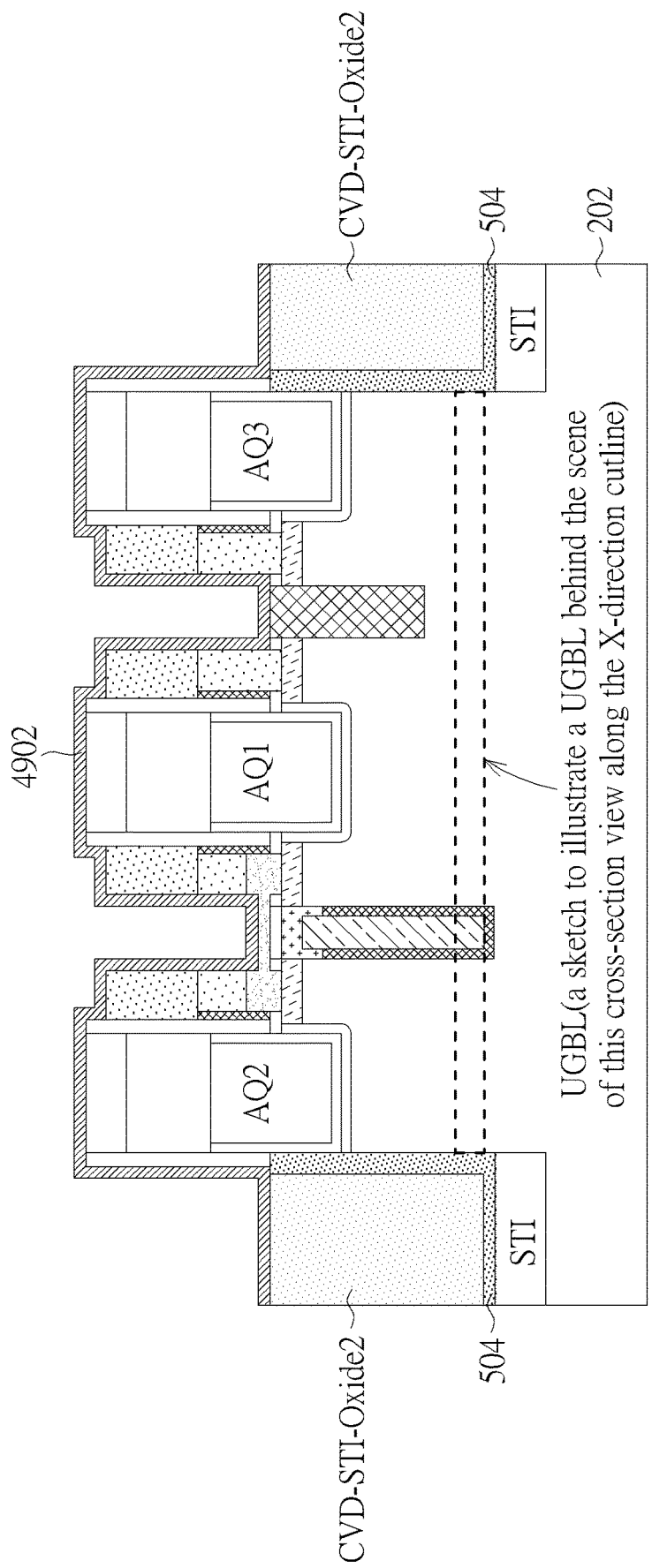
FIG. 49 is a diagram illustrating the high-K-dielectric-insulator-1 layer being formed.

Step 184: Form a high-K-dielectric-insulator-1 layer 4902 (FIG. 49).

Figure 50:
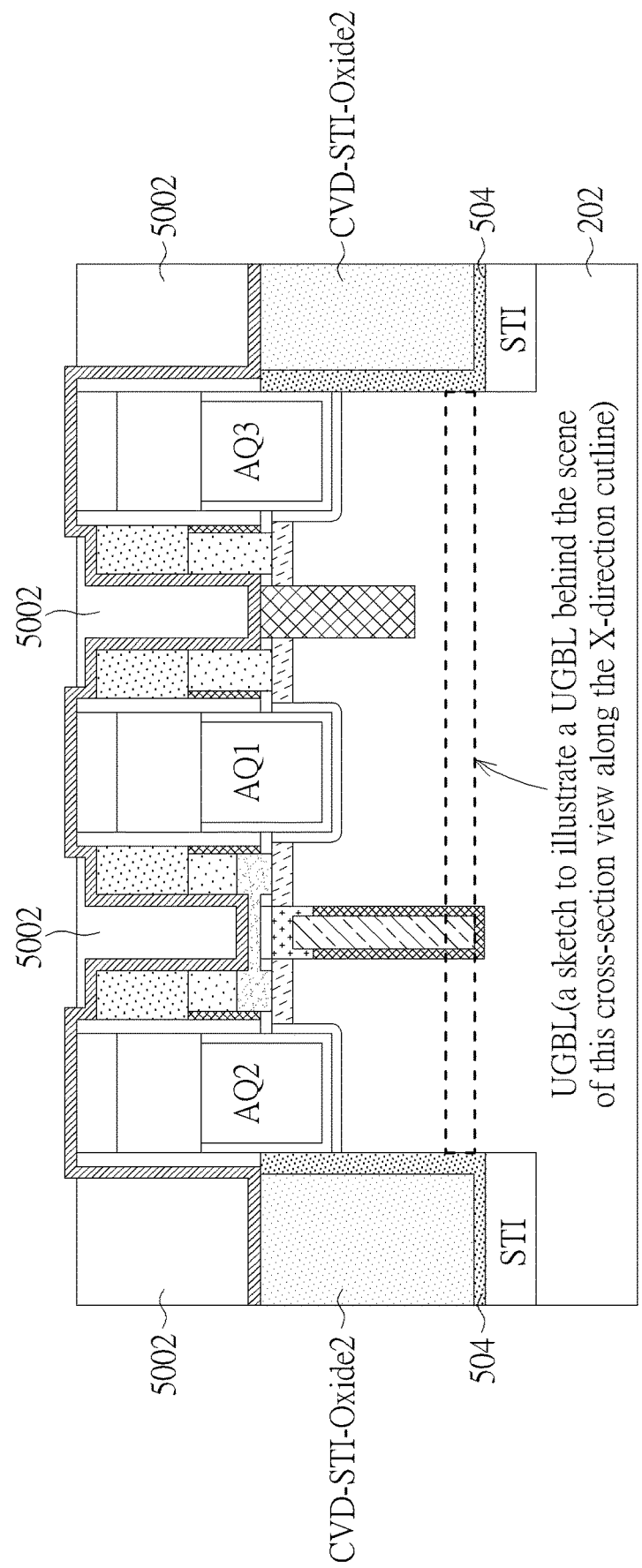
FIG. 50 is a diagram illustrating the metal layer being deposited and etched back.

Step 185: Deposit and etch back a metal layer 5002 to generate MCEPW-1 (FIG. 50).

Figure 51:
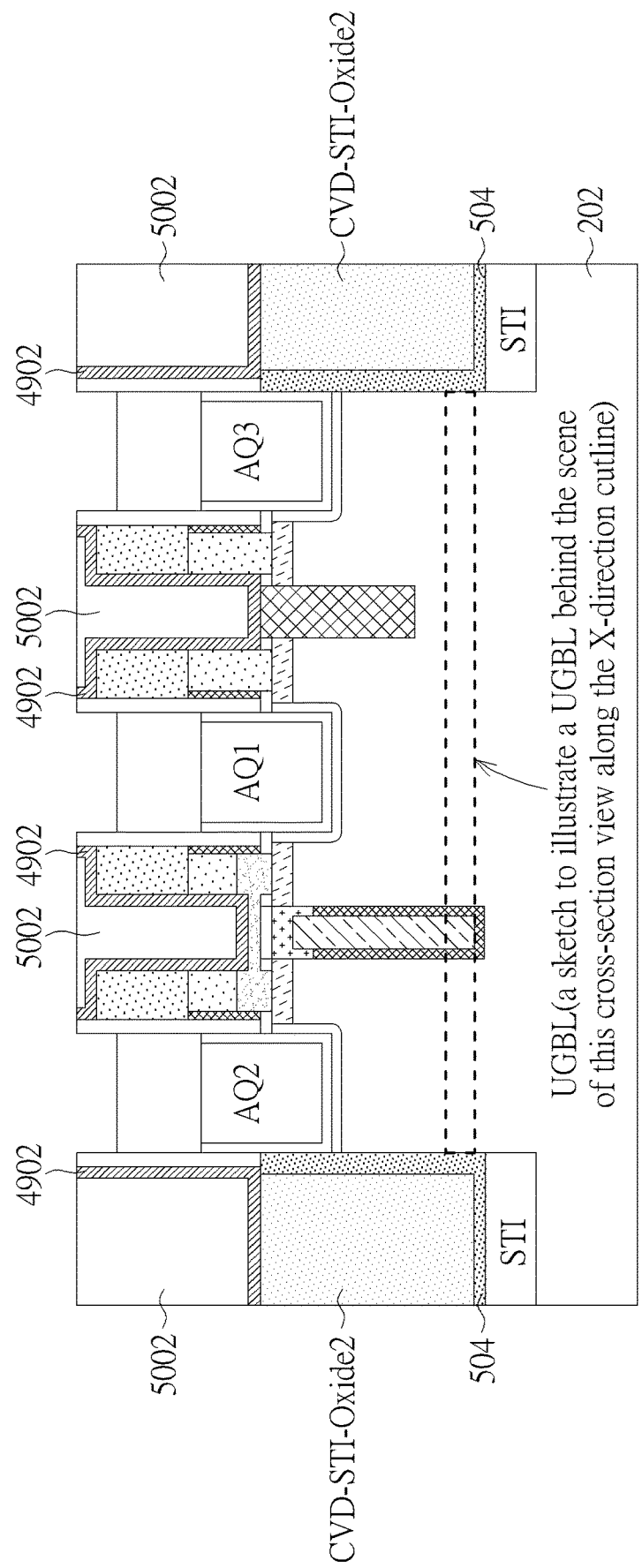
FIG. 51 is a diagram illustrating the high-K-dielectric-insulator-1 over the oxide-4 layer being removed and then the oxide-4 layer being etched away.

Step 186: Remove the high-K-dielectric-insulator-1 4902 over the oxide-4 layer 1404 and etch away the oxide-4 layer 1404 (FIG. 51).

Figure 52:
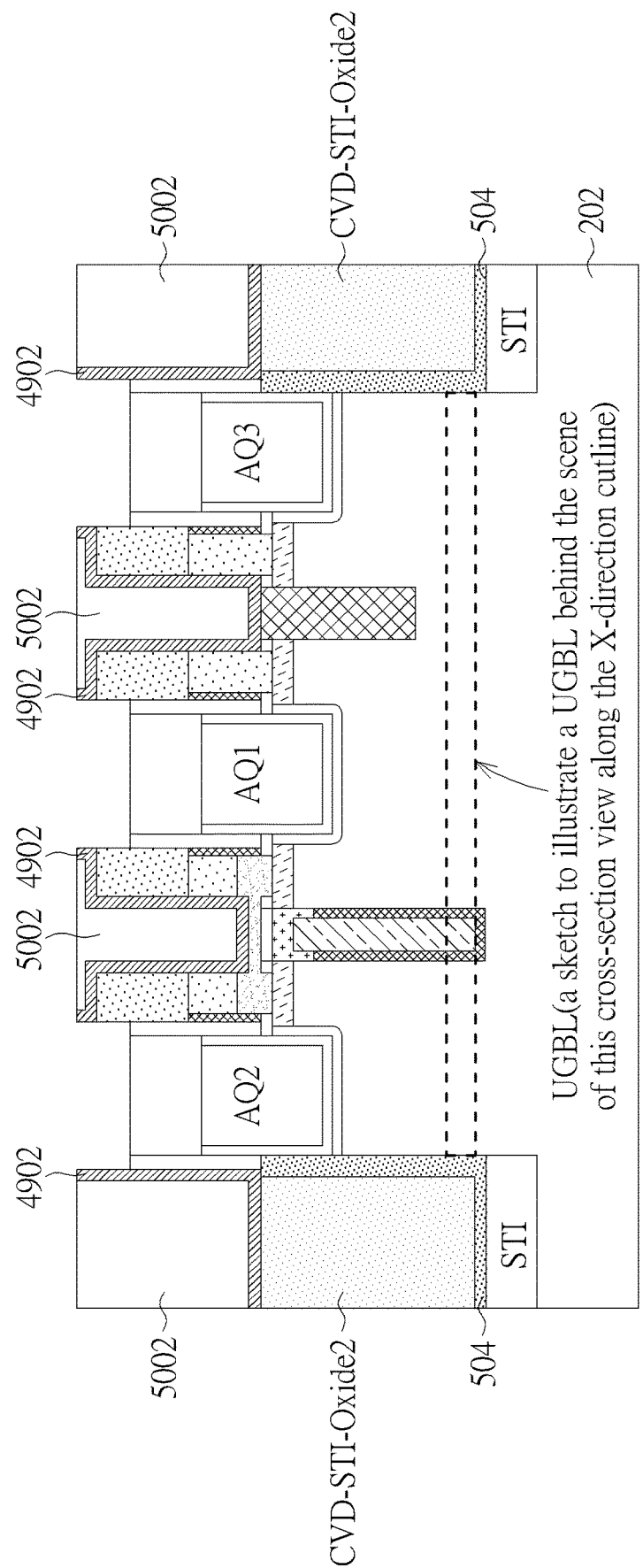
FIG. 52 is a diagram illustrating the upper portion of the nitride-3 layer being removed and the upper portion of the nitride-4 spacer being also removed.

Step 187: Etch the nitride-3 layer 1402 and the nitride-4 spacer (FIG. 52).

Figure 53:
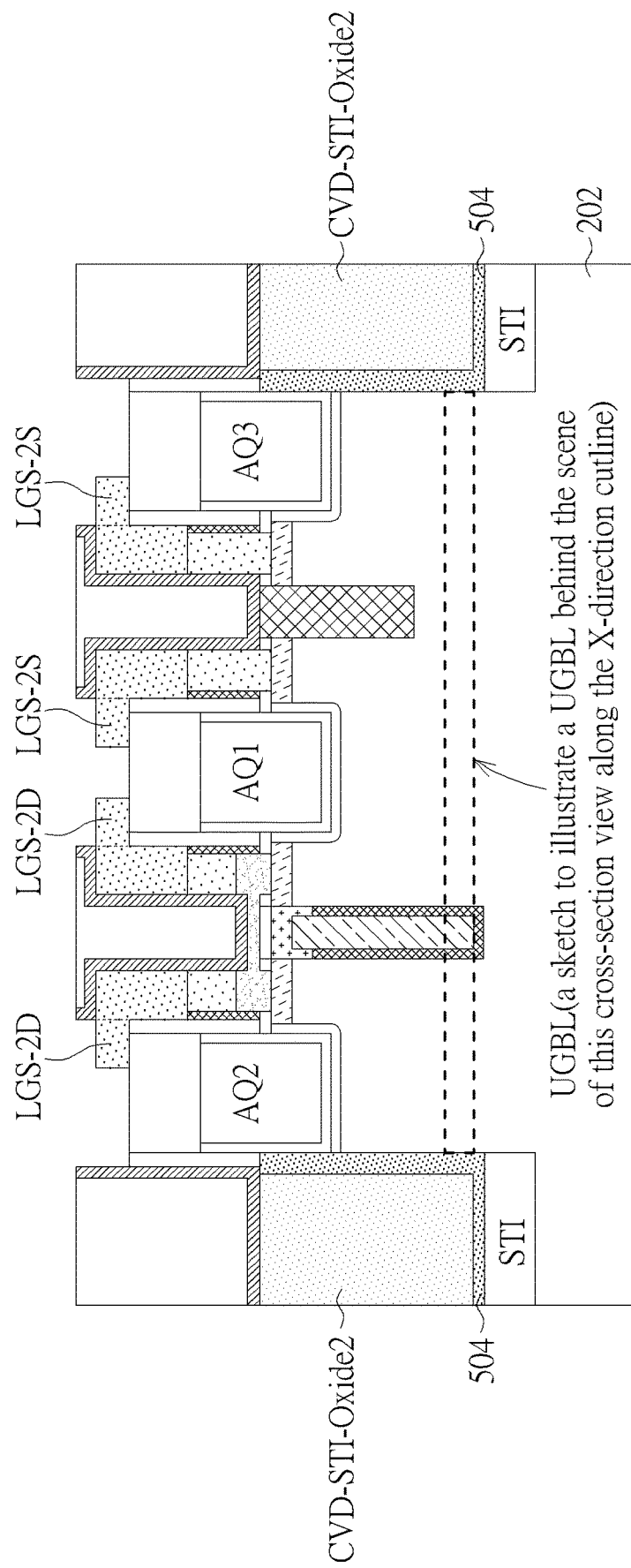
FIG. 53 is a diagram illustrating the LGS-2S and the LGS-2D being grown laterally.

Step 188: Grow n+ in-situ doped silicon material laterally over the nitride-3 layer 1402 by using the exposed silicon sidewall of the EH-2 electrodes (FIG. 53).

Figure 54:
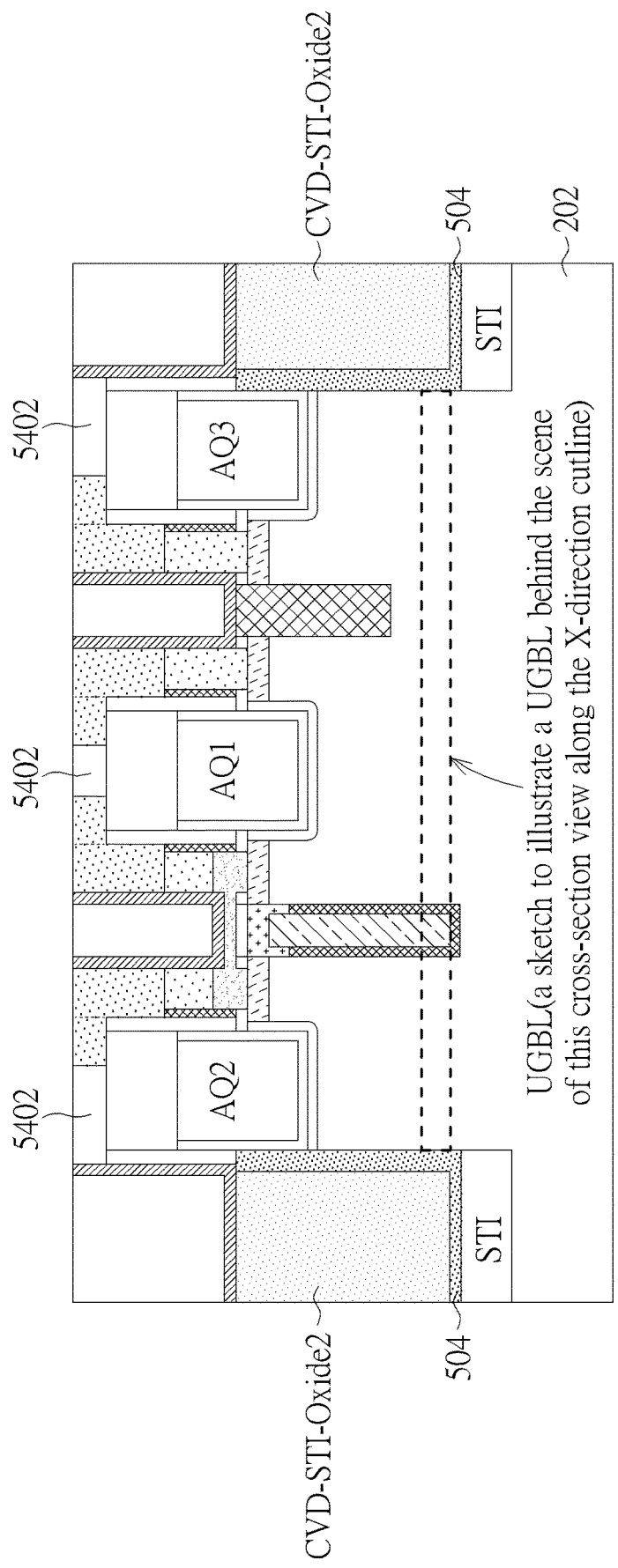
FIG. 54 is a diagram illustrating the nitride-cc layer being deposited and the LGS-2D, the LGS-2S, and the nitride-cc layer being polished by the CMP technique.

Step 189: Deposit a nitride-cc layer 5402 (FIG. 54).

Figure 55:
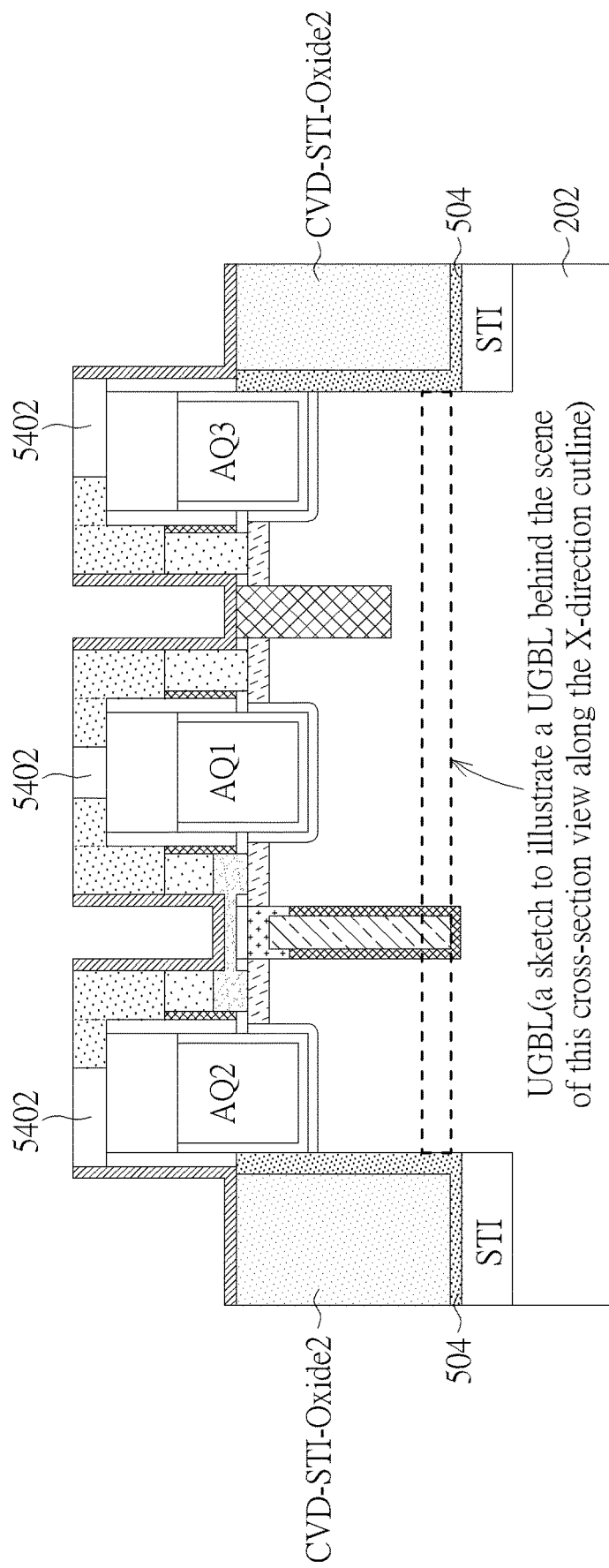
FIG. 55 is a diagram illustrating the MCEPW-1 being removed.

Step 190: Remove the MCEPW-1 (FIG. 55).

Figure 56:
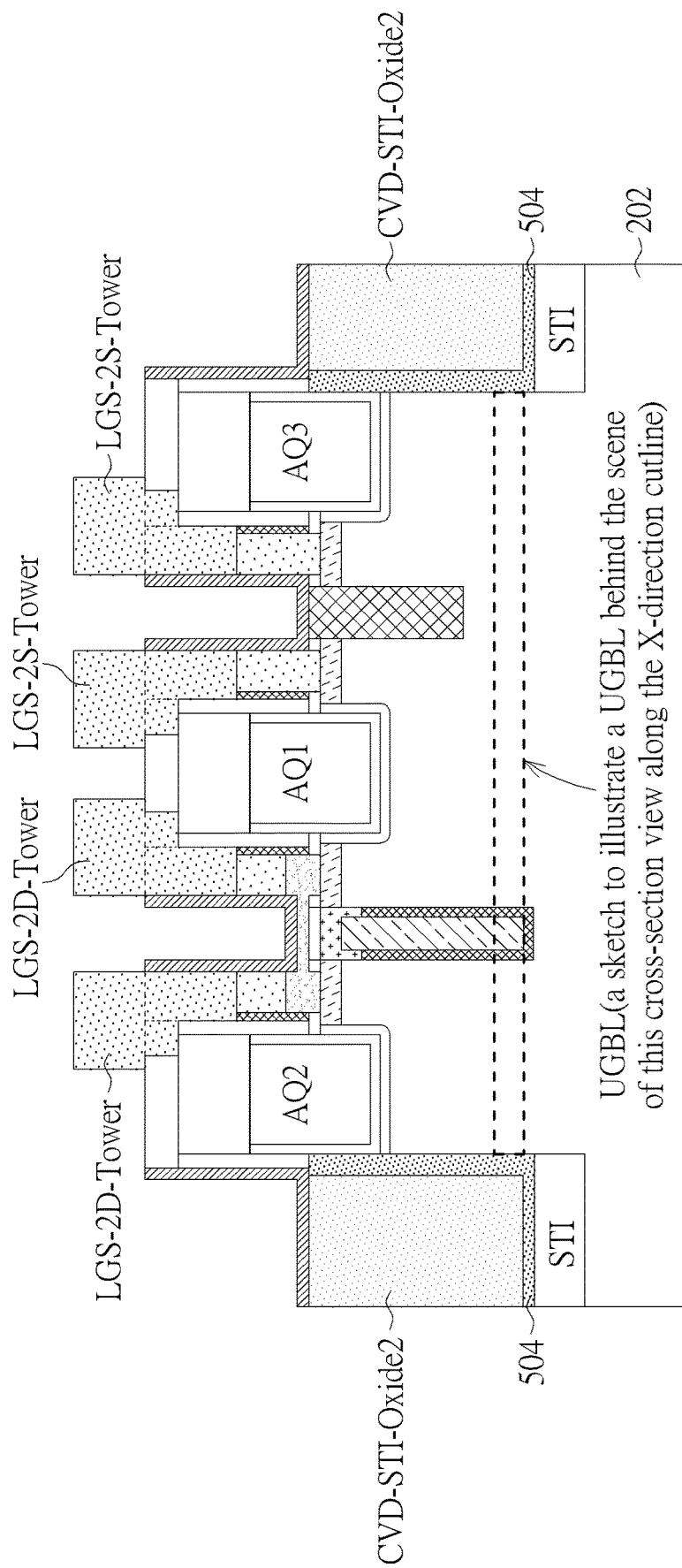
FIG. 56 is a diagram illustrating the twin-tower-like storage electrode for the storage capacitor being grown by using the exposed LGS-2D and the exposed LGS-2S as seeds.

Step 191: Carry out a selective epitaxy silicon growth of creating a twin-tower-like storage electrode by using the exposed LGS-2D and the exposed LGS-2S as seeds (FIG. 56).

Figure 57:
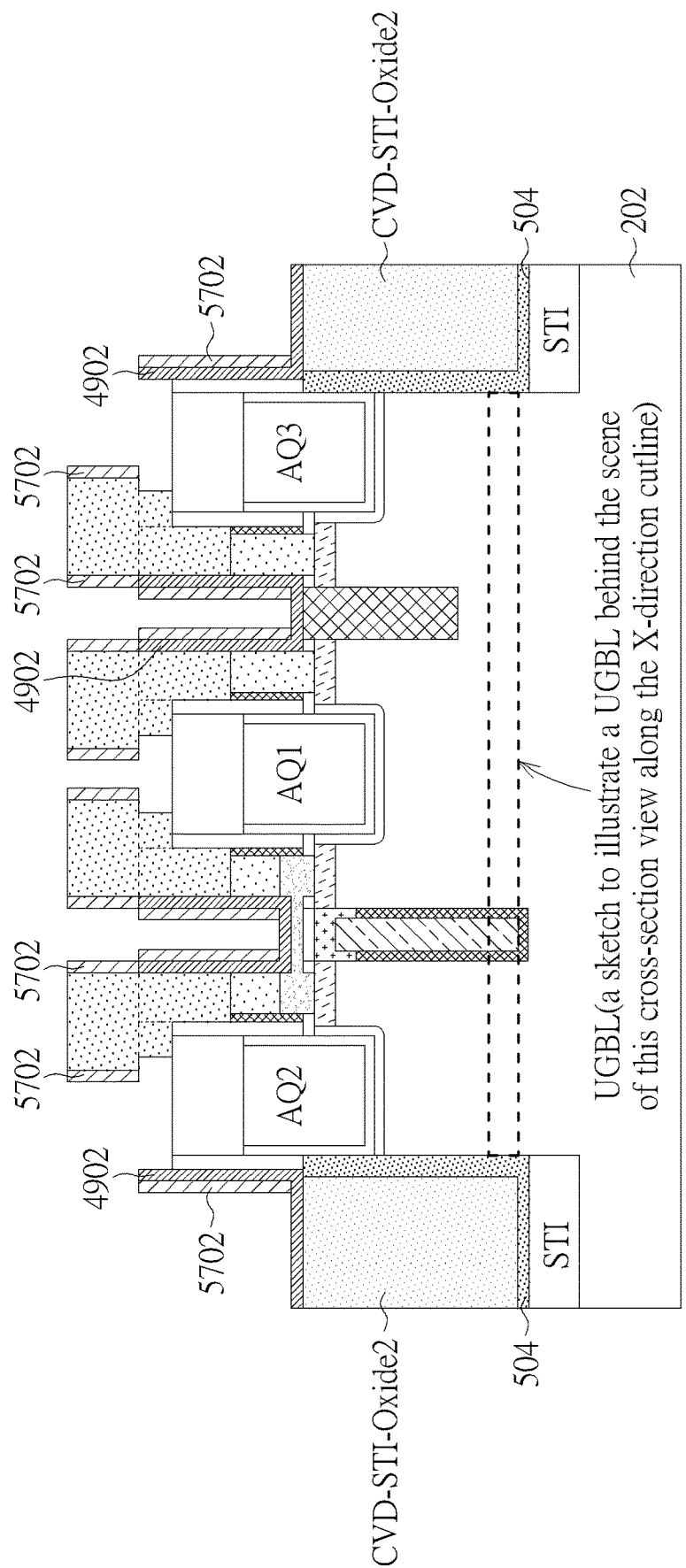
FIG. 57 is a diagram illustrating the oxide-d layer being grown thermally and anisotropically etched.

Step 192: Grow thermally and anisotropically etch an oxide-d layer 5702, and remove nitride-cc layer 5402 (FIG. 57).

Figure 58:
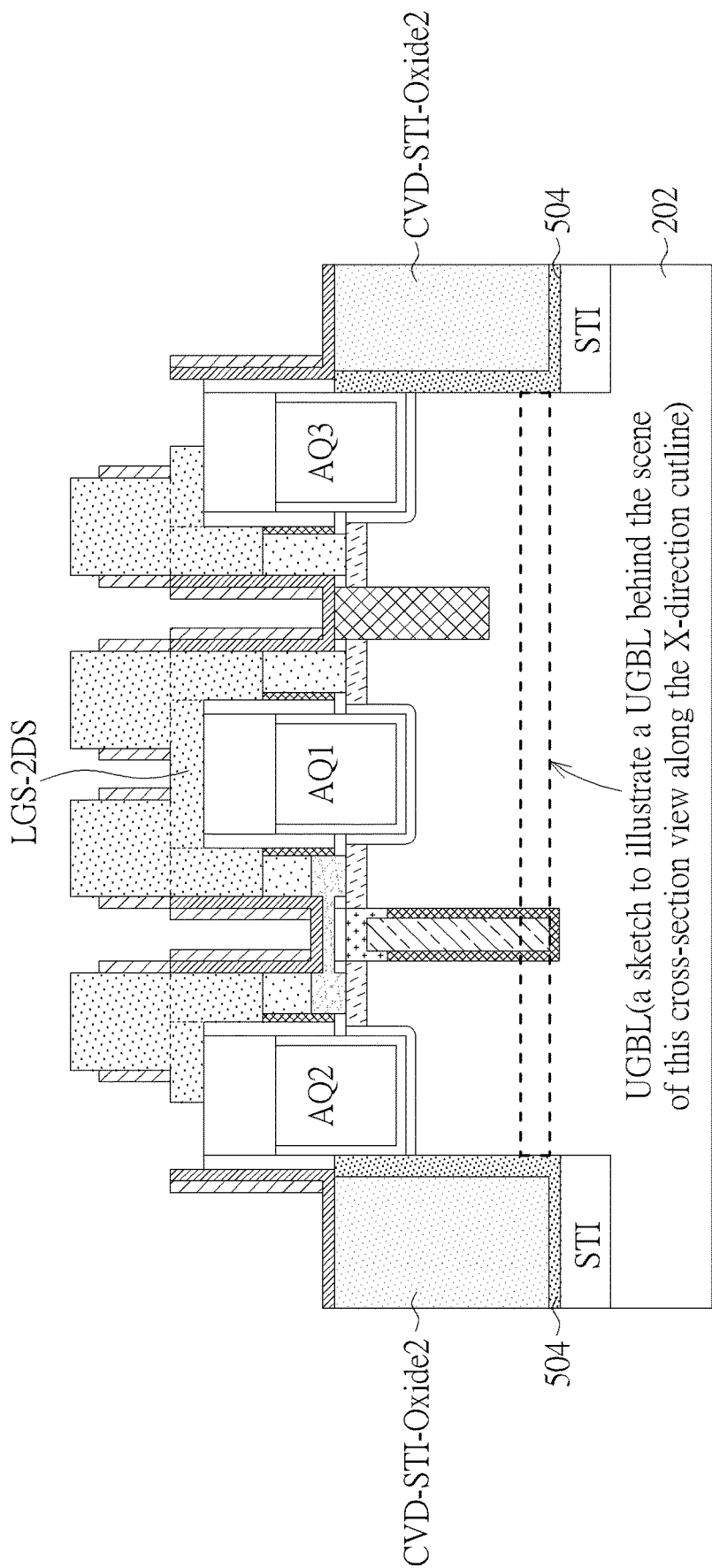
FIG. 58 is a diagram illustrating the n+ in-situ-doped silicon layers being grown laterally and vertically.

Step 193: Grow laterally and vertically more heavily n+ in-situ-doped silicon layers from exposed silicon areas of both the LGS-2D and the LGS-2S by using the selective epitaxy silicon growth technique (FIG. 58).

Figure 59:
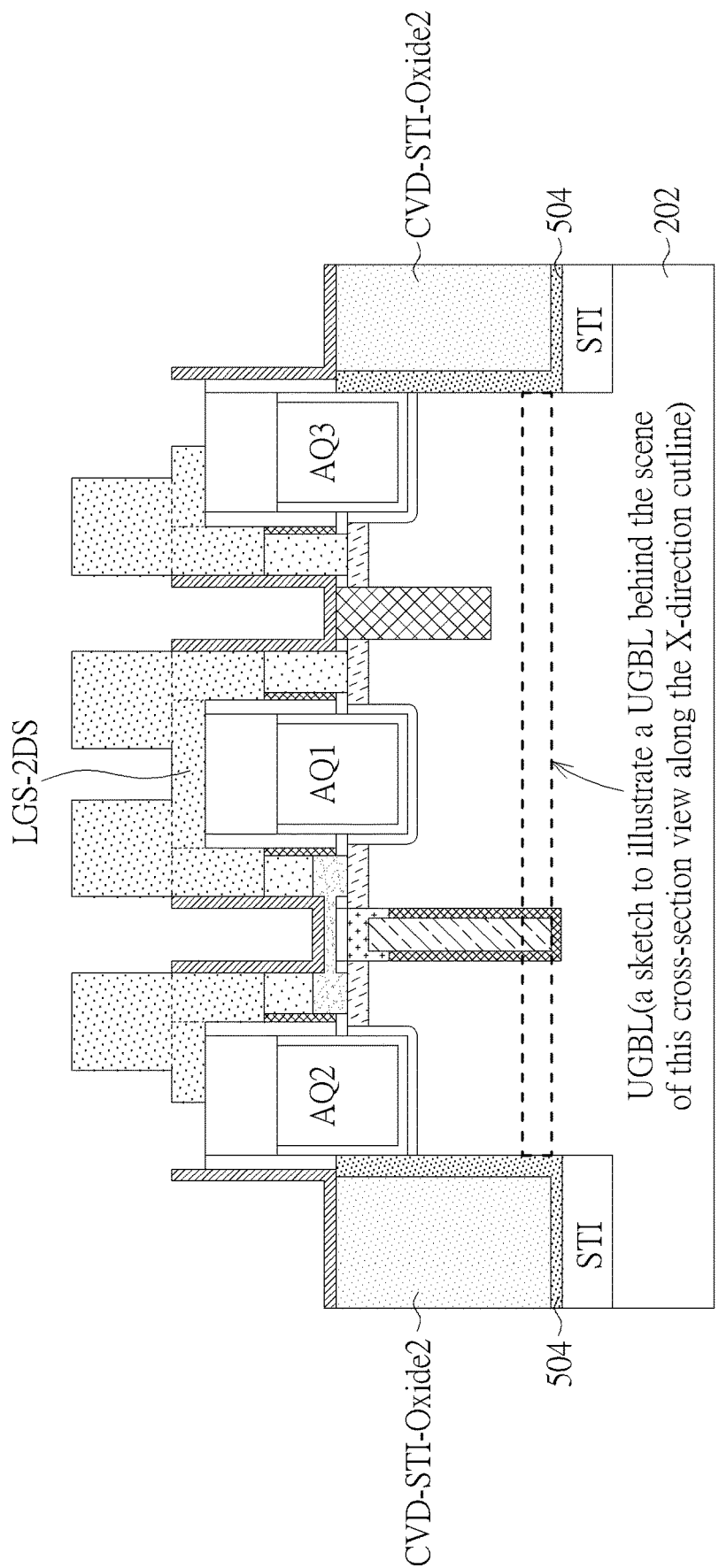
FIG. 59 is a diagram illustrating the oxide-d spacer being removed.

Step 194: Remove an oxide-d spacer (FIG. 59).

Figure 60:
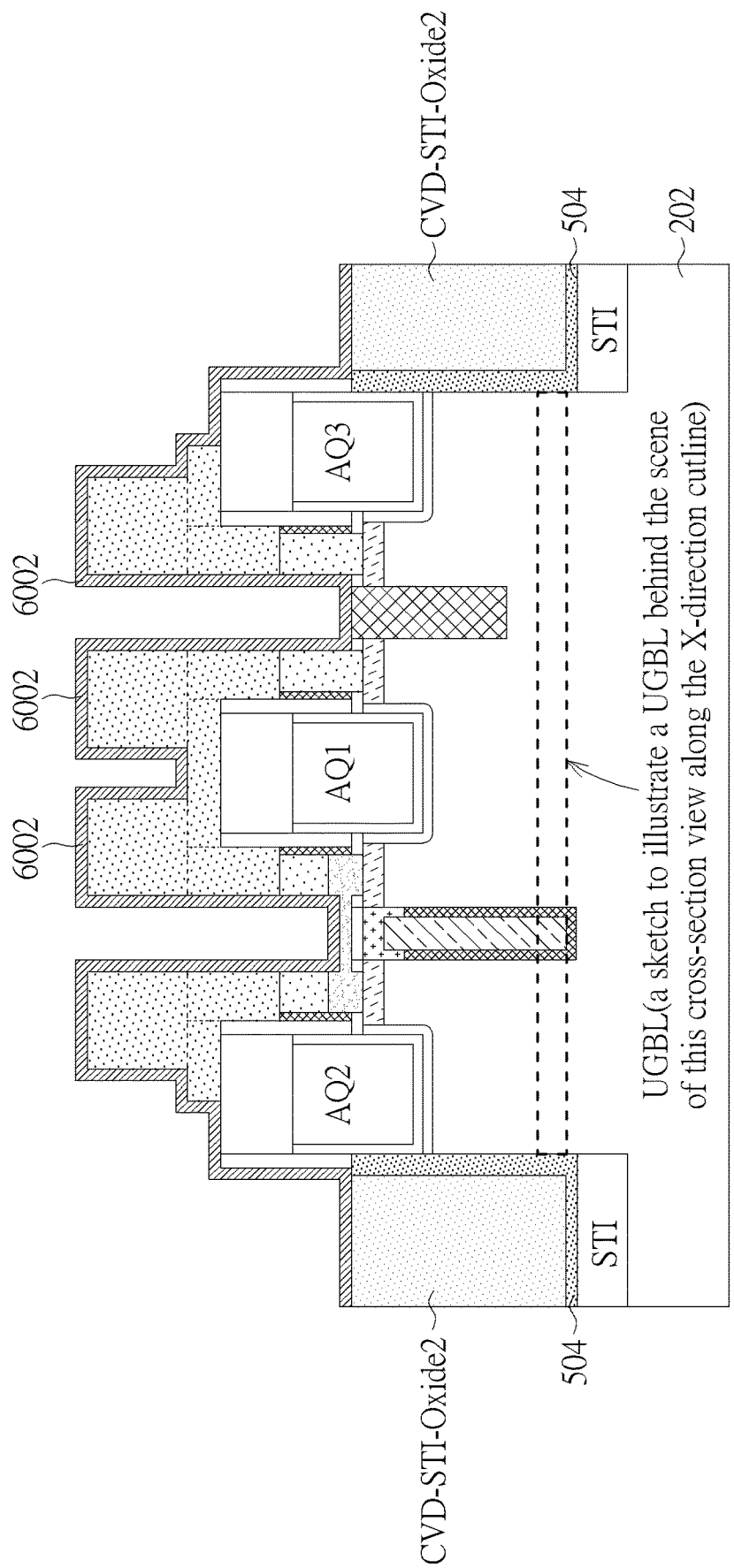
FIG. 60 is a diagram illustrating the high-K-dielectric-insulator-1 being removed and the high-K-dielectric-insulator-2 being formed.

Step 195: Remove the high-K-dielectric-insulator-1 4902 and form a high-K-dielectric-insulator-2 6002 (FIG. 60).

Figure 61:
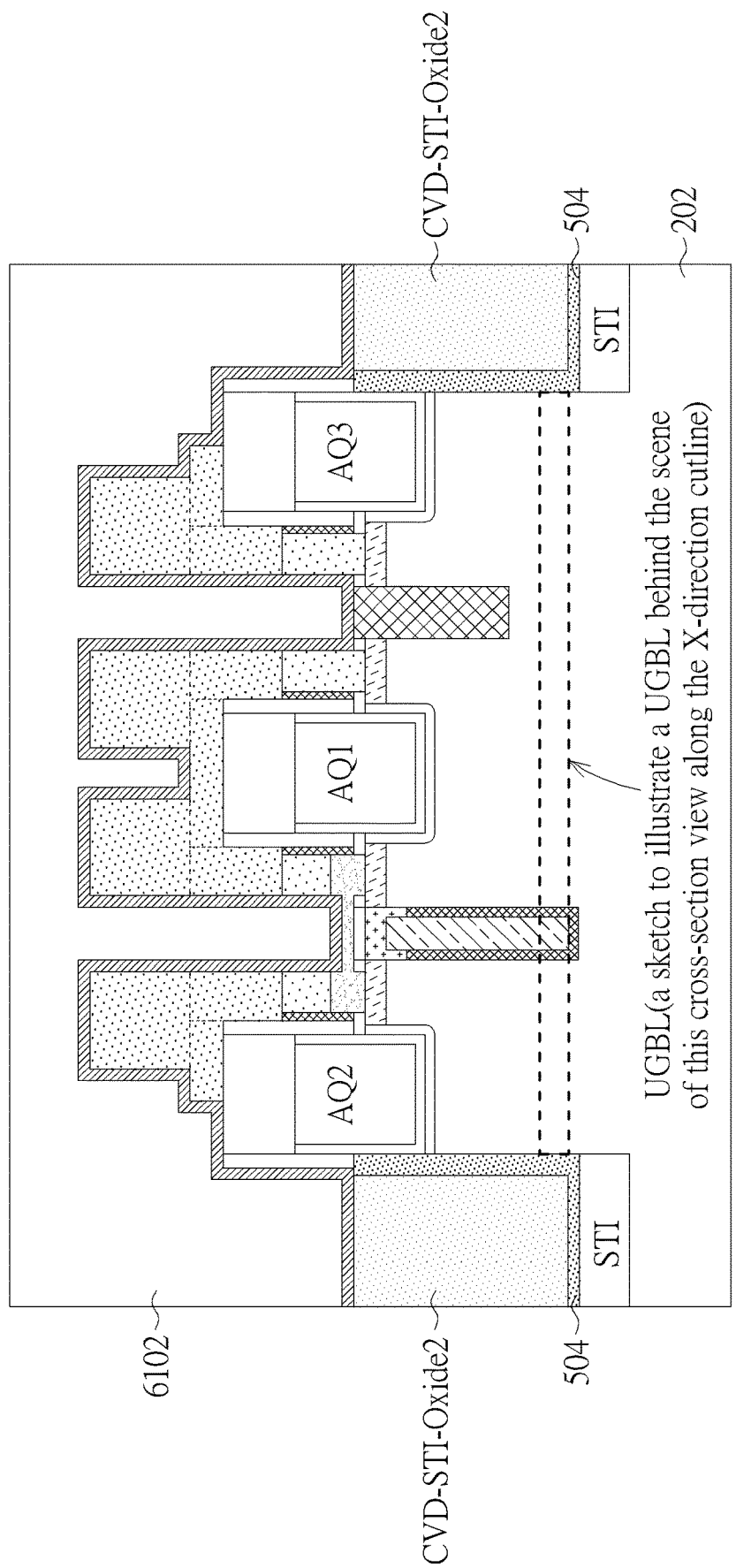
FIG. 61 is a diagram illustrating the metal layer being deposited and polished by the CMP technique.

Step 196: Deposit a metal layer (e.g. Tungsten) 6102, and then use the CMP technique to polish the metal layer 6102 (FIG. 61).

Figure 62:
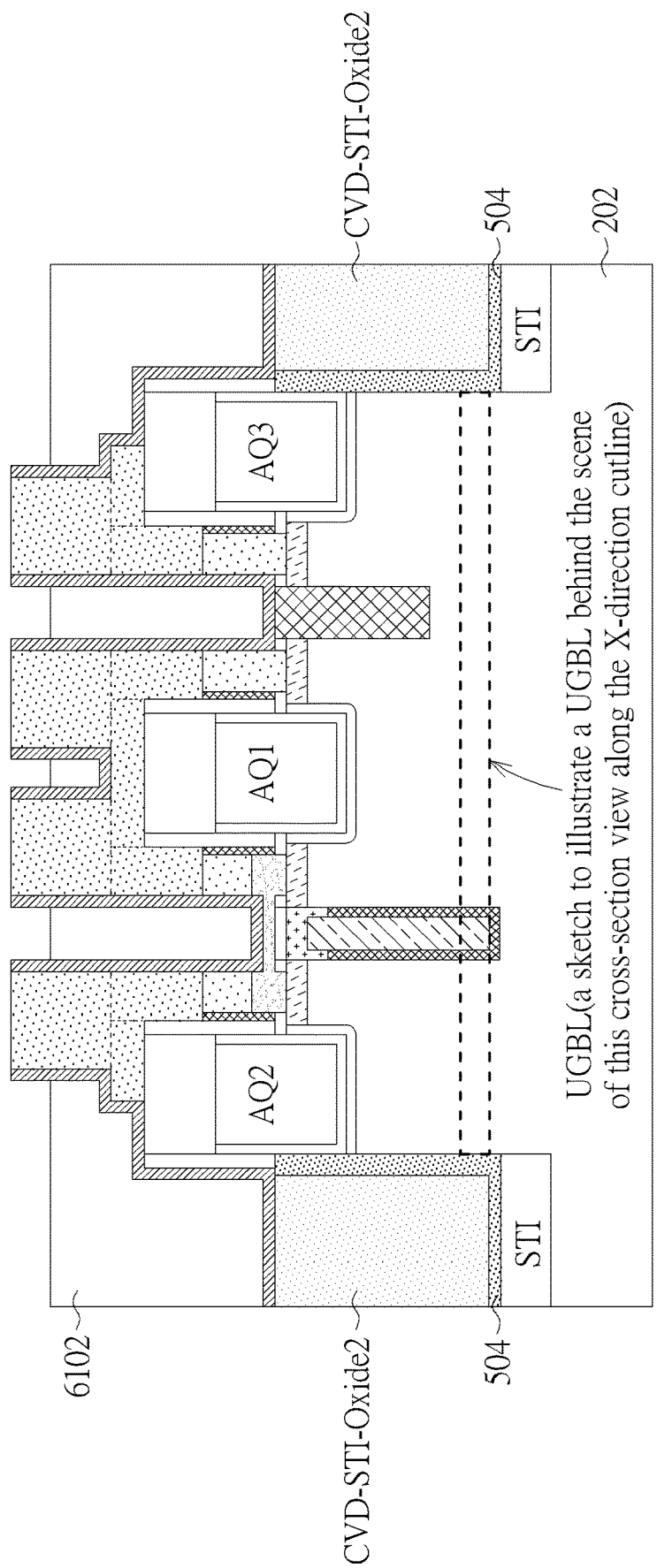
FIG. 62 is a diagram illustrating the MCEPW-2 being etched back and the high-K-dielectric-insulator-2 on the top of the STSEC-1 being etched away.

Step 197: Etch back the MCEPW-2, and then etch away the high-K-dielectric-insulator-2 6002 on a top of the STSEC-1 (FIG. 62).

Figure 63:
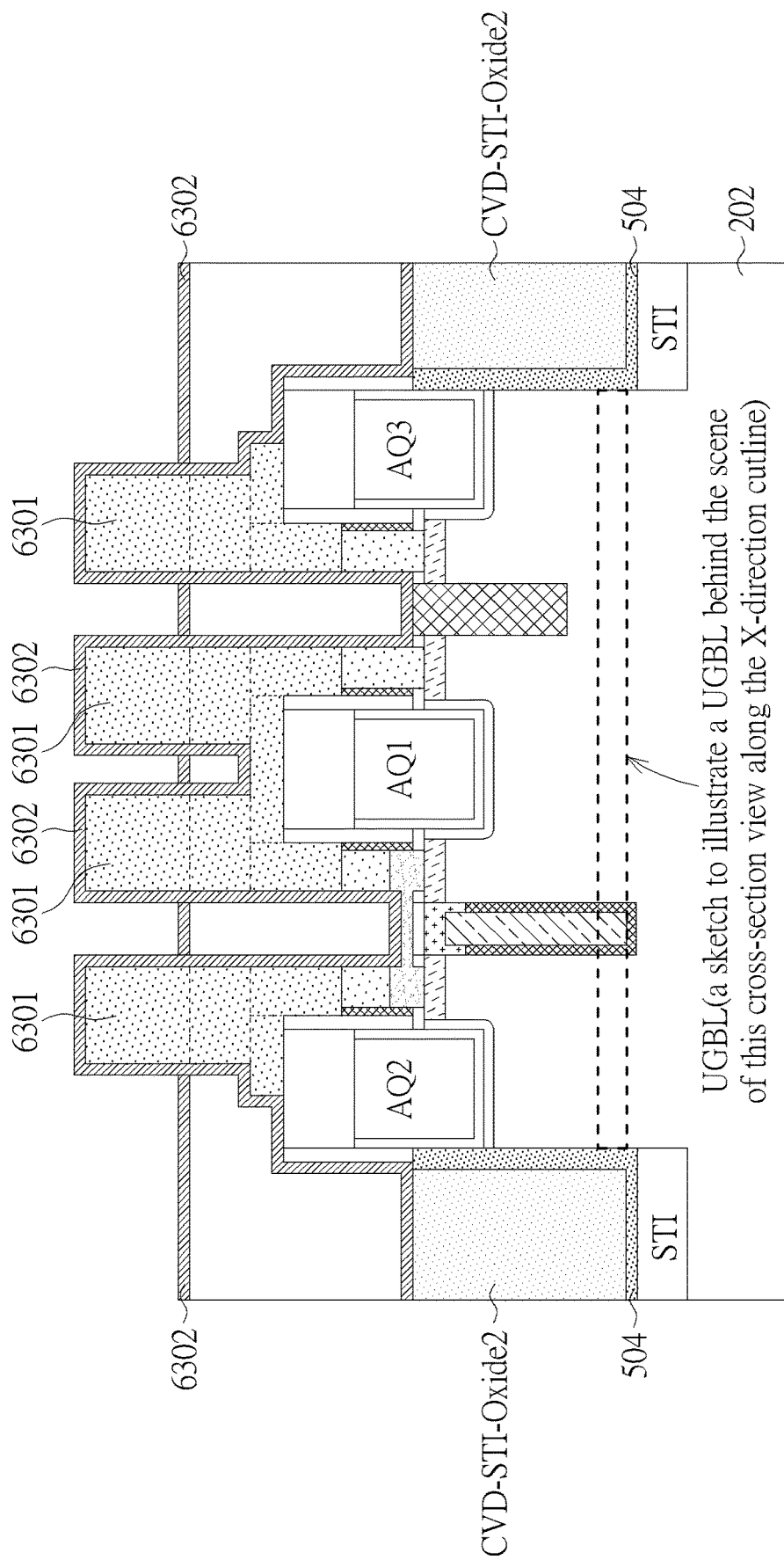
FIG. 63 is a diagram illustrating the taller, heavily n+ in-situ-doped silicon tower as the storage electrode of the storage capacitor being grown by taking the exposed silicon material on the top of the STSEC-1 as seed, the high-K-dielectric-insulator-2 being etched, and the high-K-Dielectric-Insulator-3 being formed.

Step 198: Grow taller, heavily n+ in-situ-doped silicon tower 6301, etch the high-K-dielectric-insulator-2 6002, and form a high-K-Dielectric-Insulator-3 6302 (FIG. 63).

Figure 64:
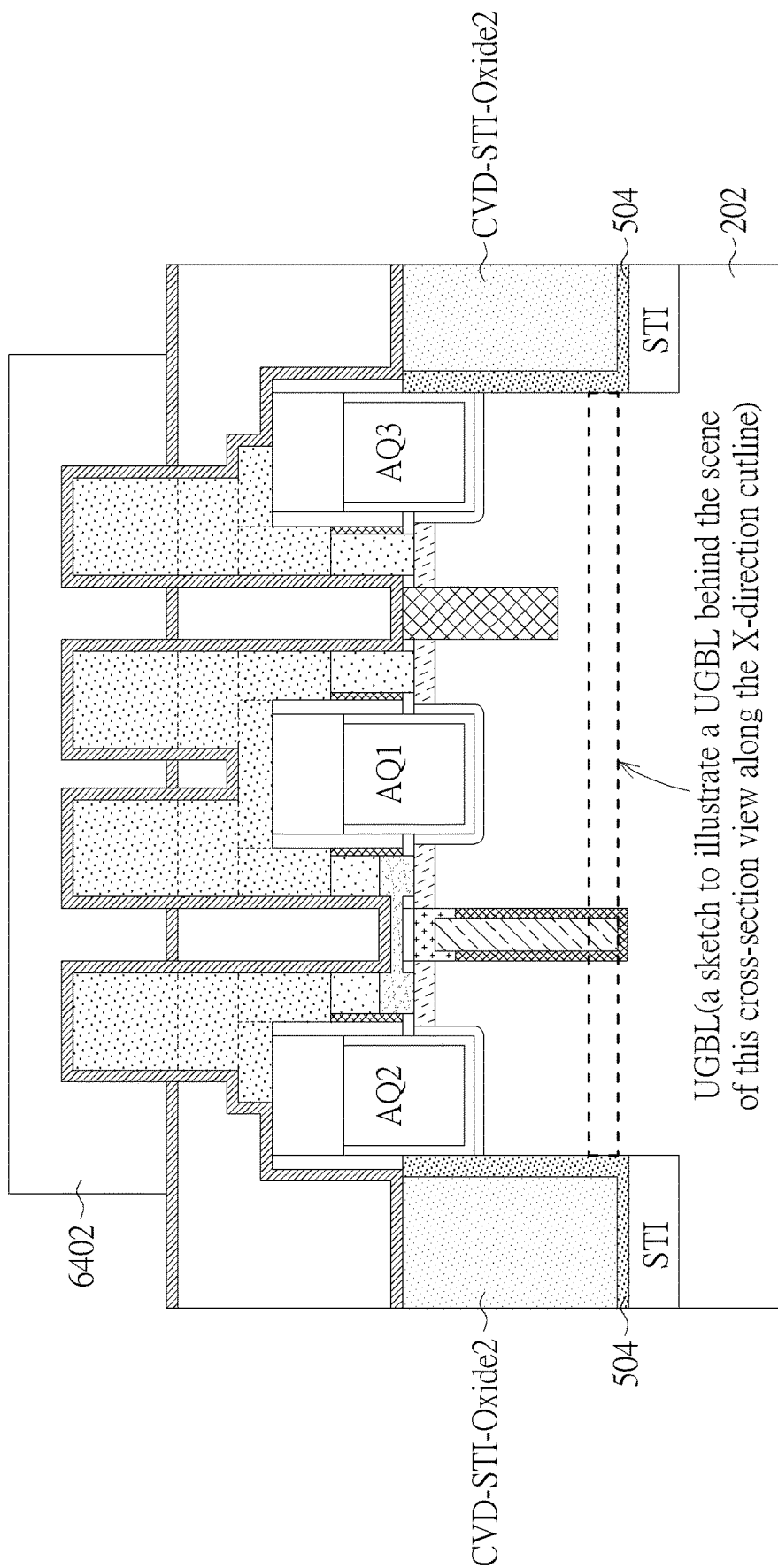
FIG. 64 is a diagram illustrating the photoresist being formed.

Step 199: Form photoresist 6402 (FIG. 64).

Figure 65:
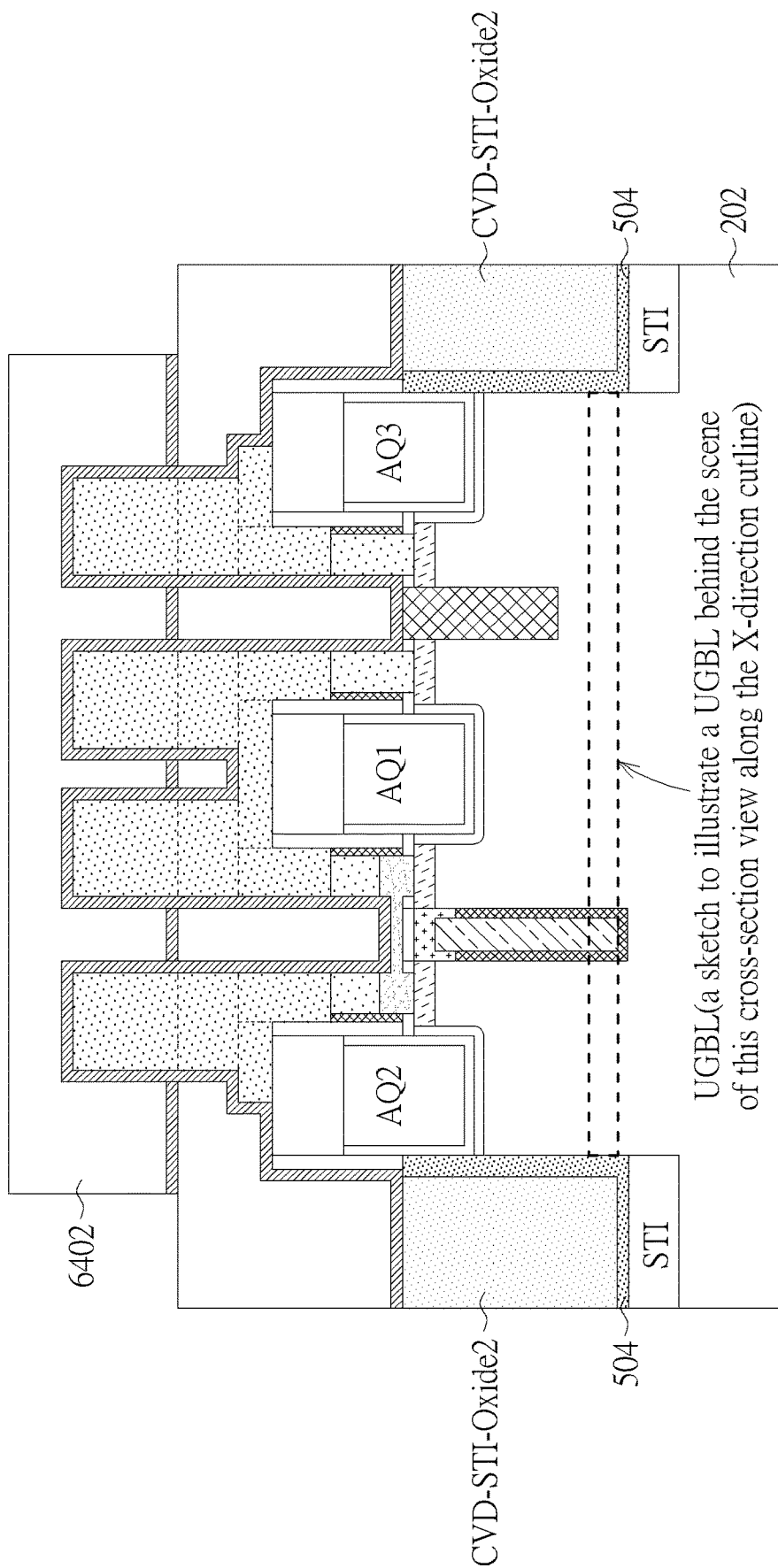
FIG. 65 is a diagram illustrating the high-K-dielectric-insulator-3 on the exposed edge areas of the MCEPW-2 being etched away.

Step 200: Etch away the high-K-dielectric-insulator-3 6302 on the exposed edge areas of the MCEPW-2 (FIG. 65).

Figure 66:
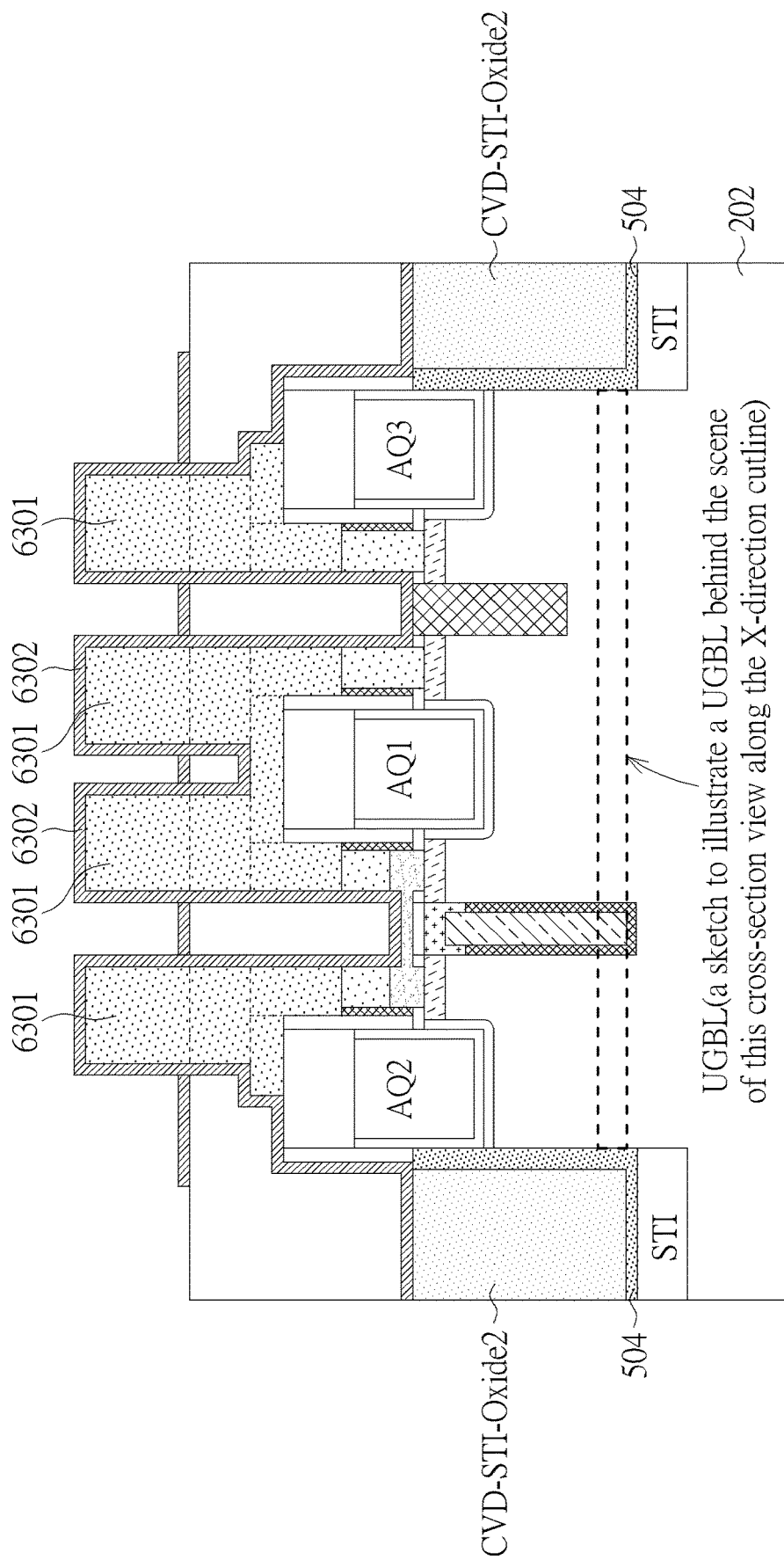
FIG. 66 is a diagram illustrating the photoresist being removed.

Step 201: Remove the photoresist 6402 (FIG. 66).

Figure 67:
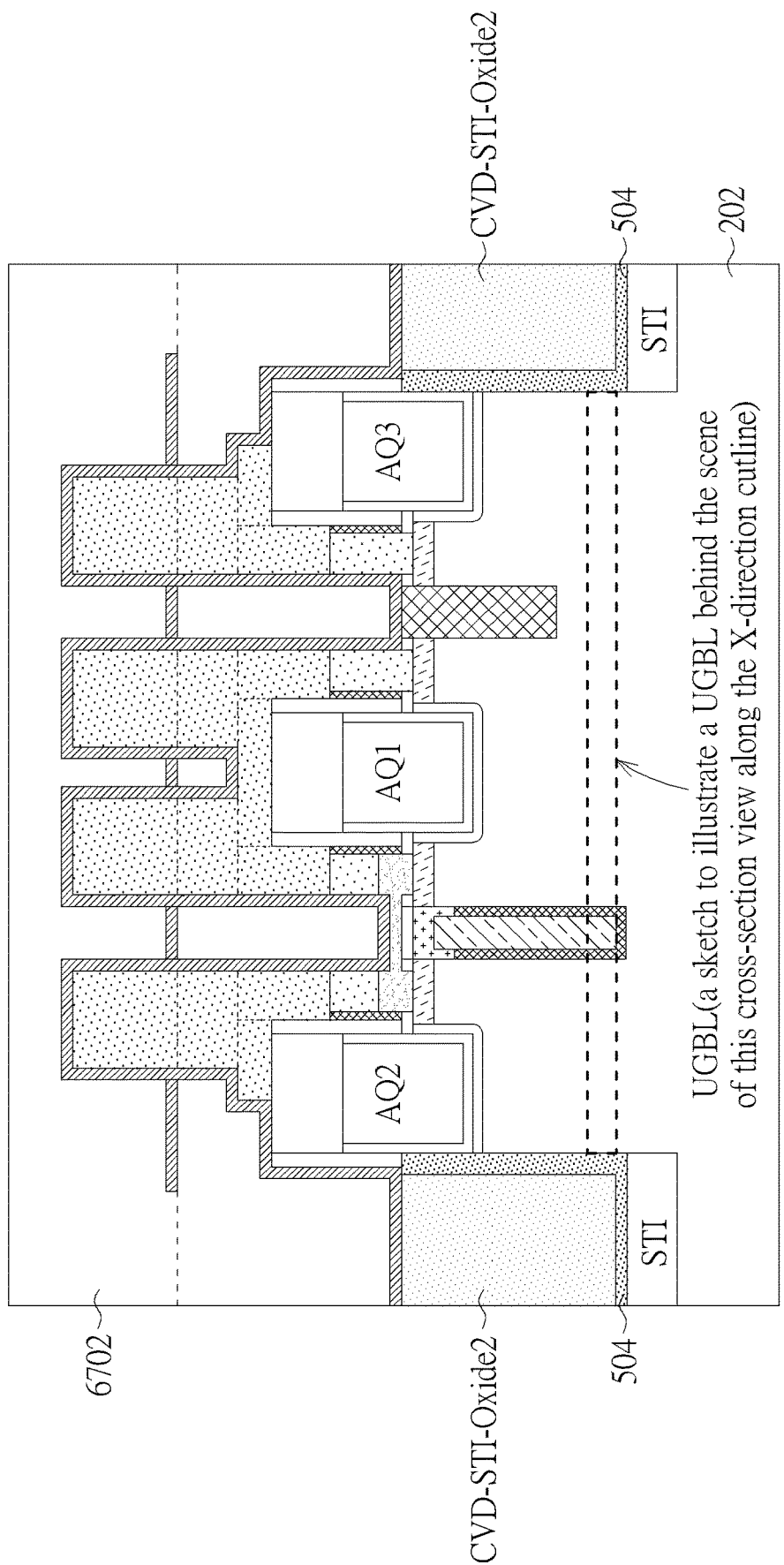
FIG. 67 is a diagram illustrating the metal layer being deposited to complete the counter-electrode plate of the storage capacitor.

Step 202: Deposit and etch back the thick metal layer 6702 to complete the HCoT cell (FIG. 67).

The possible material of the metal layer used in the aforesaid process steps (such as shown in FIG. 6 for Underground bit line, FIG. 13 for word line, electrodes and/or counter electrodes of the capacitor, etc.) could be Tungsten, but due to the sensitivity of Tungsten materials to oxide or oxidation process, it is better that the tungsten layer could be covered by another TiN layer or suitable layer. In this invention, detailed protection process for the tungsten layer is not described, but it is assumed that the metal layers including Tungsten layers are well treated to avoid any oxidation directly over it. Of course, there are some appropriate metal layers suitably used for Underground bit lines and word lines rather than be limited a specific type of metal material which is not suitably inserted in the integrated process.

Detailed description of the aforesaid manufacturing method is as follows. Start with a p-type silicon wafer (i.e. the p-type substrate 202). In Step 102, as shown in FIG. 2(*a*), the pad-oxide layer 204 is formed above a horizontal surface 208 (i.e. named as a horizontal silicon surface (HSS) or original silicon surface (OSS) if the substrate is silicon substrate, hereinafter the horizontal silicon surface or HSS is used as example) and then the pad-nitride layer 206 is deposited above the pad-oxide layer 204.

In Step 104, the active regions of the DRAM cell array can be defined by the photolithographic mask technique, wherein as shown in FIG. 2(*a*), the active regions of the DRAM cell array correspond to the pad-oxide layer 204 and the pad-nitride layer 206, and the horizontal silicon surface 208 outside an active region pattern is exposed accordingly. Because the horizontal silicon surface 208 outside the active region pattern is exposed, the parts of the silicon material corresponding to the horizontal silicon surface 208 outside the active region pattern can be removed by an anisotropic etching technique to create the trench (or canal) 210, wherein for example, the trench 210 can be 250 nm deep below the HSS.

In Step 106, the oxide layer 214 is deposited to fully fill the trench 210 and then the oxide layer 214 is etched back such that the STI inside the trench 210 is formed below the HSS. In addition, FIG. 2(*b*) is a top view corresponding to FIG. 2(*a*), wherein FIG. 2(*a*) is a cross-section view along an X direction shown in FIG. 2(*b*). In addition, as shown in FIG. 2(*a*), for example, the STI has a thickness about 50 nm and a top of the STI is about 200 nm deep below the HSS if the trench 210 is 250 nm deep below the HSS.

In Step 108, as shown in FIG. 3(*a*), the nitride-1 layer is deposited and etched back by the anisotropic etching so as to create the nitride-1 spacers along both edges (i.e. an upper edge and a lower edge) of the trench 210. In Step 110, as shown in FIG. 3(*a*), the SOD 304 is deposited in the trench 210 above the STI to fill the trench 210. Then, the SOD 304 is planarized by the CMP technique to make a top of the SOD 304 as high as a top of the pad-nitride layer 206.

In Step 112, as shown in FIG. 3(*a*), lower edge nitride-1 spacers of the nitride-1 spacers along the lower edge of the trench 210 are protected by utilizing the photolithographic mask technique through the photoresist layer 306, but upper edge nitride-1 spacers of the nitride-1 spacers along the upper edge of the trench 210 are unprotected. That is, after the photoresist layer 306 is deposited above the SOD 304 and the pad-nitride layer 206, because a part of the photoresist layer 306 above the upper edge nitride-1 spacer is removed but a part of the photoresist layer 306 above the lower edge nitride-1 spacer is kept, the lower edge nitride-1 spacer can be protected and the upper edge nitride-1 spacer can be removed later. In addition, FIG. 3(*b*) is a top view corresponding to FIG. 3(*a*), wherein FIG. 3(*a*) is a cross-section view along a cut line of a Y direction shown in FIG. 3(*b*). In Step 114, as shown in FIG. 4, the upper edge nitride-1 spacer and the SOD 304 not covered by the photoresist layer 306 are etched away by etching process.

In Step 116, as shown in FIG. 5, both the photoresist layer 306 and the SOD 304 are stripped off, wherein the SOD 304 has much higher etching rate than that of thermal oxide and some deposited oxide. Then, the oxide-1 layer 502 is grown thermally to form oxide-1 spacer to cover the upper edge of the trench 210, wherein the oxide-1 layer 502 is not grown over the pad-nitride layer 206, and the STI may have only much thinner oxide layer (called as an oxide-1/STI layer 504) added over it. As shown in FIG. 5, Step 116 results in asymmetric spacers (the lower edge nitride-1 spacer and the oxide-1 spacer) on two symmetrical edges (the upper edge and the lower edge) of the trench 210, respectively. For example, a thickness of the oxide-1 spacer is 4 nm and a thickness of the lower edge nitride-1 spacer is 3 nm. In other words, the asymmetric spacers are formed along the sidewalls of active regions. A structure of the asymmetric spacers (shown in FIG. 5) and the above-mentioned related steps are key invention of the present invention, which is named as asymmetric spacers on two symmetrical edges of a trench or a canal (ASoSE).

In Step 118, as shown in FIG. 6, the metal layer 602 (or a conductive material which needs to sustain the subsequent processing conditions) is deposited to fully fill the trench 210 and planarized by the CMP technique to make a top of the metal layer 602 be leveled off equally with the top of the pad-nitride layer 206 (shown in FIG. 6). In addition, in one embodiment of the present invention, the metal layer 602 can be Tungsten which is abbreviated as W.

In Step 120, as shown in FIG. 7, the photoresist layer 702 is deposited cover both the lower edge nitride-1 spacer and the oxide-1 spacer but to expose two edges of the lower edge nitride-1 spacer and the oxide-1 spacer corresponding to the ends of the active region.

In Step 122, as shown in FIG. 8, the metal layer 602 corresponding to the ends of the active region is etched until a top of the oxide-1/STI layer 504 is exposed to separate the multiple conductive lines (i.e. the metal layer 602).

In Step 124, as shown in FIG. 9(*a*), after the photoresist layer 702 is removed, the metal layer 602 is etched back but left only a reasonable thickness inside the trench 210 to form the conductive line or the underground bit line (UGBL) 902, wherein a top of the underground bit line 902 is much lower than the HSS (e.g., a thickness of the underground bit line 902 is about 40 nm). In addition, as shown in FIG. 9(*a*), the underground bit line (UGBL) 902 is on the top of the STI and both sidewalls of the underground bit line (UGBL) 902 are bounded by the asymmetric spacers, that is, the lower edge nitride-1 spacer and the oxide-1 spacer, respectively. In addition, FIG. 9(*a*) is a cross-section view along the Y direction shown in FIG. 9(*b*).

In Step 126, as shown in FIG. 10 (the cross-section view along the Y direction shown in FIG. 9(*b*)), the oxide-2 layer 1002 (called as CVD-STI-oxide2) needs to be thick enough to fill the trench 210 over the underground bit line 902, and then the oxide-2 layer 1002 is polished back to reserve some part which is leveled as high as the top of the pad-nitride layer 206, and covers both the lower edge nitride-1 spacer and the oxide-1 spacer. As shown in FIG. 10, Step 126 can make the underground bit line 902 (i.e. an interconnection line) embedded and bounded by all insulators (i.e. an isolation region) inside the trench 210 (and later the underground bit line 902 will be connected to drains of access transistors of the DRAM cell array) which is named as underground bit-lines (UGBL) surrounded by insulators. The UGBL is another key invention of the present invention.

The following descriptions introduce how to form both the access transistors and word lines of the DRAM cell (1T1C cell) array and the word lines connect all associated gate structures of the access transistors simultaneously by a self-alignment method and thus both the gate structures and the word lines are connected as one body of metal such as Tungsten (W).

In Step 128, as shown in FIG. 11(a), first, the thick oxide-3 layer 1102, the thick nitride-2 layer 1104, and the patterned photoresist 1106 are deposited. Then, the unnecessary parts of the oxide-3 layer 1102 and the nitride-2 layer 1104 are removed by using etching technique. A transistor/word line pattern will be defined by the composite layers of the oxide-3 layer 1102 and the nitride-2 layer 1104, wherein the composite layers of the oxide-3 layer 1102 and the nitride-2 layer 1104 consists of multiple stripes in a direction perpendicular to a direction of the active region. Therefore, as shown in FIG. 11(a) and FIG. 11(b), longitudinal (the Y direction) stripes (the oxide-3 layer 1102 and the nitride-2 layer 1104) for defining the access transistors and word lines are formed, wherein the active region is located at cross-point square between the longitudinal stripes, wherein FIG. 11(a) is a cross-section view along the X direction shown in FIG. 11(b).

As shown in FIG. 11(b), a top view reveals fabric-like checkerboard patterns with the longitudinal stripes of the oxide-3 layer 1102 and the nitride-2 layer 1104 over the pad-nitride layer 206 and the pad-oxide layer 204, and both the active region and the STI are in a horizontal direction (i.e. the X direction shown in FIG. 11(b)). The active region allows the access transistors to be made by a kind of a self-alignment technique. Such a checkerboard fabric proposal for making self-aligned structures of making the gate structures of the access transistors and the word lines in one processing step is another key invention of the present invention.

In Step 130, as shown in FIG. 12(a), the photoresist layer 1106 is kept so as to the pad-nitride layer 206 is etched but the pad-oxide layer 204 is retained, and as shown in FIG. 12(b), both the photoresist layer 1106 and the pad-oxide layer 204 are removed. As a result, the horizontal silicon surface 208 (i.e. the HSS) is exposed at the cross-point squares (shown in FIG. 12(b)) corresponding to the active regions.

In Step 132, as shown in FIG. 13, the HSS exposed at the cross-point squares is etched by the anisotropic etching technique to create the concave (such as U-shape), wherein the U-shaped concave is for a U-shaped channel 1302 of the access transistor, and for example, a vertical depth of the U-shaped concave can be around 60 nm from the HSS. Since the U-shaped concave of the access transistor is exposed, a channel doping design can be achieved by somewhat well-designed boron (p-type dopant) concentration to dope the U-shaped channel 1302 of the U-shaped concave for a desired threshold voltage of the access transistor after a subsequent high-k metal-gate structure formation. The suitable high-k insulator layer 1304 is formed as a gate dielectric layer of the access transistor, wherein a top of two edges of the high-k insulator layer 1304 is higher than the HSS. Afterwards select a suitable gate material 1306 that is appropriate for a word line conductance and can achieve a targeted work-function performance for the access transistor to have a lower threshold voltage (a goal of selecting the suitable gate material 1306 is to reduce a boosted word line voltage level to be as low as possible but provide sufficient device drive in completing enough amount of charges to be restored into the capacitor and, on the other hand, in facilitating faster charge transfer for signal sensing).

The gate material 1306 is thick enough to fill in the U-shape concaves (shown in FIG. 13) between two adjacent longitudinal stripes (the oxide-3 layer 1102 and the nitride-2 layer 1104). Then, the gate material 1306 is etched back to result in a longitudinal (the Y direction) word line which is sandwiched between two adjacent longitudinal stripes (the oxide-3 layer 1102 and the nitride-2 layer 1104). For example, the gate material 1306 can be Tungsten (W) of forming the high-k metal-gate structure which allows a design of desired lower threshold voltage of the access transistor if with a suitable channel doping concentration.

The newly proposed access transistor (hereafter called as U-transistor) with the U-shaped channel 1302 is different from a recessed transistor commonly used in the state-of-the-art buried word line design. The U-transistor has its body with two sides bounded by the CVD-STI-oxide2 along the Y direction (i.e. a channel width direction) and its channel length including a depth of one edge of the U-shaped channel 1302 on a side corresponding to a drain of the U-transistor, a length of a bottom of the U-shaped channel 1302, and a depth of another edge of the U-shaped channel 1302 on a side corresponding to a source of the U-transistor. For example, if the vertical depth of the U-shaped concave is around 60 nm and a U opening of the U-shaped concave is around 7 nm along the X direction (i.e. a channel-length direction), a total channel length of the U-transistor is around 127 nm. In contrast, a channel length of the recessed transistor must be more dependent on how deep a gate material of the recessed transistor be recessed and how deep a source and a drain junctions of the recessed transistor be formed.

Due to a structure difference between the U-transistor and the recessed transistor, the channel length of the U-transistor can be much better controlled especially when the channel length of the U-transistor does not depend on a height of the gate of the U-transistor. In addition, since the HSS is fixed, the dopant concentration profiles of the drain and the source of the U-transistor, respectively, are much more controllable with less device-design-parameter variations as revealed more clearly as to be described later about how to complete the drain and the source of the U-transistor. In addition, forming simultaneously the gate structure of the U-transistor and the word line in the longitudinal direction by self-alignment between the two adjacent longitudinal stripes (the oxide-3 layer 1102 and the nitride-2 layer 1104) is such a way that the word line is not below the HSS, wherein that the word line is not below the HSS presents quite different design and performance parameters from the commonly used buried word line. In addition, a height of the word line (i.e. the gate material 1306) is designed to be lower than that of the composite layers (composed of the oxide-3 layer 1102 and the nitride-2 layer 1104) by using the etching-back technique (shown in FIG. 13). A structure design of the gate structure of the U-transistor connected in self-alignment to the word line is another key invention of the present invention.

In Step 134, as shown in FIG. 14, the nitride-3 layer 1402 (i.e. dielectric cap) is deposited and the oxide-4 layer 1404 is subsequently deposited, wherein the nitride-3 layer 1402 and the oxide-4 layer 1404 are stacked up with total thickness being large enough to fill the vacancy between the two adjacent longitudinal stripes (the oxide-3 layer 1102 and the nitride-2 layer 1104). Then, the oxide-4 layer 1404 and the nitride-3 layer 1402 are etched back (or polished back) to be leveled off to a top of the nitride-2 layer 1104 so as to form a composite stack composed of the oxide-4 layer 1404 and the nitride-3 layer 1402 directly above the word line (i.e. the gate material 1306).

In Step 136, as shown in FIG. 15, the nitride-2 layer 1104 is etched away by the anisotropic etching technique and the oxide-4 layer 1404/the nitride-3 layer 1402 are left above the word line. Then, the oxide-3 layer 1102 is also etched away by the anisotropic etching to expose the pad-nitride layer 206. The gate structure (such as, the oxide-4 layer 1404/the nitride-3 layer 1402/the gate material 1306) is achieved for both the gate of the U-transistor inside the U-shaped concave and the word line in the longitudinal direction (i.e. the Y direction).

In Step 138, as shown in FIG. 16, the pad-nitride layer 206 is removed everywhere to leave the pad-oxide layer 204. The CVD-STI-oxide2 (i.e., the oxide-2 layer 1002) is etched back to be leveled as high as the top of the pad-oxide layer 204.

In Step 140, as shown in FIG. 16, the nitride-4 layer 1602 is deposited and etched by the anisotropic etching technique to create nitride-4 spacer with well-designed suitable thickness. Then, the oxide-5 layer 1604 is deposited and etched by the anisotropic etching technique to create an oxide-5 spacer. Then, the polysilicon-1 layer 1606 (intrinsic and undoped) is deposited over the entire surface and etched by the anisotropic etching technique to create polysilicon-1 spacer to make the surround word lines (e.g. word line-1, word line-2, word line-3). Therefore, in summary, there are the polysilicon-1 spacer is outside the oxide-5 spacer, and the oxide-5 spacer is outside the nitride-4 spacer and all the above-mentioned spacers are surrounded and along the gate structure (such as, the oxide-4 layer 1404/the nitride-3 layer 1402/the gate material 1306).

As shown in FIGS. 16, 17, for convenience and clarity of describing the DRAM cell array with word lines and bit lines, the word line located at a center is labeled the word line-1 (corresponding to the access transistor AQ1), the word line next to a left side of the word line-1 is labeled the word line-2 (corresponding to an access transistor AQ2 next to a left side of the access transistor AQ1), and drain region (drain-1 and drain-2) between the word line-1 and the word line-2 still covered by the pad-oxide layer 204 are reserved for the drain of the access transistor AQ1 and a drain of the access transistor AQ2. The word line next to a right side of the word line-1 is labeled the word line-3 (corresponding to an access transistor AQ3 next to a right side of the access transistor AQ1), and source region (source-1 and source-3) between the word line-1 and the word line-3 still covered by the pad-oxide layer 204 are reserved for the source of the access transistor AQ1 and a source of the right access transistor AQ3.

In Step 142, as shown in FIG. 17, the SOD 1702 is deposited, wherein the SOD 1702 is thick enough to fill into the vacancies (corresponding to the drain region and the source region) among the word lines and then the SOD 1702 is polished to a flat level with a top of the oxide-4 layer 1404 by the CMP technique. Then, some upper part of the polysilicon-1 layer 1606 is etched by the anisotropic etching technique. Then, the cap-oxide-1 layer 1704 is deposited to fill in vacancies on top of the polysilicon-1 spacer and then planarized by the CMP technique to be leveled as high as to the top of the oxide-4 layer 1404.

In Step 144, as shown in FIG. 18, the SOD 1702 is etched away, wherein the SOD 1702 has a much higher etching rate than that of deposited or thermally grown oxide layers for them to be kept well. Then, the nitride-5 layer 1802 is deposited over an entire surface shown in FIG. 18.

In Step 146, as shown in FIG. 19, the SOD 1902 is deposited which is thick enough to fill into the vacancies among all word lines and then the SOD 1902 is polished back to a flat level with a top of the nitride-5 layer 1802. Then, the photoresist 1904 is deposited on the flat surface to cover an area reserved for the drain region (i.e. the drain-1 and the drain-2) and to expose an area reserved for the source region (i.e. the source-1 and the source-3). Then, the SOD 1902 corresponding to the areas reserved for the source region is removed by utilizing the nitride-5 layer 1802 surrounding all word lines as a self-alignment mask. All the unnecessary photoresist are removed as the desired pattern has been transferred to the SOD 1902 and thus the SOD 1902 is planarized as shown in FIG. 19.

In Step 148, as shown in FIG. 20, the exposed nitride-5 layer 1802 and the pad-oxide layer 204 at a center of the source region between two word lines (the word line-1 and the word line-3) are etched away so as to expose the HSS. Because the exposed HSS is located between the source-1 of the access transistor AQ1 and the source-3 of the access transistor AQ3, the exposed HSS between the source-1 and the source-3 can be called as HSS-1/3. As shown in FIG. 20, the HSS-1/2 between the word line-1 and the word line-2 will be used as a location for the drain-1 (i.e. the drain of the access transistor AQ1) and the drain-2 (i.e. the drain of the access transistor AQ2), and also as a location for connecting the access transistors AQ1, AQ2 vertically to the UGBL. In addition, on the other right side of the word line-1, the HSS-1/3 between the word line-1 and the word line-3 will be used for the source-1 (i.e. the source of the access transistor AQ1) and the source-3 (i.e. the source of the access transistor AQ3), but the source-1 and the source-3 are separate and cannot be connected as the source-1 and the source-3 will later be connected to extra cell storage nodes CSN1, CSN3 (not shown in FIG. 20), respectively.

In addition, in summary, the photolithographic mask technique is used above to cover the HSS-1/2, but a mask utilized by the photolithographic mask technique is not a critical mask and the only function is to allow treating the HSS-1/3 separately from processing over the HSS-1/2. As stated in the above, the SOD 1902 is deposited to be thick enough for making a smooth surface topography and then the photoresist 1904 is deposited to act as mask material to protect the SOD 1902 covering the drain region but expose the source region. In addition, using a SOD is because SOD has very high etching rate to be removed without hurting other existing materials and the SOD is resistant to other thermal processes than photoresist.

As shown in FIG. 20, the silicon material (corresponding to the center of the source region) below the HSS-1/3 is dug by the anisotropic etching technique to generate the hole-1/3 which is surrounded by the lower edge nitride-1 spacer and the oxide-1 spacer on two opposite sides (not shown in FIG. 20) and by the silicon substrate 202 on the other two opposite sides, respectively.

In Step 150, as shown in FIG. 21, then the photoresist 1904 is removed, the oxide-7 layer 2102 is grown thermally to fill the hole-1/3, and the oxide-7 layer 2102 is grown partially on a top of the cap-oxide-1 layer 1704 and not elsewhere because of no growth of oxide on the nitride-5 layer 1802. The oxide-7 layer 2102 filling the hole-1/3 is called as oxide-7 plug which has a smooth surface leveled as high as the top of the pad-oxide layer 204.

In Step 152, as shown in FIG. 22, the another SOD layer 2202 is deposited, wherein the another SOD layer 2202 is thick enough to fill into the vacancy on a top of the oxide-7 layer 2102 in the hole-1/3, and top material of the another SOD layer 2202 is removed by the CMP technique until a top of the another SOD layer 2202 is leveled off as high as a top of the nitride-5 layer 1802.

In Step 154, as shown in FIG. 23, the photoresist 2302 is deposited to cover the area corresponding to the source region and to expose the area reserved for the drain region, wherein a mask utilized in Step 154 is not a critical mask and the only function is to allow processing on the HSS-1/2 separately from the processing over the HSS-1/3). Then, the exposed SOD 1902, the exposed nitride-5 layer 1802, and the exposed pad-oxide layer 204 underneath are removed in order to expose the HSS (i.e. the HSS-1/2). Then, the silicon material corresponding to the HSS-1/2 is dug and removed by the anisotropic etching to generate the hole-1/2, wherein the hole-1/2 is physically surrounded by two opposite sides of the silicon substrate 202, respectively, the third side by the lower edge nitride-1 spacer, and the fourth side by the oxide-1 spacer, and both the third side and the fourth side are further bounded outside by the CVD-STI-oxide2 (not shown in FIG. 23).

In Step 156, as shown in FIG. 24, the photoresist 2302 is removed and the oxide-8 layer 2402 is thermally grown to generate an oxide-8 spacer to cover three inner sidewalls of four sidewalls of the hole-1/2 and a bottom of the hole-1/2 except the third sidewall covered by the lower edge nitride-1 spacer. In addition, the oxide-8 layer 2402 is grown partially on the top of the cap-oxide-1 layer 1704. FIG. 25 is a diagram illustrating a cross-section view of the DRAM cell array along a Y2 direction which is extended along the center of the hole-1/2 and perpendicular to the X direction, wherein as shown in FIG. 25, the active region is sandwiched by the CVD-STI-oxide2, the bit line (UGBL), the oxide-1 spacer, and the lower edge nitride-1 spacer.

In Step 158, as shown in FIGS. 26, 27, the lower edge nitride-1 spacer on the third sidewall inside the hole-1/2 is removed by the isotropic etching technique and the nitride-5 layer 1802 is removed at the same time (as shown in FIG. 27, since the lower edge nitride-1 spacer is so thin so that the isotropic etching technique should not hurt the other structures over the HSS, and should neither remove the oxide-8 layer 2402 inside the hole-1/2).

In Step 160, as shown in FIG. 28, the metal layer (e.g. Tungsten) 2802 is deposited, wherein the metal layer 2802 is thick enough to fill in the hole-1/2 and then all the metal layer 2802 over the HSS is etched back by the isotropic etching technique to leave Tungsten plug inside the hole-1/2, and the Tungsten plug is connected with the UGBL through its opening at the third sidewall of the hole-1/2 which was originally covered by the lower edge nitride-1 spacer. Then, the nitride-6 layer 2804 is deposited and etched by the anisotropic etching technique to create the nitride-6 spacer surrounding the polysilicon-1 spacer corresponding to the reserved drain regions.

In Step 162, as shown in FIG. 29, some upper portion of the Tungsten plug below the HSS is etched back, wherein as shown in FIG. 30, the Tungsten plug is connected to the UGBL from its sidewall of the Tungsten plug to a sidewall of the UGBL inside the hole-1/2.

In Step 164, as shown in FIG. 31, the upper portion of the oxide-8 layer 2402 is removed by a well-designed amount through the anisotropic etching technique, resulting in the oxide-8 spacer having a lower height than a height of the Tungsten plug accordingly. Some of the cap-oxide-1 layer 1704 may be etched as well, as shown in FIG. 31.

In Step 166, as shown in FIG. 32, the n+ in-situ doped silicon layer 3202 is grown laterally from the two exposed silicon edges (above and adjacent to the oxide-8 layer 2402 and the Tungsten plug) by utilizing the selective epitaxy silicon growth (SEG) technique, thus resulting in a necklace-type conductive n+ silicon drain (named as n+ silicon drain-collar) connecting to the HSS on two sides of the hole-1/2 as the drain-1 and the drain-2 of the access transistors AQ1, AQ2, respectively, and also as a conductive bridge (i.e. bridge contact) between the UGBL and the access transistors AQ1, AQ2.

In Step 168, as shown in FIG. 33, the oxide-9 layer 3302 with a well-designed thickness is thermally grown locally over the n+ silicon drain-collar to cap the HSS-1/2 (and such oxide-9 layer 3302 may cover the cap-oxide-1 layer 1704). The above connection method of making an underlined bridge contact between the UGBL and the drain-1 (the drain-2) is another key invention of the present invention, wherein the drain-1 and the drain-2 are oxide-capped n+ drains.

In Step 170, as shown in FIG. 34, the portion of the oxide-9 layer 3302 covering the n+ silicon drain-collar may be etched back in a thickness with its height as that of the pad-oxide 204, and the oxide-9 layer 3302 covering the cap-oxide-1 layer 1704 is etched away. Then, deposit the thick intrinsic polysilicon-a layer 3402 inside the vacancy above the oxide-9 layer 3302 above the hole-1/2 and etch back the polysilicon-a layer 3402.

In Step 171, as shown in FIG. 35, remove the nitride-6 spacer (the nitride-6 layer 2804) by the isotropic etching technique. Deposit the intrinsic polysilicon-b layer 3502 and then use the anisotropic etching technique to etch back the polysilicon-b layer 3502 to leave some residues to fill into the vacancies right adjacent to the polysilicon-a layer 3402 and form almost the same thickness of both the polysilicon-a layer 3402 and the polysilicon-b layer 3502.

Figure 37:
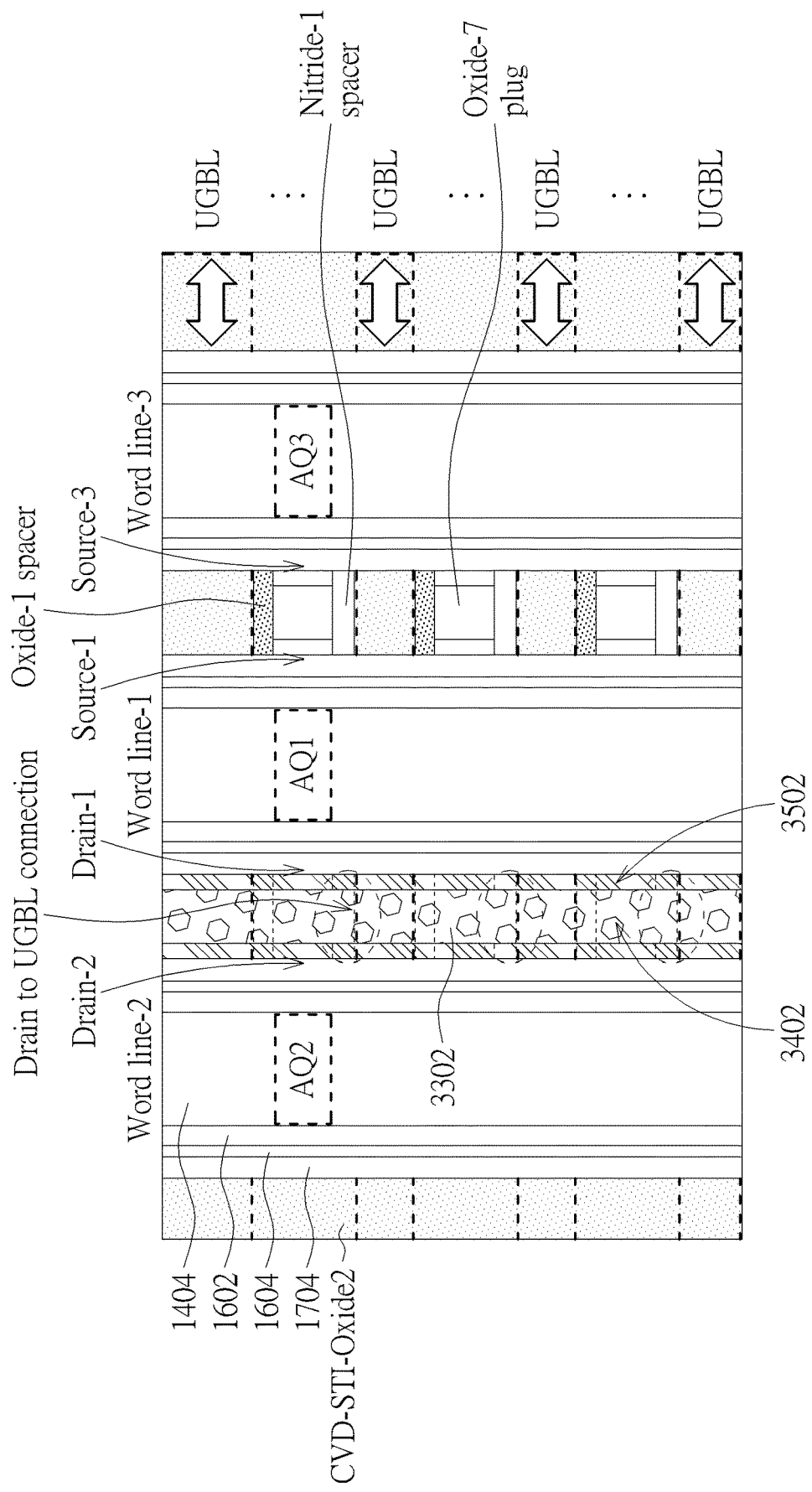
FIG. 37 is a diagram illustrating a top view of the structure of the HCoT cell array.

In Step 172, as shown in FIG. 36, all the SODs (i.e. the SOD layer 1902 and the another SOD layer 2202) are removed and the nitride-5 layer 1802 are removed by the isotropic etching technique. In addition, FIG. 37 shows a top view of the structure of the HCoT cell array which is up to the stage, especially on the geometric arrangement of the word lines (the word line-1, the word line-2, the word line-3), underground bit lines (UGBL), the source region (the source-1 and the source-3) of the access transistors AQ1, AQ3, and the drain region (the drain-1 and the drain-2) of the access transistors AQ1, AQ2.

In Step 173, as shown in FIG. 38, the metal layer (e.g. Tungsten) 3802 is deposited and etched back some portion of the metal layer 3802 to form W-Buffer-Walls (WBW).

In Step 174, as shown in FIG. 39, the cap-oxide-1 layer 1704 over the polysilicon-1 spacer is removed. Then, the polysilcon-1 spacer is etched away and further the pad-oxide layer 204 underneath the polysilicon-1 spacer is removed, and thus the HSS corresponding to the source region and the drain region (called as the seeding HSS area for source and drain regions, SHAR) is exposed, respectively.

In Step 175, as shown in FIG. 40, by using the exposed HSS (SHAR) as the seed, the selective epitaxy silicon growth technology is used to grow both the elevated source electrode EH-1S and the elevated drain electrode EH-1D, respectively, in a vertical direction above the HSS. The elevated source electrode EH-1S and the elevated drain electrode EH-1D could be the pure silicon material rather than polycrystalline or amorphous silicon materials since they are well grown gradually by using the exposed HSS SHAR) as the seed. Both the elevated source electrode EH-1S and the elevated drain electrode EH-1D are surrounded by WBW and the oxide-5 spacer on the left sidewall and the right sidewall along the X-direction. Although the other two sidewalls along the Y-direction are widely opened, the CVD-STI-oxide2 cannot provide the seeding function for growing up the selective epitaxial silicon and therefore the selective epitaxy silicon growth should result in having some laterally over-grown pure-silicon materials which stop on the edges of CVD-STI-oxide2 and have no possibility of causing connections of the neighboring electrodes. In addition, after the elevated source electrode EH-1S and the elevated drain electrode EH-1D are grown, an optional RTA (rapid temperature annealing) step can be utilized to form NLDD (n+ lightly doped drain) 4012 under the elevated source electrode EH-1S or the elevated drain electrode EH-1D, such that the elevated source electrode EH-1S or the elevated drain electrode EH-1D has better electrical connection to channel region of the transistor.

The new processing design of accomplishing the elevated source electrode EH-1S and the elevated drain electrode EH-1D is described as follows:

(1) By using the SHAR as the seed for growing the elevated source electrode EH-1S and the elevated drain electrode EH-1D by the selective epitaxy silicon growth technique, it is important to design a suitable in-situ n-type doping concentration during the silicon growth and then using rapid thermal annealing process to achieve a proper interface conductance of the channel region of the access transistor (which includes those conductances of the silicon surface directly underneath the gate dielectric, the HSS under the nitride-4/oxide-5 spacers and the elevated source electrode EH-1S or the elevated drain electrode EH-1D, respectively) and to achieve lower leakage currents especially on gate induced drain leakage (GIDL), drain induced barrier lowering (DIBL), sub-threshold leakage due to the short-channel effect, and junction leakages.

(2) As shown in FIG. 40, the elevated source electrode EH-1S and the elevated drain electrode EH-1D are grown to a specified height lower than the final height of the EH-1+2 electrodes (i.e. the elevated source electrode EH-1+2S and the elevated drain electrode EH-1+2D). In Step 176, as shown in FIG. 41, the oxide-5 spacer is first etched by the isotropic etching technique to leave a seam between the nitride-4 spacer and the elevated drain electrode EH-1D (and between the nitride-4 spacer and the elevated source electrode EH-1S). Then, the oxide-a layer 4102 is thermally grown to cover the elevated drain electrode EH-1D (or the elevated source electrode EH-1S) on the three side walls and its top (called as oxide-a-cap layer) except that the last fourth sidewall is bounded by the WBW. The purpose of executing such a delicate step-wise source-electrode-formation process as described in the following is to ensure a top of the source electrode EH-1S (or a top of the drain electrode EH-1D) having a high-performance oxide-silicon interface to be achieved because of the thermal oxide-a layer 4102 having very high-quality silicon-dioxide-to-silicon-electrode bonds (with no doubt any suspicion to have instead either an amorphous or a low-quality silicon material derived from the selective-epitaxy-silicon growth process which might degrade the silicon source electrode's quality of having caused either a reduced carrier mobility that might not deliver enough On-current when the access transistor is turned on or an extra amount of defects that might increase the leakage currents when the access transistor is turned off). Then, the cap portion of the oxide-a layer 4102 is etched by the anisotropic etching technique and to leave some oxide-a layer 4102 existing between the nitride-4 spacer and the source electrode EH-1S (or between the nitride-4 spacer and the drain electrode EH-1D).

(3) In Step 177, as shown in FIG. 42, by using the exposed silicon surfaces of the source electrode EH-1S and the drain electrode EH-1D as high-quality silicon seeds to carry out the second selective epitaxial silicon growth to grow the elevated source electrode EH-2S and the elevated drain electrode EH-2D, respectively. During the second selective epitaxial silicon growth, a well-designed heavier in-situ n+ doping concentration can be achieved in the elevated source electrode EH-2S and the elevated drain electrode EH-2D in order to be prepared for a low-resistivity connection between the elevated source electrode EH-2S (or the elevated drain electrode EH-2D) and the storage electrode of the stacked storage capacitor (SSC) which will be made later. The combination of the elevated source electrode EH-1S and the elevated source electrode EH-2S is called as the elevated source electrode EH-1+2S (similarly, the combination of the elevated drain electrode EH-1D and the elevated drain electrode EH-2D is called as the elevated drain electrode EH-1+2D). In addition, taking the elevated source electrode EH-1+2S as an example, as shown in FIG. 42, the upper portion of the elevated source electrode EH-1+2S, i.e. the elevated source electrode EH-2S, has some high-quality, n+ doped silicon material directly abutted to the nitride-4 spacer on one sidewall and the opposite sidewall is abutted to WBW, and the other two sidewalls are widely open on the Y-direction along the longitudinal word line. The height of the elevated source electrode EH-1+2S (the height of the elevated drain electrode EH-1+2D) is well designed to be lower than that of the nitride-4 spacer.

In Step 178, as shown in FIG. 43, deposit the thick SOD-1 layer 4302 over the surfaces of the elevated drain electrode EH-2D and the elevated source electrode EH-2S, respectively and etch back the SOD-1 layer 4302.

In Step 179, as shown in FIG. 44, the WBW is etched away on the entire wafer surface.

In Step 180, as shown in FIG. 45, the nitride-a layer 4502 is deposited and etched by using the anisotropic etching technique to form the nitride-a spacer surrounding all sidewalls of the elevated source electrode EH-1+2S and the elevated drain electrode EH-1+2D, respectively. The difference is that the nitride-a spacer surrounding the elevated source electrode EH-1+2S (the elevated drain electrode EH-1+2D) stand on a top of the polysilicon-a layer 3402 and the polysilicon-b layer 3502 which act like a layer of mattress (but on the side of the elevated source electrode EH-1+2S (the elevated drain electrode EH-1+2D) there is no such the polysilicon-a layer 3402 and the polysilicon-b layer 3502 acting like a layer of mattress.

In Step 181, as shown in FIG. 46, first, use the anisotropic silicon etching technique to remove the polysilicon-a layer 3402 (at this time the rest of the silicon areas such as the elevated drain electrode EH-2D and the elevated source electrode EH-2S are well protected by the SOD-1 layer 4302 and the nitride-a spacer, respectively). Then, use the isotropic etching technique to etch away the polysilicon-b layer 3502 and part of some bottom of the elevated drain electrode EH-1D due to the seam (or like a vacancy) caused by the buffering space owing to the occupied thicknesses of the polysilicon-a layer 3402 and the polysilicon-b layer 3502 which have been removed. It should be noted that (1) some remaining bottom of the elevated drain electrode EH-1D keeps the strength of holding the upper portion of the elevated drain electrode EH-1D due to high-quality silicon bonding forces and (2) the nitride-a spacer is not completely hung on the air as the nitride-a spacer surround the EH-1+2 electrodes with their feet standing on the top of the CVD-STI-oxide2 (i.e., the oxide-2 layer 1002) and with strong glues of the nitride-a spacer due to chemical bonding. The targeted end result of creating this novel process design is to make the HSS below the elevated drain electrode EH-1D to be exposed.

In Step 182, as shown in FIG. 47, carry out a thermal oxidation process to grow the high-quality oxide-bb layer 4702 by thermal chemical reaction between silicon and silicon dioxide at the surface of the exposed HSS shown in FIG. 46, thus resulting in an oxide isolation layer to well isolate the drain region away from the bottoms of the EH-1+2D electrodes that can now be used as part of the storage electrode for the storage capacitor.

In Step 183, as shown in FIG. 48, use the isotropic etching technique to remove the nitride-a spacer and the SOD-1 layer 4302 related to the EH-1+2 electrodes (i.e. the elevated source electrode EH-1+2S and the elevated drain electrode EH-1+2D). Then, in Step 184, as shown in FIG. 49, form the high-K-dielectric-insulator-1 layer 4902.

In Step 185, as shown in FIG. 50, the thick metal layer (such as Tungsten) 5002 is deposited and etched back to remain with its residues of some thickness well-designed to result in a height as slightly taller than the EH-1+2 electrodes (i.e. the elevated source electrode EH-1+2S and the elevated drain electrode EH-1+2D) but about the height like the nitride-4 spacer. The metal layer 5002 prevailing on the wafer surface is called as metal-counter-electrode-plate&wall-1 (MCEPW-1). The MCEPW-1 covers the high-K-cap-1 of the high-K-dielectric-insulator-1 4902 over the EH-1+2 electrodes but may cover the tops of the oxide-4 layer 1404 of the composite stack and the nitride-4 spacer.

In Step 186, as shown in FIG. 51, the high-K-dielectric-insulator-1 4902 over the oxide-4 layer 1404 is removed by the anisotropic etching technique and then the oxide-4 layer 1404 which is the top layer of the composite stack is etched away without damaging the high-K-cap-1 and the high-K-dielectric-insulator-1 4902 covered by the MCEPW-1. So there exists a canal-like concave region above the composite stack that has the nitride-4 spacer on two sides which have their upper portions with heights above the thickness of the nitride-3 layer 1402 and are standing taller like fences but exposed on the direction of facing the canal-like concave regions.

In Step 187, as shown in FIG. 52, some well-designed thickness of the upper portion of the nitride-3 layer 1402 above the composite stack is removed by the isotropic etching technique. At the same time the upper portion of the nitride-4 spacer is also removed by the isotropic etching technique so that the remaining top of the nitride-4 spacer and the top of the nitride-3 Layer 1402 are made to be leveled equally with a horizontal flat surface of both the nitride-3 Layer 1402 and the nitride-4 spacer. A silicon sidewall of the upper portion of the EH-2 electrodes facing to the nitride-4 spacer is exposed due to the isotropic etching technique which causes that the height of the nitride-4 spacer was lowered after the nitride-4 spacer lost its upper portion.

In Step 188, as shown in FIG. 53, by using the exposed silicon sidewall of the EH-2 electrodes (i.e. the elevated source electrode EH-2S and the elevated drain electrode EH-2D) facing to the word line direction, the selective epitaxial silicon growth technique is used to grow the n+ in-situ doped silicon material laterally over the nitride-3 layer 1402. By taking the word line-1 as a reference, there are the elevated source electrode EH-1+2S on one side of the word line-1 and the elevated drain electrode EH-1+2D on the other side of the word line-1, respectively. By controlling the growth time, both the laterally grown epitaxial silicon from the elevated source electrode EH-2S (called as LGS-2S) and the laterally grown epitaxial silicon from the elevated drain electrode EH-2D (called as LGS-2D) is not allowed to meet each other at the center of the word line-1, but instead there exists a well-designed gap in a horizontal space (or vacancy).

In Step 189, as shown in FIG. 54, deposit the thick high-quality nitride-cc layer 5402 and use the CMP technique to expose both the LGS-2D and the LGS-2S with a remaining nitride-cc isolation layer (the nitride-cc layer 5402) in between the LGS-2D and the LGS-2S so as to completely separate the LGS-2D and the LGS-2S. At the same time, the upper portions of both the MCEPW-1 and the high-K-dielectric-insulator-1 4902 are removed by either the CMP technique or etching back and the remaining part is leveled up with the height as that of the LGS-2D and the LGS-2S, respectively.

In Step 190, as shown in FIG. 55, remove the MCEPW-1 (i.e. the metal layer 5002).

In Step 191, as shown in FIG. 56, by using the exposed LGS-2D and the exposed LGS-2S as seeds (called as SBSES-D and SBSES-S, respectively with the abbreviation of SBSES as Seeding Base for Growing Storage-Electrode Skyscraper), carry out the selective epitaxy silicon growth of creating the twin-tower-like storage electrode for the storage capacitor which will be shown how to be completed in the following description (herewith are two twin towers of electrodes: that the high-raised electrode on the drain side is named as LGS-2D-Tower and the other high-raised electrode on the source side is named as LGS-2S-Tower, respectively).

In Step 192, as shown in FIG. 57, grow thermally the thin oxide-d layer 5702 and use the anisotropic etching technique to remove the oxide-d layer 5702 on tops of the LGS-2D-Tower and the LGD-2S-Tower but form the oxide-d spacer. Use the isotropic etching technique to remove nitride-cc layer 5402 so as to expose the side edges of the LGS-2D and the LGS-2S, respectively.

In Step 193, as shown in FIG. 58, use the selective epitaxy silicon growth technique to grow laterally more heavily n+ in-situ-doped silicon layers from exposed silicon areas of both the LGS-2D and the LGS-2S until a new connected silicon layer (called as LGS-2DS) is formed. In addition, as shown in FIG. 58, also use the selective epitaxy silicon growth technique to grow vertically more heavily n+ in-situ-doped silicon layers from the tops of the LGS-2D-Tower and the LGD-2S-Tower. As shown in FIG. 58, the horizontal connection region (which may include the LGS-2DS) connects one vertical protrusion region (e.g. the elevated drain electrode EH-1+2D) and the other vertical protrusion region (e.g. the elevated source electrode EH-1+2S) of the H-capacitor. The horizontal connection region is not necessary to be coupled to the middle of each protrusion region, it could be higher or lower.

In Step 194, as shown in FIG. 59, then remove the oxide-d spacer. In Step 195, as shown in FIG. 60, use the isotropic etching technique to remove the high-K-dielectric-insulator-1 4902 and form the high-K-dielectric-insulator-2 6002 surrounding the grown twin-tower storage electrodes.

In Step 196, as shown in FIG. 61, deposit the thick metal layer (e.g. Tungsten) 6102 (MCEPW-2), and then etch back the metal layer 6102 or use the CMP technique to polish the metal layer 6102 to result in a planar surface. This shows the newly invented HCoT cell which has a twin-tower-like H-shape storage electrode (of the storage capacitor) fully surrounded with the high-K-dielectric-insulator-2 6002 outside of which is completely covered by a counter-electrode-plate metal layer (i.e. the metal layer 6102) bused at a fixed voltage (e.g. Half-VCC). As shown in FIG. 61, the newly constructed storage capacitor encompasses the access transistor AQ1 like a saddle tightly clamping over the access transistor AQ1 with a fully expanded surface area of the storage electrode ranging from the HSS at the bottom of the elevated source electrode EH-1S of the access transistor AQ1, straight up to the top of the signal-tower storage electrode of the storage capacitor (called as STSEC-1), surrounding all the surface areas of the LGS-2S-Tower, then through the other three sidewalls of the LGS-2S, across the all four sidewalls of the LGS-2D-Tower until down to the top of the oxide-bb layer 4702 at the bottom of the elevated drain electrode of the access transistor AQ1. Both all the four-sidewall surfaces surrounding the Twin-towers are almost employed to generate the nearly largest dielectric areas for enlarging the storage capacitance of the storage capacitor as much as possible.

Moreover, if the height of the twin-tower-like storage node must be further extended, then the process from FIG. 62 to FIG. 67 can be used to extend the height of storage nodes so as to further increasing the storage capacitance for the storage capacitor. Furthermore, the connection region between two protrusion regions of the H-capacitor may include multiple horizontal sub-connection regions after repeating the process from FIG. 62 to FIG. 67 several times. Each sub-connection region could connect the two protrusion regions of the H-capacitor.

In Step 197, as shown in FIG. 62, the MCEPW-2 is etched back to a height lower than that of the storage electrode (i.e. the STSEC-1). Then the high-K-dielectric-insulator-2 6002 on the top of the STSEC-1 is etched away by the anisotropic etching technique and only the high-K-dielectric-insulator-2 6002 surrounding the STSEC-1 is kept.

In Step 198, as shown in FIG. 63, by taking the exposed silicon material on a top of the STSEC-1 as seed, the taller, heavily n+ in-situ-doped silicon tower 6301 as the storage electrode of the storage capacitor is grown by utilizing the selective epitaxial silicon growth technique. Then, etch the high-K-dielectric-insulator-2 6002 by the isotropic etching technique and form the high-K-Dielectric-Insulator-3 6302 to cover all sidewalls and the top of the taller, heavily n+ in-situ-doped silicon tower without allowing any possible electrical connection or leakage mechanisms from the exposed n+ doped silicon storage electrodes to the MCEPW-2.

In Step 199, as shown in FIG. 64, form the photoresist 6402 to cover all the cell array area except exposing the edge areas of the MCEPW-2. In Step 200, as shown in FIG. 65, then etch away the high-K-dielectric-insulator-3 6302 on the exposed edge areas of the MCEPW-2. In Step 201, as shown in FIG. 66, then remove the photoresist 6402.

Figure 68:
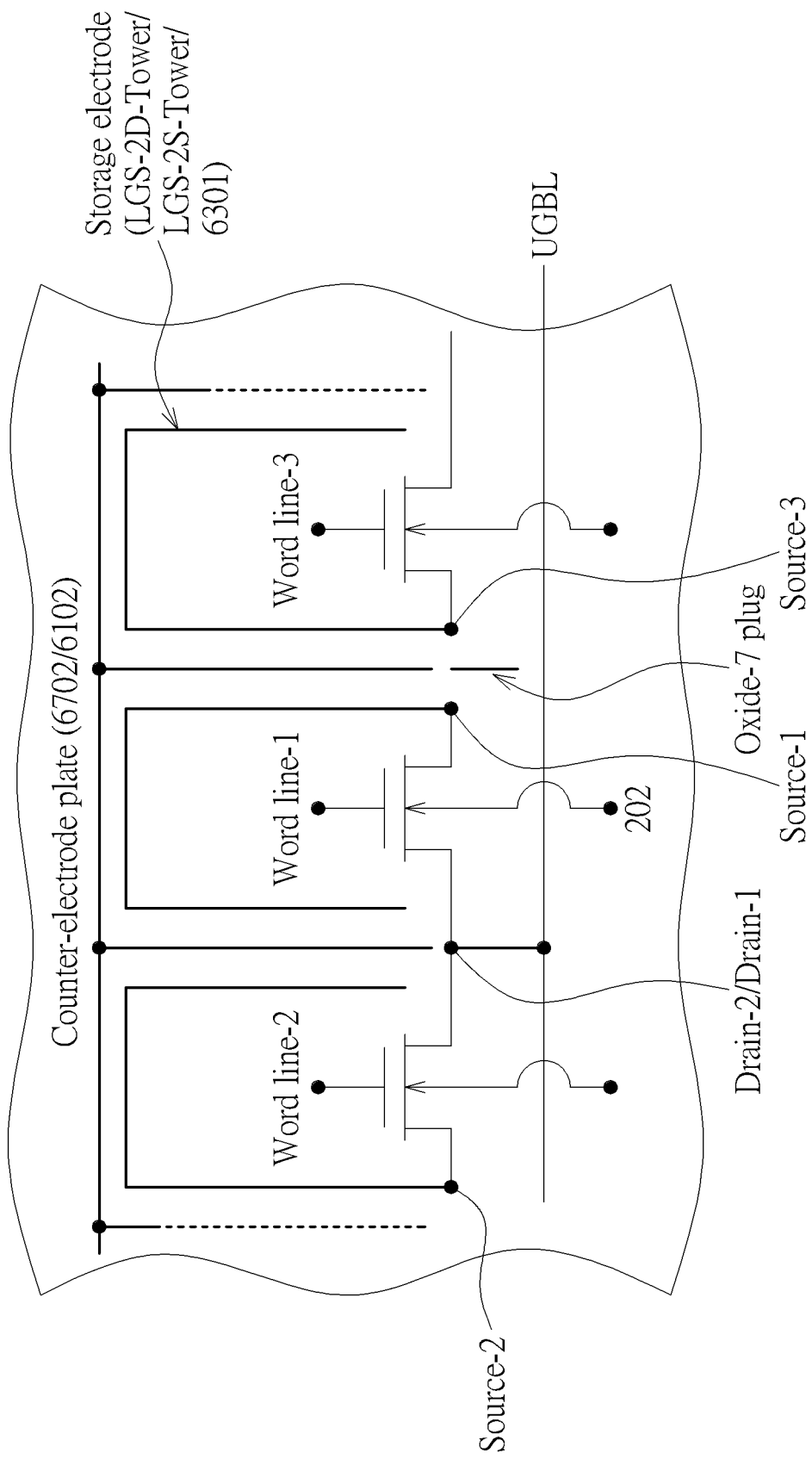
FIG. 68 is a diagram illustrating a sketched structure of the new HCoT Cell.

In Step 202, as shown in FIG. 67, deposit and etch back the thick metal (e.g. Tungsten W) layer 6702, wherein the metal layer 6702 wraps up all sidewalls of the taller, heavily n+ in-situ-doped silicon tower and other valley-like areas over the silicon surface into a planar plateau and is called as MCEPW-3. The MCEPW-3 plus the existing MCEPW-2 with their edge areas all connected can serve well not only as the counter-electrode plate (of the storage capacitor) biased at a constant voltage level such as half-VCC but also a metal shielding plate which can achieve better thermal dissipation like a metal heat sink and can reduce noises or improve noise immunity with respect to the word lines and the gate structures of the access transistors since the electric fields can be more evenly diversified and distributed and shielded across the capacitor plates. FIG. 67 shows the newly invented HCoT cell with its storage capacitor clamping the access transistor with a maximized capacitor storage area due to an H-Shape Twin-tower-like storage electrode. FIG. 68 shows a sketch of the HCoT Cell.

Figure 69:
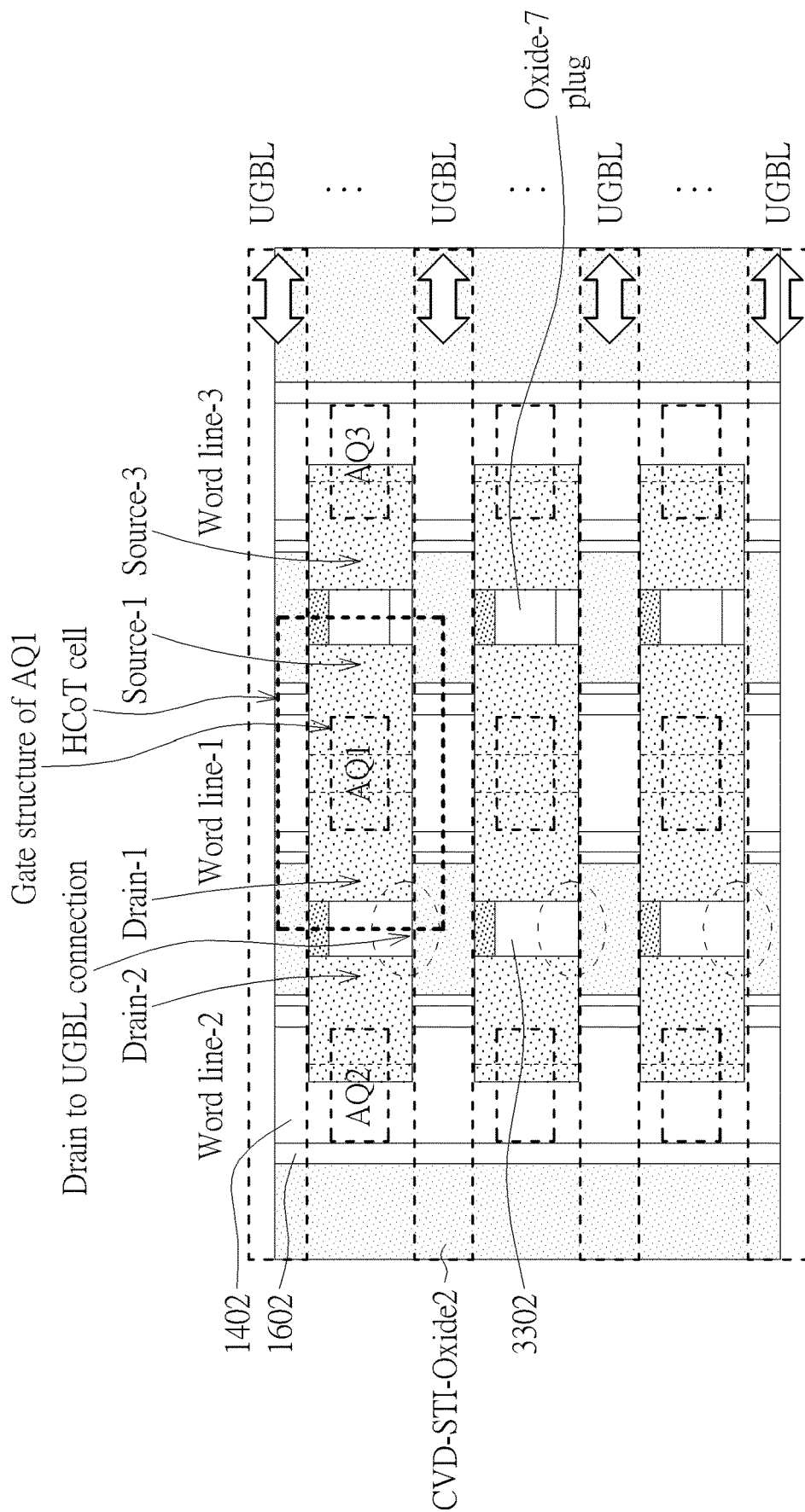
FIG. 69 is a diagram illustrating a simplified top view of the HCoT cell.

FIG. 69 shows a simplified top view of the HCoT cell (the 1T1C cell) with a special focus on the Twin-tower-like capacitor storage electrode which has its bottom connected and passed down to the elevated source electrode of the access transistor. The cell area of the HCoT cell is a rectangular-like shape, and the H-capacitor includes a capacitor periphery which is a rectangular-like shape as well, and the access transistor is located within the capacitor periphery. The capacitor footprint is almost as large as the cell area except with some isolation tolerance required for dividing the neighboring storage electrodes. This should be the most efficient design on the ratio between the planar area of the storage capacitor to the planar area of the 1T1C cell to the best knowledge of this inventor.

In summary, the invention presents a new architecture of DRAM cell which not only compacts the size of the DRAM cell but also enhances the signal-to-noise ratio during the DRAM operation. Since the capacitor is located over the access transistor and largely encompasses the access transistor as well as inventing both vertical and horizontal self-alignment techniques of arranging and connecting the geometries of these essential micro-structures in the DRAM cell, the new HCoT cell architecture can reserve the merit of at least 4 to 10 square units even when the minimum physical feature size is much less than 10 nanometers. The area of the H-capacitor may occupy 50%~70% of the HCoT cell area.

Furthermore, the metal electrode of the capacitor in the new HCoT cell architecture offers an efficient route for heat dissipation and so the temperature of the HCoT cell during the operation could be lower accordingly, such lower temperature will then reduce both the leakage currents from the capacitor and the thermal/operational noises. Additionally, the metal electrode further encompasses the word line passing through the access transistor, and the combination of such encompassed word lines with the underground bit lines (UGBLs) made below the silicon surface could effectively shield the cross-coupling noises among different word lines/bit lines, and thus the problematic pattern sensitivity issue in traditional DRAM cell array operations could be dramatically reduced.

Moreover, the GIDL leakage could also be reduced due to the well-designed transistor structure, and the combination of such reduced GIDL leakage with the reduced leakage derived from the lower operation temperature could further enlarge the signal-to-noise ratio and effectuate the possibility of using a much smaller size of the capacitor in the HCoT cell without negatively impacting the reliability of the stored data.

Besides, the UGBL below the silicon surface of the present invention can flexibly lower the resistivity and capacitance of the bit lines, therefore, the signal sensitivity during the charge sharing period between the capacitor and the bit line could be improved and thus the operation speed of the new architecture of HCoT cell could be enhanced as well.

In summary, the present invention of the HCoT Cell is sketched in FIG. 68, wherein FIG. 68 corresponds to FIG. 67. In contrast to the-state-of-art DRAM cell structure, the new HCoT Cell structure reveals the following features to help achieve a cell size about 4 to 10 square units below 10 nanometers: (1) the storage electrode of the storage capacitor encompassing the access transistor; (2) the counter-electrode plate encompassing the access transistor and covering the entire cell array; (3) an underground bit line below the HSS to reduce the cell topography; (4) self-aligned elevated source electrode with adjustable conductance to the edge of the channel for minimizing cell leakages; (5) self-aligned storage electrode extended from the elevated source and riding over the access transistor like a saddle with self-aligned capacitor tower, (6) most cell features scalable with proven materials and processing steps with sufficient reliability and quality; (7) for most of DRAM cells disclosed (to the best knowledge of the present inventor), the cell shape is kept as most efficient as a rectangle occupying a planar surface of a silicon die as L (Length)×W (Width), it is believed that this HCoT Cell has the largest extension of the storage capacitor area over this L×W landscape except that some distances must be reserved for isolation of the storage electrodes among the neighboring capacitors of different memory cells; (8) as described in the embodiment, the height of the storage electrodes can be built up in a step by step with desired good straight tower shape by using multiple technologies and techniques as invented; in further shrunk cell area by device scaling requirements the ratio of increasing the cell height to enlarge the surface area of the capacitor to the cell planar area is enhanced effectively; (9) creating a plurality of storage electrodes in protrusion shapes but connected as a DRAM capacitor storage node can enlarge the storage area thus resulting in a large capacitance in a limited and shrunk planar surface area of the Cell.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A method of forming a memory cell with a transistor and a capacitor, comprising:
    preparing a semiconductor substrate with an semiconductor surface;
    forming the transistor coupled to the semiconductor surface, the transistor comprising a gate structure, a first conductive region, and a second conductive region;
    selective growing a storage electrode of the capacitor by epitaxy, wherein the storage electrode covers two sides and all top surface of the gate structure of the transistor and electrically coupled to the second conductive region of the transistor; and
    forming a dielectric layer of the capacitor and a counter electrode of the capacitor over the storage electrode.

2. The method of claim 1, wherein the step of selective growing a storage electrode comprises:
    selective growing a first protrusion region based on the first conductive region and a second protrusion region based on the second conductive region;
    disconnecting the first protrusion region from the first conductive region; and
    selective growing a connection region based on the first protrusion region and the second protrusion region, wherein the connection region laterally connects the first protrusion region and the second protrusion region.

3. The method of claim 2, wherein the step of disconnecting the first protrusion region from the first conductive region comprises:
    etching a lower portion of the first protrusion region; and
    forming an insulating region between the first conductive region and a remaining portion of the first protrusion region.

4. The method of claim 2, wherein the connection region is over the top surface of the gate structure, the first protrusion region covers one sidewall of the gate structure and the second protrusion region covers another sidewall of the gate structure.

5. The method of claim 1, further comprising:
    forming a bit line under the semiconductor surface; and
    forming a bridge contact electrically coupling the first conductive region of the transistor to the bit line.

6. The method of claim 5, wherein the bridge contact is positioned under the silicon surface and a first sidewall of the bridge contact is aligned with an edge of the bit line, and the bridge contact comprises an upper portion and a lower portion, the upper portion of the bridge contact abuts against the first conductive region of the transistor, and the lower portion of the bridge contact is separated from the silicon substrate by a first isolating layer.

7. The method of claim 5, wherein the step of forming the bit line comprises:
    forming two active regions and a trench between the two active regions;
    forming an first insulating layer in a bottom of the trench, a first spacer on one sidewall of the trench, and a second spacer on another sidewall of the trench, wherein a material of the first spacer is different from that of the second spacer;
    forming the bit line in the trench, wherein the bit line is encompassed by the insulating layer, the first spacer, and the second spacer; and
    forming a second insulating layer in the trench and over the bit line.

8. The method of claim 5, wherein the step of forming the bridge contact comprises:
    forming a concave in one active region based on which the transistor is formed, such that the first spacer and the second spacer are revealed in the concave;
    forming an isolating layer within the concave, wherein a material of the isolating layer is the same as that of the second spacer, and the isolating layer does not cover the first insulating layer;
    etching the first insulating layer within the concave to reveal one sidewall of the bit line in the concave; and
    forming the bridge contact in the concave to electrically couple the first conductive region of the transistor to the bit line.

* * * * *